(12) United States Patent
Yamazaki

(10) Patent No.: US 10,516,060 B2
(45) Date of Patent: Dec. 24, 2019

(54) COMPOSITE AND TRANSISTOR

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 15/443,052

(22) Filed: Feb. 27, 2017

(65) Prior Publication Data

US 2017/0263773 A1    Sep. 14, 2017

(30) Foreign Application Priority Data

Mar. 11, 2016 (JP) ................. 2016-048802

(51) Int. Cl.
*H01L 29/786* (2006.01)
*H01L 23/522* (2006.01)
*H01L 23/544* (2006.01)

(52) U.S. Cl.
CPC ...... *H01L 29/7869* (2013.01); *H01L 23/5226* (2013.01); *H01L 23/544* (2013.01); *H01L 2223/5446* (2013.01)

(58) Field of Classification Search
CPC .................. H01L 23/5226; H01L 23/544
See application file for complete search history.

(56) References Cited

U.S. PATENT DOCUMENTS

2014/0084287 A1* 3/2014 Yamazaki ......... H01L 29/78696
                                                              257/43
2015/0255029 A1    9/2015 Niikura et al.
(Continued)

FOREIGN PATENT DOCUMENTS

DE    112014006711    2/2017
JP    2007-096055    4/2007
(Continued)

OTHER PUBLICATIONS

M. Nakamura, N. Kimizuka, and T. Mohri, "The Phase Relations in the $In_2O_3$—$Ga_2ZnO_4$—ZnO System at 1350° C.," J. Solid State Chem., 1991, vol. 93, pp. 298-315.
(Continued)

*Primary Examiner* — Samuel A Gebremariam
(74) *Attorney, Agent, or Firm* — Robinson Intellectual Property Law Office; Eric J. Robinson

(57) ABSTRACT

A novel material is provided. A composite oxide semiconductor in which a first region and a plurality of second regions are mixed is provided. Note that the first region contains at least indium, an element M (the element M is one or more of Al, Ga, Y, and Sn), and zinc, and the plurality of second regions contain indium and zinc. Since the plurality of second regions have a higher concentration of indium than the first region, the plurality of second regions have a higher conductivity than the first region. An end portion of one of the plurality of second regions overlaps with an end portion of another one of the plurality of second regions. The plurality of second regions are three-dimensionally surrounded with the first region.

18 Claims, 58 Drawing Sheets

(56) References Cited

U.S. PATENT DOCUMENTS

| | | |
|---|---|---|
| 2015/0318171 A1 | 11/2015 | Yamazaki |
| 2015/0349127 A1 | 12/2015 | Kurata et al. |
| 2016/0349557 A1 | 12/2016 | Shishido et al. |
| 2016/0349558 A1 | 12/2016 | Shishido et al. |
| 2016/0356645 A1 | 12/2016 | Yoneda et al. |
| 2016/0365367 A1 | 12/2016 | Kimura et al. |
| 2016/0372606 A1 | 12/2016 | Ito et al. |
| 2016/0381266 A1 | 12/2016 | Ohmaru |
| 2017/0263783 A1 | 9/2017 | Yamazaki et al. |

FOREIGN PATENT DOCUMENTS

| | | |
|---|---|---|
| JP | 2016-006655 A | 1/2016 |
| KR | 2017-0015292 A | 2/2017 |
| TW | 201545351 | 12/2015 |
| WO | WO-2015/182000 | 12/2015 |

OTHER PUBLICATIONS

Kang.S et al., "Surface-chemistry-sensitive spectral features of In—Ga—Zn—O thin film: Cleaned, air-passivated, and sputter-phase-separated surfaces", Chem. Phys. Lett. (Chemical Physics Letters), Jul. 15, 2011, vol. 510, No. 4-6, pp. 234-236.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Lee.M et al., "Sputtering Effect on Amorphous Ga—In—Zn—O Thin-Film Surface: Occurrence of Subgap and Metallic States", Electrochemical and Solid-State Letters, Sep. 30, 2010, vol. 13, No. 12, pp. H454-H456.

International Search Report (Application No. PCT/IB2017/051114), dated May 30, 2017.

Written Opinion (Application No. PCT/IB2017/051114), dated May 30, 2017.

\* cited by examiner

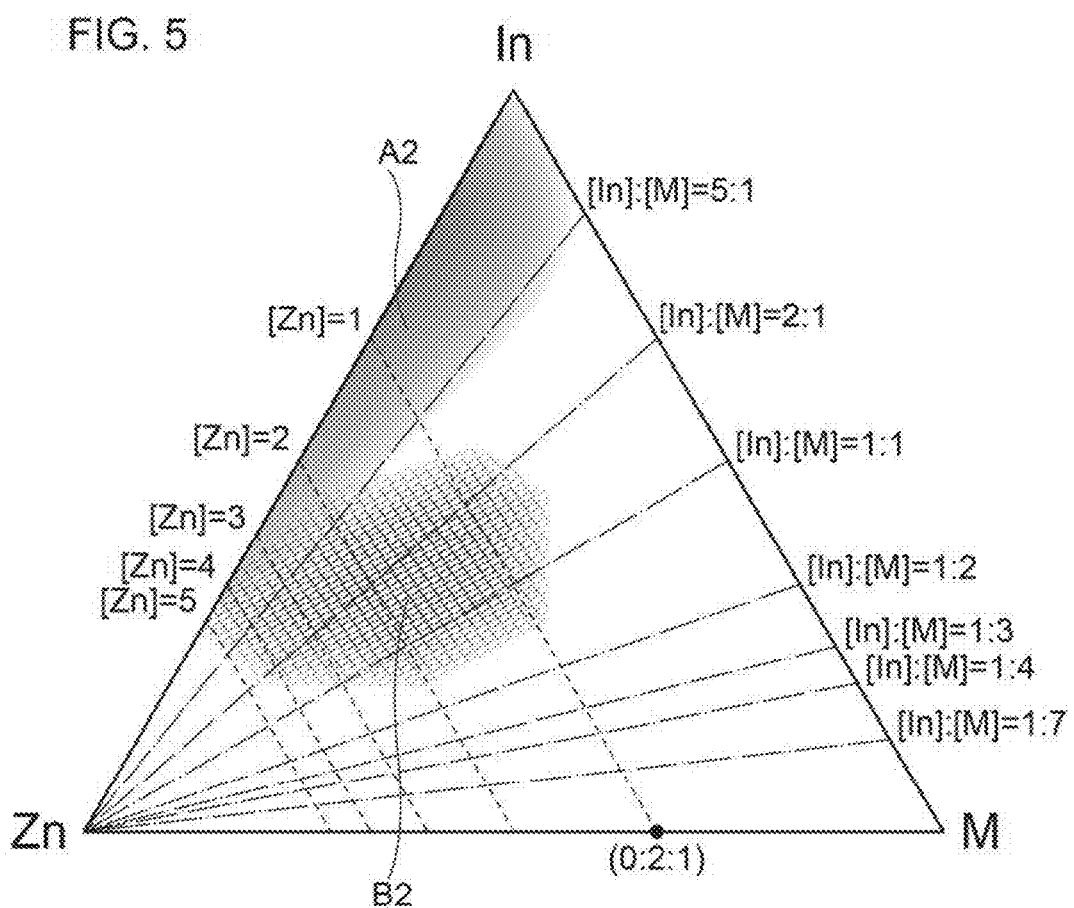

FIG. 12A
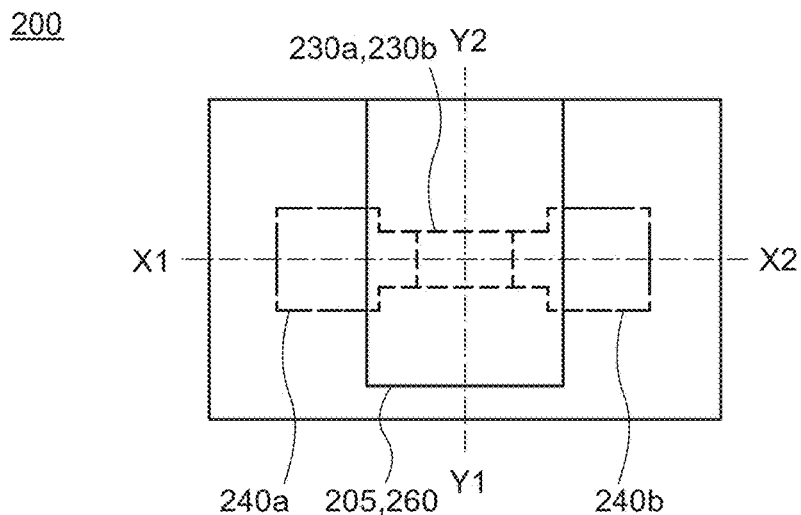
FIG. 12B
FIG. 12C
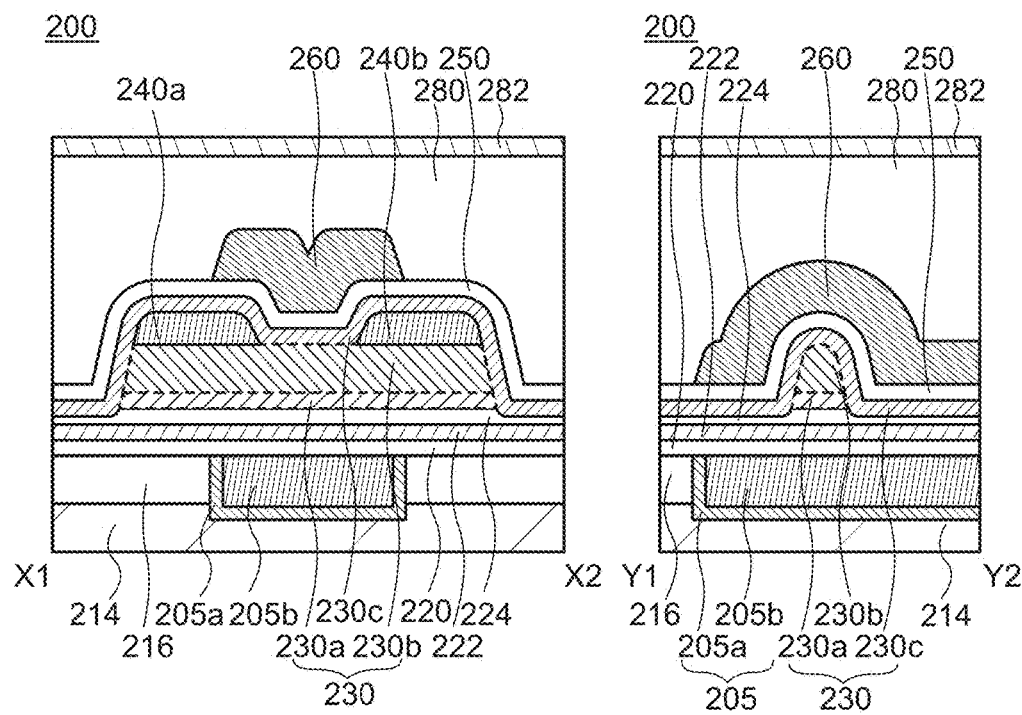

FIG. 14A
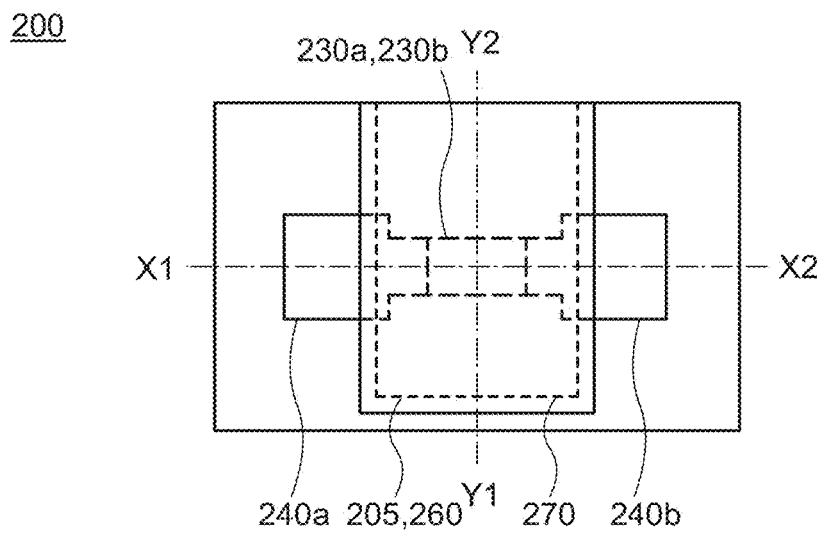
FIG. 14B
FIG. 14C
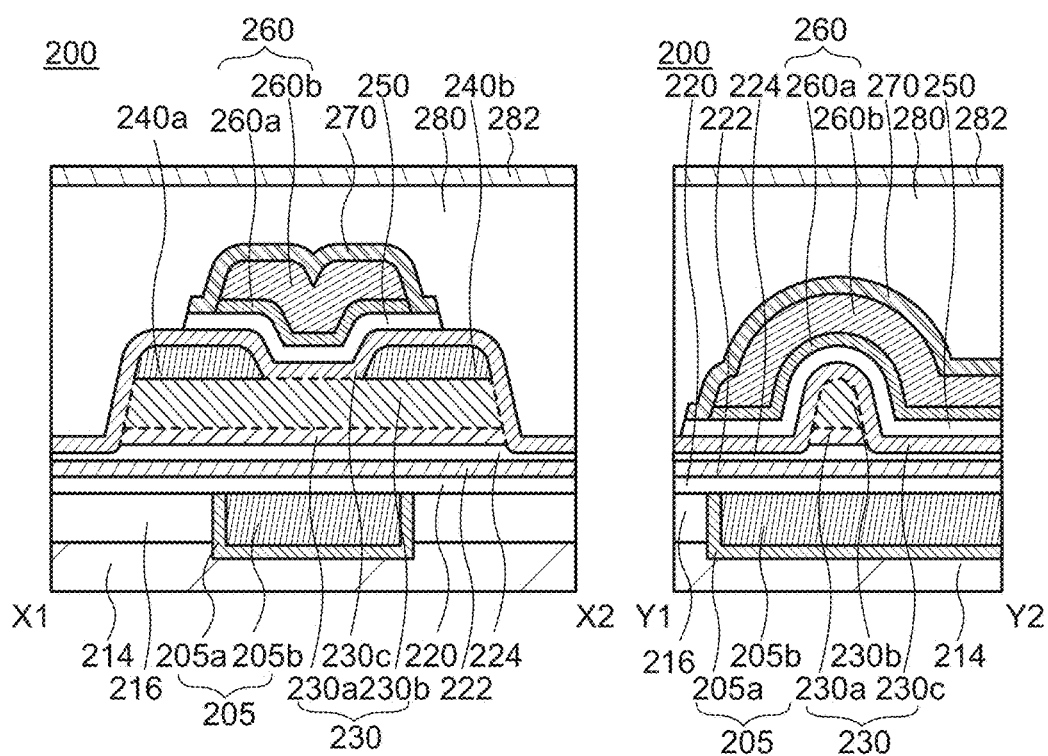

FIG. 15A
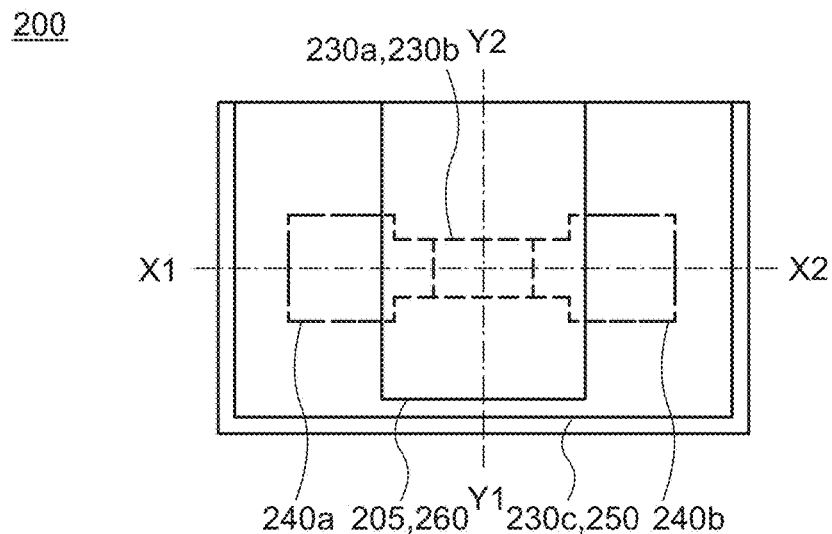
FIG. 15B
FIG. 15C
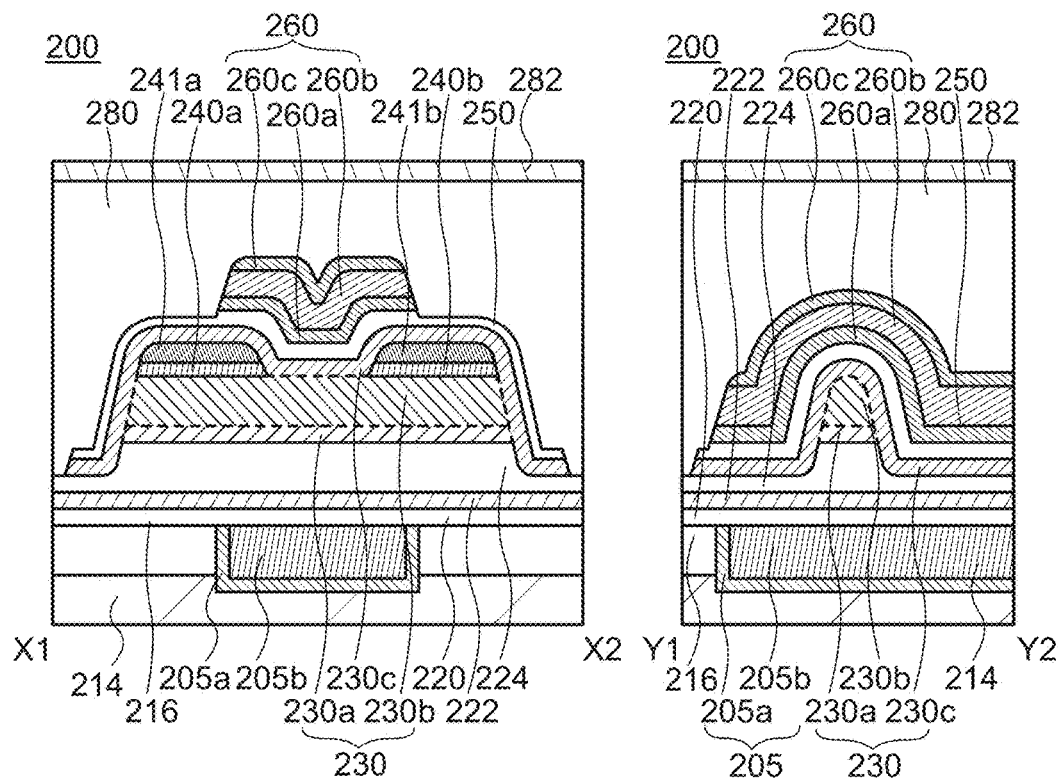

FIG. 16A
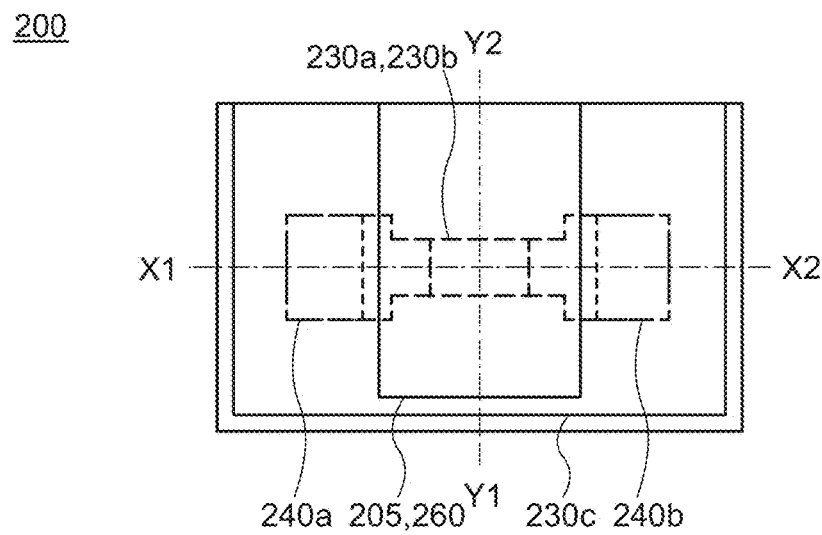
FIG. 16B
FIG. 16C
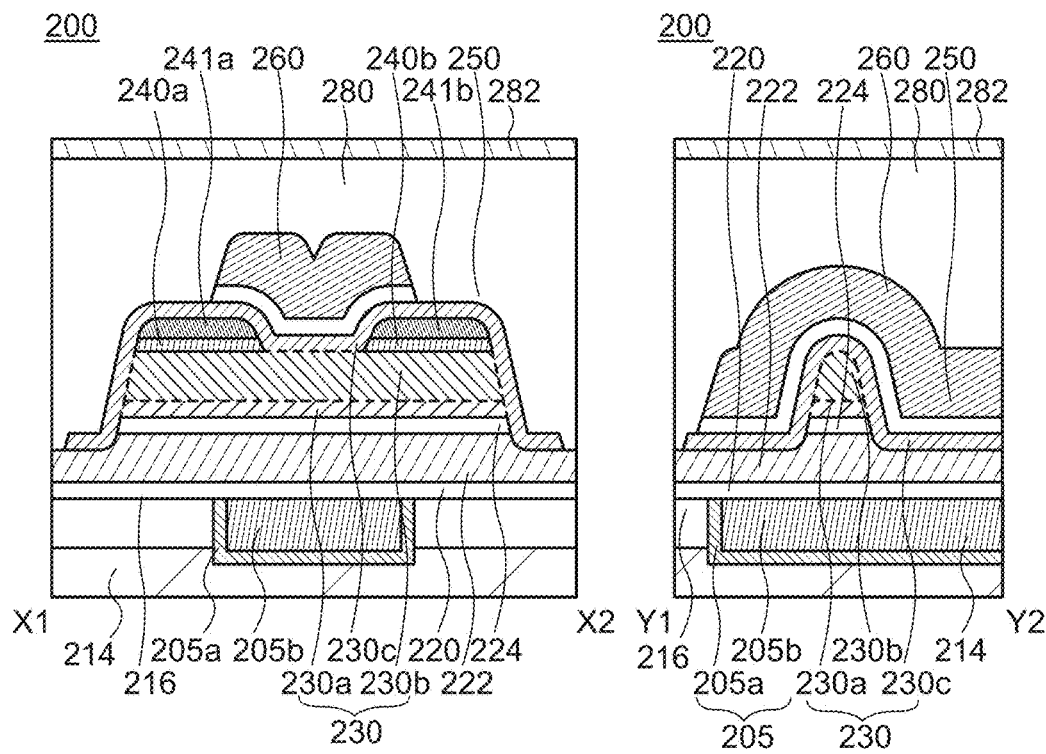

FIG. 17A
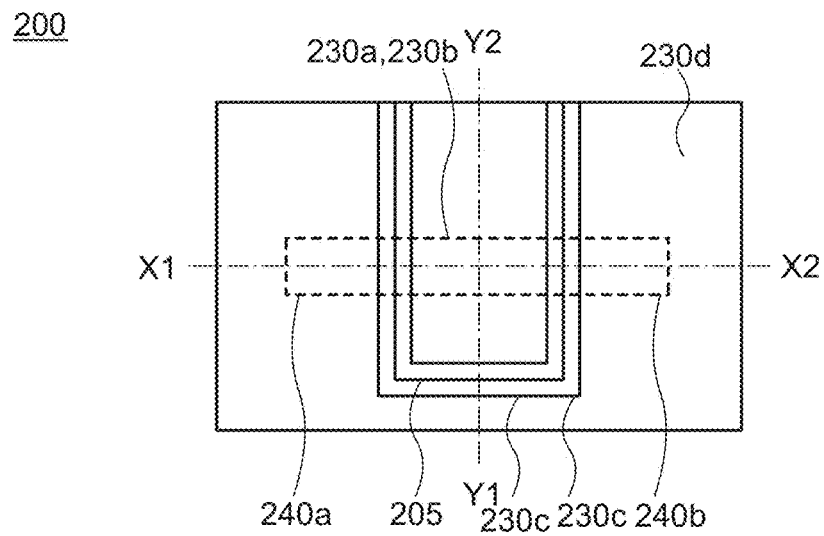
FIG. 17B
FIG. 17C
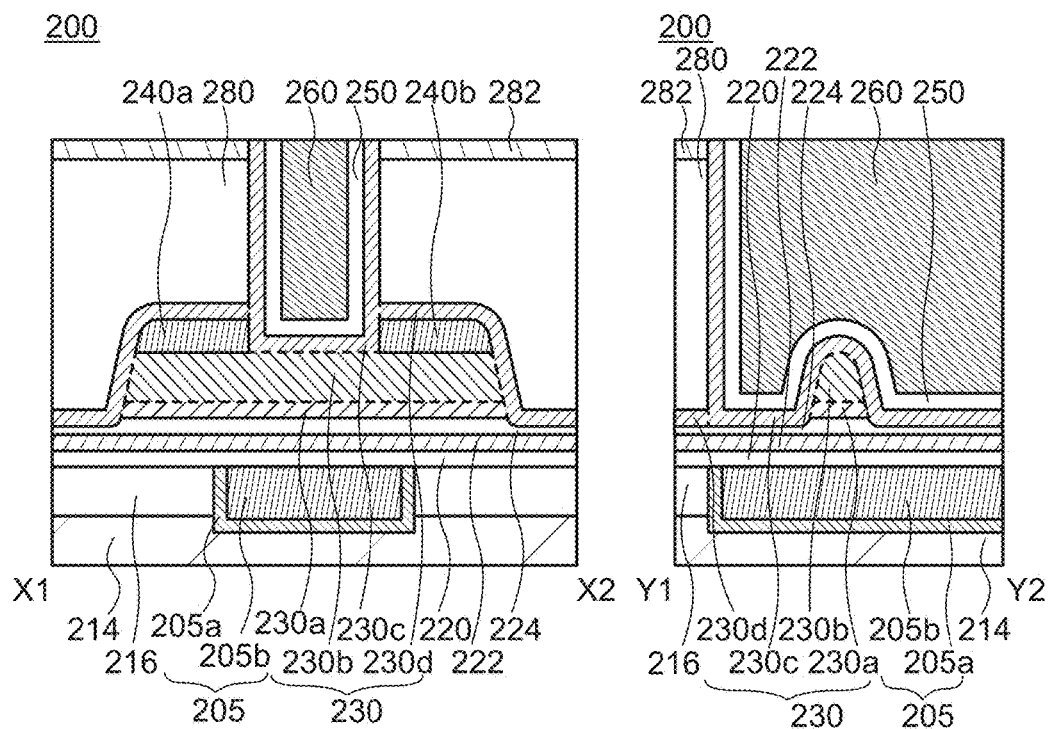

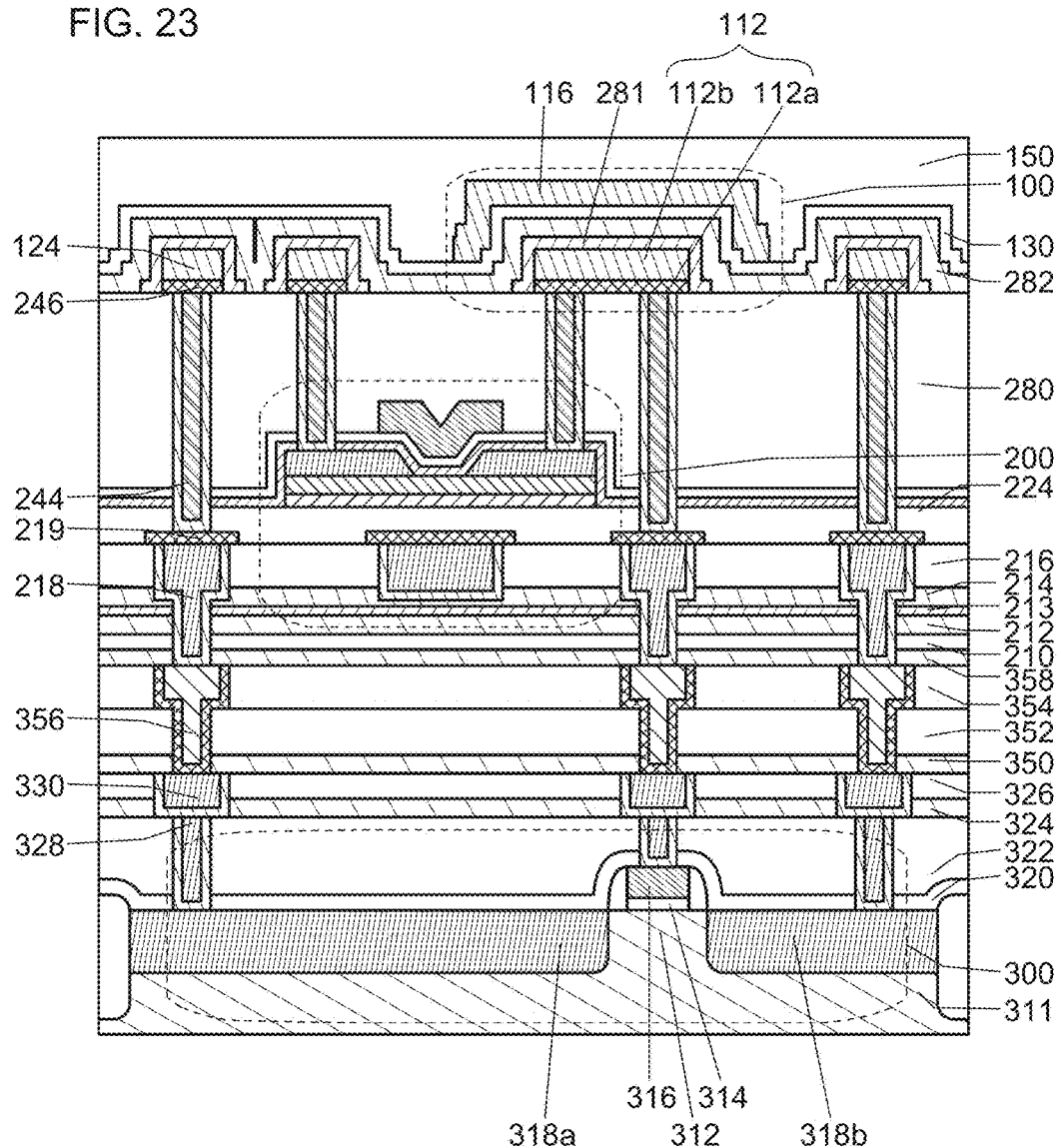

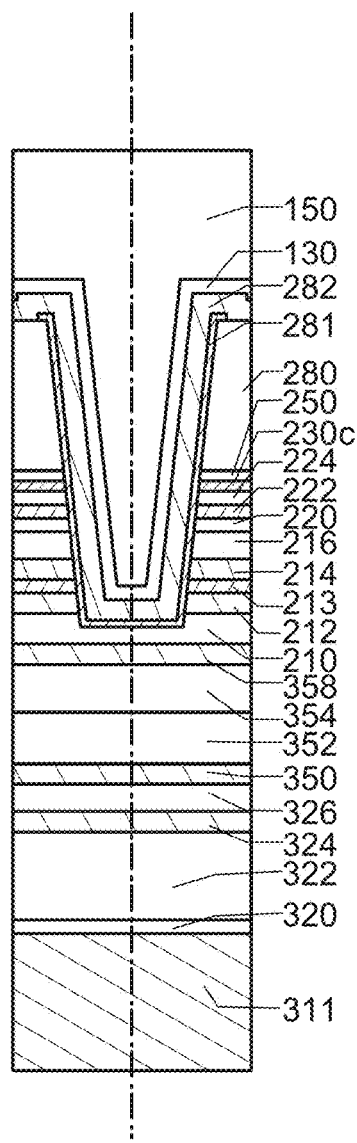
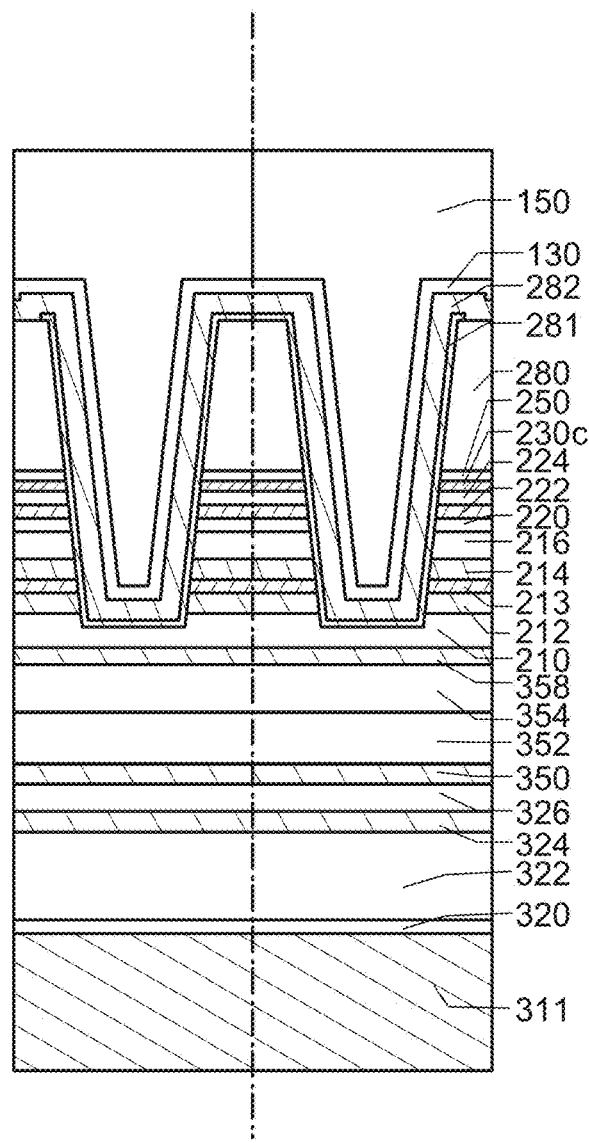
FIG. 29A
FIG. 29B

5905D

5905E

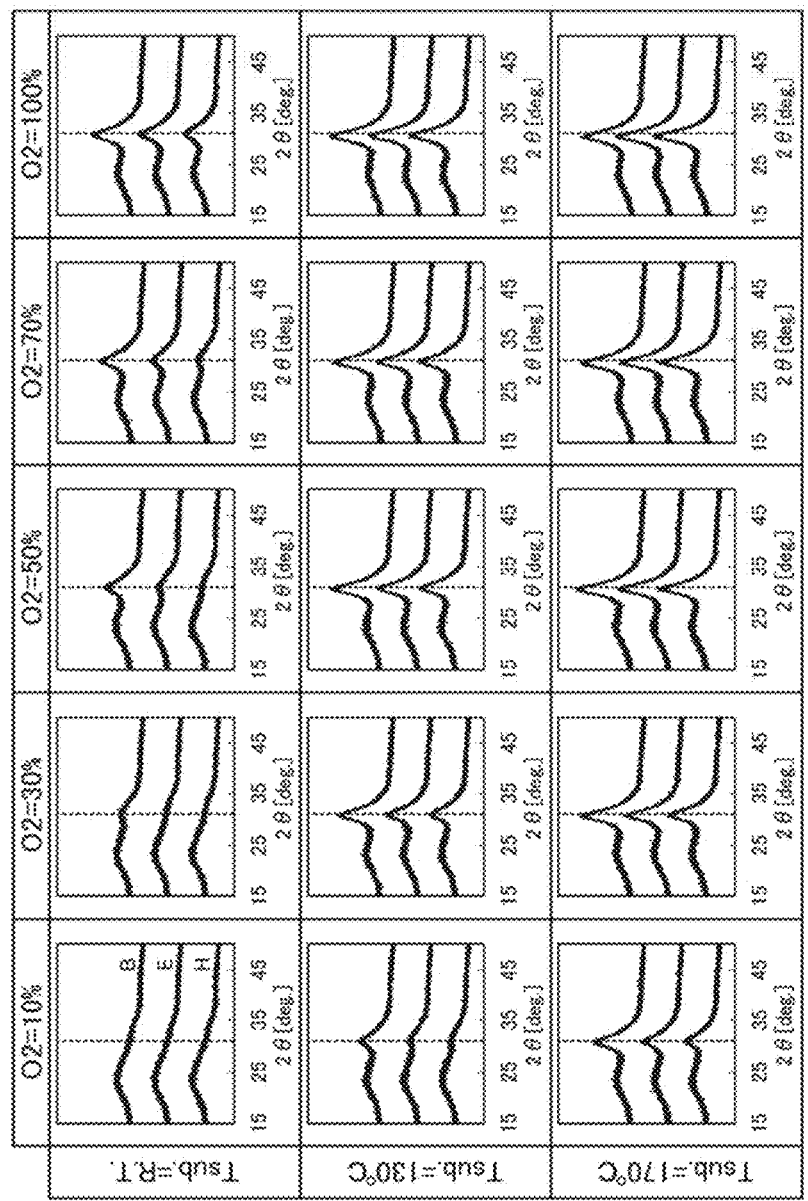

COMPOSITE AND TRANSISTOR

TECHNICAL FIELD

The present invention relates to an object, a method, or a manufacturing method. The present invention relates to a process, a machine, manufacture, or a composition of matter. One embodiment of the present invention particularly relates to an oxide semiconductor or a manufacturing method of the oxide semiconductor. One embodiment of the present invention relates to a semiconductor device, a display device, a liquid crystal display device, a light-emitting device, a power storage device, a memory device, a driving method thereof, or a manufacturing method thereof.

In this specification and the like, the term "semiconductor device" means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may have a semiconductor device.

BACKGROUND ART

Non-Patent Document 1 discloses a homologous series represented by $In_{1-x}Ga_{1+x}O_3(ZnO)_m$ ($-1 \leq x \leq 1$, and m is a natural number). Furthermore, Non-Patent Document 1 discloses a solid solution range of the homologous series. For example, in the solid solution range of the homologous series in the case where m is 1, x ranges from −0.33 to 0.08, and in the solid solution range of the homologous series in the case where m is 2, x ranges from −0.68 to 0.32.

A technique for forming a transistor using an In—Ga—Zn-based oxide semiconductor is disclosed (see, for example, Patent Document 1).

REFERENCES

Patent Document

[Patent Document 1] Japanese Published Patent Application No. 2007-96055

Non-Patent Document

[Non-Patent Document 1] M. Nakamura, N. Kimizuka, and T. Mohri, "The Phase Relations in the $In_2O_3$—$Ga_2ZnO_4$—ZnO System at 1350° C.,"*J. Solid State Chem.*, 1991, Vol. 93, pp. 298-315

DISCLOSURE OF INVENTION

Non-Patent Document 1 discloses an example of $In_xZn_yGa_zO_w$, and when x, y, and z are set such that a composition in the neighborhood of $ZnGa_2O_4$ is obtained, that is, when x, y, and z are close to 0, 1, and 2, respectively, a spinel crystal structure is likely to be formed or mixed. A compound represented by $AB_2O_4$ (A and B are metals) is known as a compound having a spinel crystal structure.

However, when a spinel crystal structure is formed or mixed in an In—Ga—Zn-based oxide semiconductor, electrical characteristics or reliability of a semiconductor device (e.g., a transistor) including the In—Ga—Zn-based oxide semiconductor is adversely affected by the spinel crystal structure in some cases.

In view of the above problem, an object of one embodiment of the present invention is to provide a novel oxide semiconductor. Another object of one embodiment of the present invention is to provide a semiconductor device with favorable electrical characteristics. Another object is to provide a highly reliable semiconductor device. Another object is to provide a semiconductor device with a novel structure. Another object is to provide a display device having a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a composite oxide semiconductor in which a first region and a plurality of second regions are mixed. The first region contains at least indium, an element M (the element M is one or more of Al, Ga, Y, and Sn), and zinc. The plurality of second regions contain indium and zinc. The plurality of second regions have a higher concentration of indium than the first region. The plurality of second regions have a higher conductivity than the first region. An end portion of one of the plurality of second regions overlaps with an end portion of another one of the plurality of second regions. The plurality of second regions are three-dimensionally surrounded with the first region.

In the composite oxide semiconductor of the above-described embodiment, the atomic ratio of indium to the element M and zinc (In:M:Zn) is 5:1:6 or a neighborhood thereof.

In the above-described embodiment, the atomic ratio of indium to the element M and zinc (In:M:Zn) in the first region is 4:2:3 or a neighborhood thereof.

In the above-described embodiment, the atomic ratio of indium to the element M and zinc (In:M:Zn) in the plurality of second regions is 2:0:3 or a neighborhood thereof.

In the composite oxide semiconductor of the above-described embodiment, the atomic ratio of indium to the element M and zinc (In:M:Zn) is 4:2:3 or a neighborhood thereof.

In the above-described embodiment, the atomic ratio of indium to the element M and zinc (In:M:Zn) in the first region is 1:1:1 or a neighborhood thereof.

In the above-described embodiment, the atomic ratio of indium to the element M and zinc (In:M:Zn) in the plurality of second regions is 2:0:1 or a neighborhood thereof.

In the above-described embodiment, the thickness of each of the plurality of second regions in the c-axis direction is more than or equal to 0.1 nm and less than 1 nm.

In the above-described embodiment, the first region is non-single-crystal.

In the above-described embodiment, the first region includes a crystal portion and includes a portion where the c-axis of the crystal portion is parallel to a normal vector to a surface on which a film of the composite oxide semiconductor is formed.

In the above-described embodiment, the plurality of second regions are non-single-crystal.

Another embodiment of the present invention is a transistor characterized by containing the composite oxide semiconductor of the above-described embodiment.

Another embodiment of the present invention is a display device including the oxide semiconductor in any of the above embodiments and a display element. Another embodiment of the present invention is a display module including the display device and a touch sensor. Another embodiment of the present invention is an electronic device including the oxide semiconductor in any of the above embodiments, the semiconductor device, the display device, or the display module and an operation key or a battery.

According to one embodiment of the present invention, a novel oxide semiconductor can be provided. According to one embodiment of the present invention, a semiconductor device can be provided with favorable electrical characteristics. A highly reliable semiconductor device can be provided. A semiconductor device with a novel structure can be provided. A display device with a novel structure can be provided.

Note that the descriptions of these effects do not disturb the existence of other effects. One embodiment of the present invention does not necessarily achieve all the effects. Other effects will be apparent from and can be derived from the description of the specification, the drawings, the claims, and the like.

BRIEF DESCRIPTION OF DRAWINGS

FIG. 5 illustrates an atomic ratio of an oxide semiconductor.

FIGS. 12A to 12C illustrate a top view and a cross-sectional structure of a transistor of one embodiment.

FIGS. 14A to 14C illustrate a top view and a cross-sectional structure of a transistor of one embodiment.

FIGS. 15A to 15C illustrate a top view and a cross-sectional structure of a transistor of one embodiment.

FIGS. 16A to 16C illustrate a top view and a cross-sectional structure of a transistor of one embodiment.

FIGS. 17A to 17C illustrate a top view and a cross-sectional structure of a transistor of one embodiment.

FIG. 23 illustrates a cross-sectional structure of a semiconductor device of one embodiment.

FIGS. 29A and 29B each illustrate a cross-sectional structure of a semiconductor device of one embodiment.

FIGS. 58A and 58B illustrate XRD measurement results and XRD analysis positions of samples of one example.

BEST MODE FOR CARRYING OUT THE INVENTION

Figure 1A:
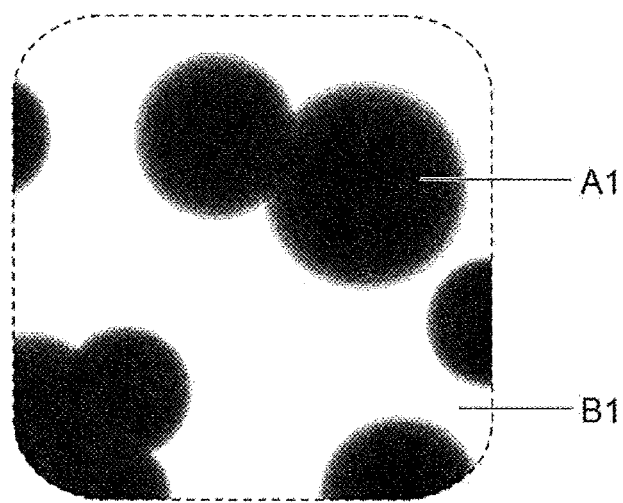
FIGS. 1A and 1B are conceptual diagrams of a structure of an oxide semiconductor.

Embodiments will be hereinafter described with reference to drawings. Note that the embodiments can be implemented in many different modes. It will be readily appreciated by those skilled in the art that modes and details can be changed in various ways without departing from the spirit and scope of the present invention. Therefore, the present invention should not be interpreted as being limited to the description in the following embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Ordinal numbers such as "first," "second," and "third" in this specification are used in order to avoid confusion among components, and the terms do not limit the components numerically.

In this specification, terms for describing arrangement, such as "over" and "under," are used for convenience for describing the positional relation between components with reference to drawings. The positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow between the source and the drain through the channel region. Note that in this specification and the like, a channel region refers to a region through which current mainly flows.

Functions of a "source" and a "drain" are sometimes interchanged with each other when a transistor of opposite polarity is used or when the direction of current flow is changed in circuit operation, for example. Therefore, the terms "source" and "drain" can be interchanged with each other in this specification and the like.

In this specification and the like, the term "electrically connected" includes the case where components are connected through an "object having any electric function." There is no particular limitation on an "object having any electric function" as long as electric signals can be transmitted and received between components that are connected through the object. Examples of an "object having any electric function" include a switching element such as a transistor, a resistor, an inductor, a capacitor, and an element with a variety of functions, as well as an electrode and a wiring.

In this specification and the like, a "silicon oxynitride film" refers to a film that contains oxygen at a higher proportion than nitrogen, and a "silicon nitride oxide film" refers to a film that contains nitrogen at a higher proportion than oxygen.

In the description of modes of the present invention with reference to the drawings in this specification and the like, the same components in different diagrams are commonly denoted by the same reference numeral in some cases.

In this specification and the like, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. In addition, the term "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In this specification and the like, the terms "film" and "layer" can be interchanged with each other depending on the case. For example, the term "conductive layer" can be changed into the term "conductive film" in some cases. Also, the term "insulating film" can be changed into the term "insulating layer" in some cases.

Note that a "semiconductor" includes characteristics of an "insulator" in some cases when, for example, the conductivity is sufficiently low. Furthermore, a "semiconductor" and an "insulator" cannot be strictly distinguished from each other in some cases because the border between the "semiconductor" and the "insulator" is not clear. Accordingly, a "semiconductor" in this specification can be called an "insulator" in some cases. Similarly, an "insulator" in this specification can be called a "semiconductor" in some cases.

(Embodiment 1)

In this embodiment, an oxide semiconductor which is one embodiment of the present invention will be described.

An oxide semiconductor preferably contains at least indium. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M Note that the terms of the atomic ratio of indium to the element M and zinc in the oxide semiconductor are denoted by [In], [M], and [Zn], respectively.

<Structure of Oxide Semiconductor>

Conceptual diagrams of oxide semiconductors of the present invention are illustrated in FIGS. 1A and 1B, FIGS. 2A and 2B, FIGS. 3A and 3B, and FIGS. 4A and 4B.

Conceptual diagrams of oxide semiconductors of the present invention are illustrated in FIGS. 1A to 4B. Note that FIGS. 1A, 2A, 3A, and 4A are each a conceptual diagram of an upper surface (here, referred to as a-b plane direction) of an oxide semiconductor, and FIGS. 1B, 2B, 3B, and 4B are each a conceptual diagram of a cross section (here, referred to as c-axis direction) of the oxide semiconductor formed over a substrate Sub.

Note that FIGS. 1A to 4B each illustrate the case where the oxide semiconductor is formed over the substrate; however, one embodiment of the present invention is not limited to this example. An insulating film such as a base film or an interlayer film or another semiconductor film such as an oxide semiconductor may be formed between the substrate and the oxide semiconductor.

Figure 1B:
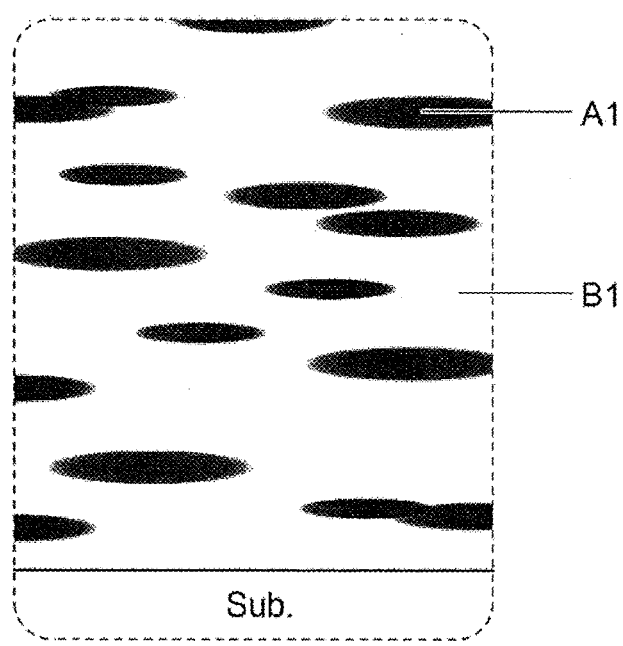

The oxide semiconductor of the present invention is a composite oxide semiconductor having a structure in which a region A1 and a region B1 are mixed as illustrated in FIGS. 1A and 1B. The region A1 is high in In with $[In]:[M]:[Zn]=x:y:z$ ($x>0$, $y\geq0$, $z\geq0$). In contrast, the region B1 is low in In with $[In]:[M]:[Zn]=a:b:c$ ($a>0$, $b>0$, $c>0$).

Note that in this specification, when the atomic ratio of In to the element M in the region A1 is greater than the atomic ratio of In to the element M in the region B1, the region A has a higher In concentration than the region B1. Therefore, in this specification, the region A1 is also referred to as an In-rich region, and the region B1 is also referred to as an In-poor region.

For example, the In concentration in the region A1 is 1.1 or more times, preferably 2 to times that in the region B1. The region A1 is an oxide containing at least In and does not necessarily contain the element M and Zn.

<Atomic Ratio>

The atomic ratio of elements included in the composite oxide semiconductor of one embodiment of the present invention will be described here.

A phase diagram in FIG. 5 can be used to show the atomic ratio of elements in the case where the region A1 in the oxide semiconductor of the present invention contains In, the element M, and Zn. The atomic ratio of In to the element M and Zn is denoted by x:y:z. This atomic ratio can be shown as coordinates (x:y:z) in FIG. 5. Note that the proportion of oxygen atoms is not illustrated in FIG. 5.

In FIG. 5, dashed lines correspond to a line representing the atomic ratio of $[In]:[M]:[Zn]=(1+\alpha):(1-\alpha):1$ ($-1\geq\alpha\geq1$), a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Dashed-dotted lines correspond to a line representing the atomic ratio of $[In]:[M]:[Zn]=1:1:\beta(\beta\geq0)$, a line representing the atomic ratio of $[In]:[M]:[Zn]=1:2:\beta$, a line representing the atomic ratio of $[In]:[M]:[Zn]=1:3:\beta$, a line representing the atomic ratio of $[In]:[M]:[Zn]=1:4:\beta$, a line representing the atomic ratio of $[In]:[M]:[Zn]=1:7:\beta$, a line representing the atomic ratio of $[In]:[M]:[Zn]=2:1:\beta$, and a line representing the atomic ratio of $[In]:[M]:[Zn]=5:1:\beta$.

An oxide semiconductor having the atomic ratio of $[In]:M:[Zn]=0:2:1$ or a neighborhood thereof in FIG. 5 tends to have a spinel crystal structure.

A region A2 in FIG. 5 represents an example of a preferred range of atomic ratios of indium to the element M and zinc contained in the region A1. Note that the region A2 includes atomic ratios on a line representing the atomic ratio of $[In]:[M]:[Zn]=(1+\gamma):0:(1-\gamma)$ ($-1\leq\gamma\leq1$).

A region B2 in FIG. 5 represents an example of a preferred range of atomic ratios of indium to the element M and zinc contained in the region B1. Note that the region B2 includes atomic ratios from $[In]:[M]:[Zn]=4:2:3$ to $[In]:[M]:[Zn]=4:2:4.1$ and a neighborhood thereof. The neighborhood includes an atomic ratio of $[In]:[M]:[Zn]=5:3:4$. The region B2 includes an atomic ratio of $[In]:[M]:[Zn]=5:1:6$ and a neighborhood thereof.

The region A2 with high In concentrations provides a higher conductivity than the region B2 and has a function of increasing carrier mobility (field-effect mobility). Therefore, the on-state current and carrier mobility of a transistor using an oxide semiconductor including the region A1 can be increased.

In contrast, the region B2 with low In concentrations provides a lower conductivity than the region A2 and has a function of decreasing leakage current. Therefore, the off-state current of a transistor using an oxide semiconductor including the region B1 can be decreased.

In the oxide semiconductor of the present invention, the region A1 and the region B1 form a composite. That is, carrier movement occurs easily in the region A1, whereas carrier movement does not occur easily in the region B1. Therefore, the oxide semiconductor of the present invention can be used as a material with high carrier mobility, excellent switching characteristics, and favorable semiconductor characteristics.

In one example, as illustrated in FIG. 1A, the region A1 is basically formed in a shape close to a circle in the a-b plane direction. In addition, as illustrated in FIG. 1B, the region A1 is basically formed in a shape close to an ellipse in the c-axis direction. Therefore, the region A1 has an island-like shape and can exist in a state of being three-dimensionally surrounded with the region B1. That is, the region A1 is enclosed by the region B1.

Furthermore, as illustrated in FIGS. 1A and 1B, the region A1 is distributed unevenly and irregularly in the region B1. Therefore, a plurality of regions A1 connected to each other may exist. That is, in some cases, the plurality of regions A1 may have a shape of overlapping circles in the a-b plane direction or a shape of ellipses whose end portions are connected in the c-axis direction. In the case where all the regions A1 are connected in the a-b plane direction, the switching characteristics of a transistor, e.g., the off-state current of the transistor, are increased. Thus, the regions A1 are preferably scattered in the region B1 as illustrated in FIGS. 1A and 1B.

Figure 2A:
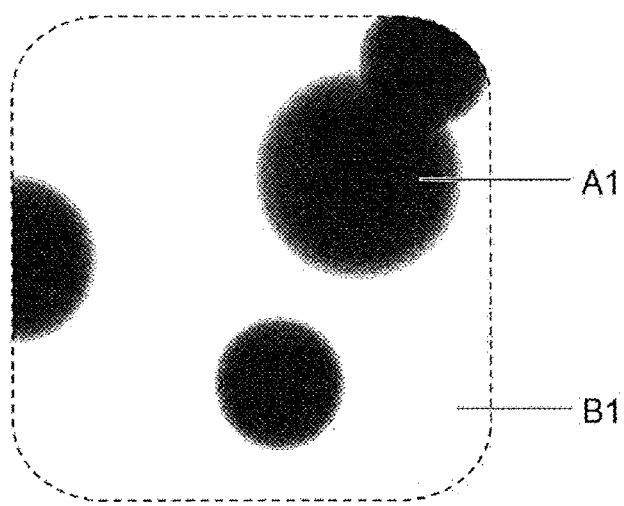
FIGS. 2A and 2B are conceptual diagrams of a structure of an oxide semiconductor.
Figure 2B:
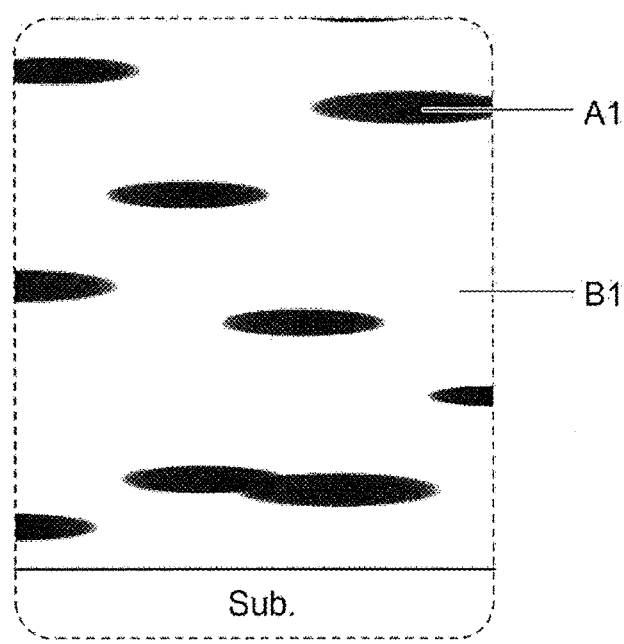
Figure 3A:
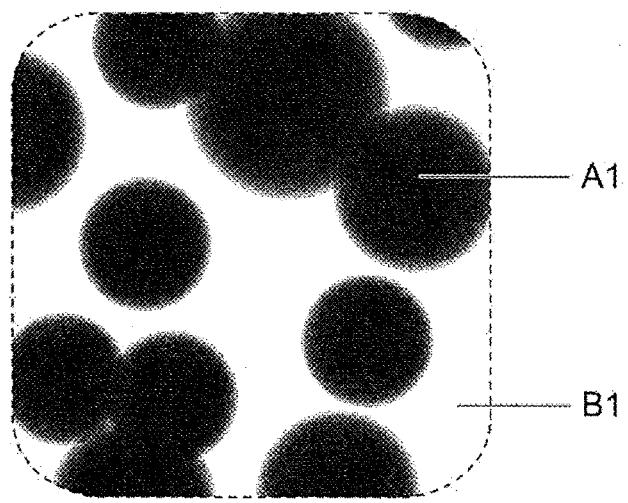
FIGS. 3A and 3B are conceptual diagrams of a structure of an oxide semiconductor.
Figure 3B:
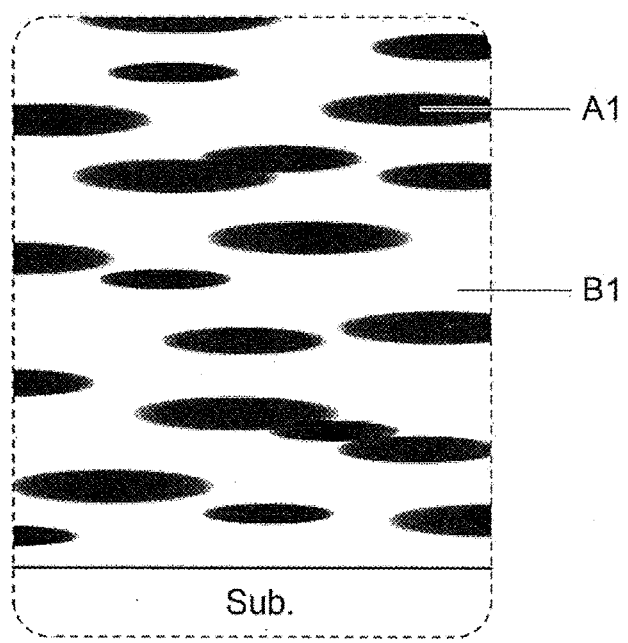

Note that the proportion of scattered regions A1 can be adjusted by changing formation conditions or composition of the composite oxide semiconductor. For example, it is possible to form a composite oxide semiconductor with a low proportion of regions A1 as illustrated in FIGS. 2A and 2B or a composite oxide semiconductor with a high proportion of regions A1 as illustrated in FIGS. 3A and 3B. The composite oxide semiconductor of the present invention does not necessarily have a low proportion of regions A1 to the region B1. In a composite oxide semiconductor with a very high proportion of regions A1, depending on the observation range, the region B1 is sometimes formed in the region A1.

Figure 4A:
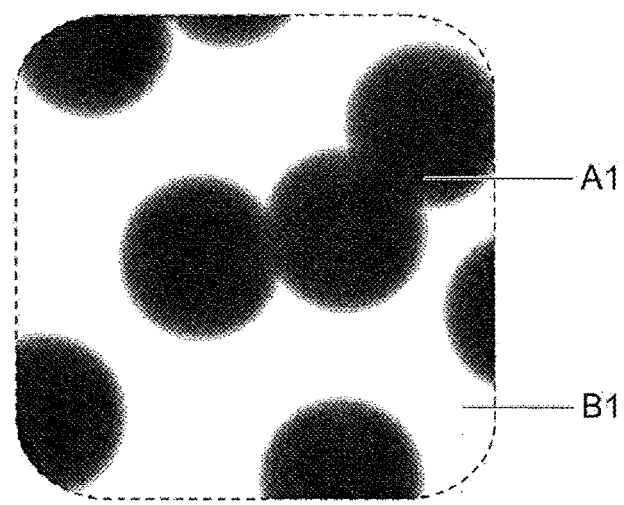
FIGS. 4A and 4B are conceptual diagrams of a structure of an oxide semiconductor.
Figure 4B:
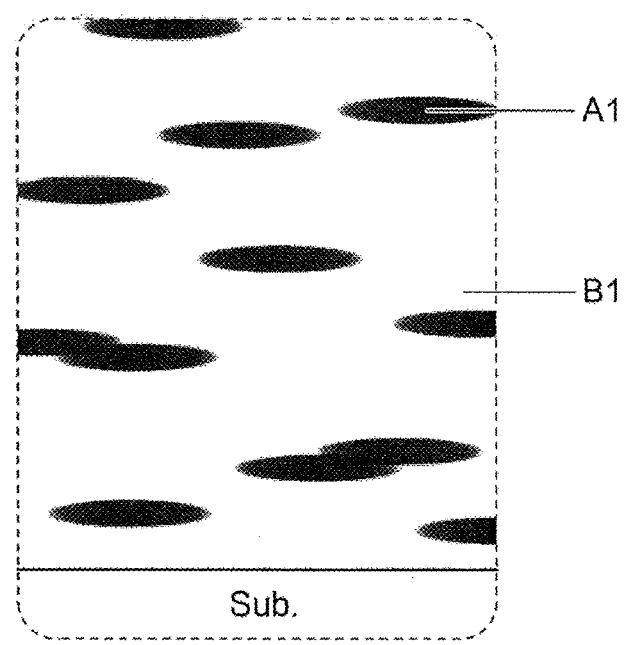

The size of the island-like shape of the region A1 can be adjusted as appropriate by changing, for example, the formation conditions or composition of the composite oxide semiconductor. Although the island-like regions have various sizes in the conceptual diagrams in FIGS. 1A to 3B, the regions A1 with substantially the same size are scattered as shown in FIGS. 4A and 4B in some cases.

In some cases, a boundary between the region A1 and the region B1 is not clearly observed. Note that the sizes of the region A1 and the region B1 can be obtained by EDX mapping. For example, the thickness (also referred to as diameter) of the region A1 is greater than or equal to 0.1 nm and less than or equal to 5 nm, or greater than or equal to 0.3 nm and less than or equal to 3 nm in a cross-sectional EDX mapping image in some cases. Note that the thickness of the region A1 is preferably greater than or equal to 0.1 nm and less than or equal to 1 nm.

As described above, an oxide semiconductor of one embodiment of the present invention is a composite oxide semiconductor in which the region A1 and the region B1 are mixed and have different functions that are complementary to each other. For example, when an oxide semiconductor of one embodiment of the present invention is an In—Ga—Zn oxide (hereinafter referred to as IGZO), in which Ga is used as the element M, the oxide semiconductor can be called complementary IGZO (abbreviation: C/IGZO).

In contrast, when the region A1 and the region B1 are stacked in a layered manner, for example, interaction does not take place or is unlikely to take place between the region A1 and the region B1, so that the function of the region A1 and that of the region B1 are independently performed in some cases. In that case, even when the carrier mobility is increased owing to the region A1, the off-state current of the transistor might be increased. Therefore, in the case where the above-described composite oxide semiconductor or C/IGZO is used, a function of achieving high carrier mobility and a function of achieving excellent switching characteristics can be obtained at the same time. This is an advantageous effect obtained by using the composite oxide semiconductor of the present invention.

Note that in the case where the oxide semiconductor is deposited with a sputtering apparatus, a film having an atomic ratio deviated from the atomic ratio of the target is formed. Especially for zinc, [Zn] in the atomic ratio of a deposited film is smaller than that in the atomic ratio of the target in some cases depending on the substrate temperature during deposition.

Note that characteristics of the composite oxide semiconductor of one embodiment of the present invention are not uniquely determined by the atomic ratio. Therefore, the illustrated regions represent preferred atomic ratios of the region A1 and the region B1 of the composite oxide semiconductor; a boundary therebetween is not clear.

Oxide semiconductors can be classified into a single crystal oxide semiconductor and a non-single-crystal oxide semiconductor. Examples of the non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has an unstable structure as compared with the nc-OS and the CAAC-OS.

Oxide semiconductors have various structures and various properties. The oxide semiconductor of the present invention may be a composite oxide semiconductor including two or more of an amorphous oxide semiconductor, an a-like OS, an nc-OS, and a CAAC-OS.

For example, the region A1 is preferably non-single-crystal. The region B1 preferably includes at least one of regions of the CAAC-OS, the polycrystalline oxide semiconductor, the nc-OS, and the like. The region A1 and the region B1 may include different crystals.

<Transistor Including Oxide Semiconductor>

Next, the case where the oxide semiconductor is used for a transistor will be described.

Note that when the composite oxide semiconductor is used for a transistor, the transistor can have high carrier mobility and excellent switching characteristics. In addition, the transistor can have high reliability.

An oxide semiconductor with low carrier density is preferably used for the transistor. For example, an oxide semiconductor whose carrier density is lower than $8\times10^{11}/\text{cm}^3$, preferably lower than $1\times10^{11}/\text{cm}^3$, further preferably lower than $1\times10^{10}/\text{cm}^3$, and greater than or equal to $1\times10^{-9}/\text{cm}^3$ is used.

A highly purified intrinsic or substantially highly purified intrinsic oxide semiconductor has few carrier generation sources, and thus can have a low carrier density. A highly purified intrinsic or substantially highly purified intrinsic oxide semiconductor has a low density of defect states and accordingly has a low density of trap states in some cases.

Charges trapped by the trap states in the oxide semiconductor take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor. In addition, to reduce the concentration of impurities in the oxide semiconductor, the concentration of impurities in a film that is adjacent to the oxide semiconductor is preferably reduced. Examples of impurities include hydrogen, nitrogen, alkali metal, alkaline earth metal, iron, nickel, and silicon.

Here, the influence of impurities in the oxide semiconductor will be described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated, in some cases. Thus, a transistor including an oxide semiconductor which contains alkali metal or alkaline earth metal is likely to be normally-on. Therefore, it is preferable to reduce the concentration of alkali metal or alkaline earth metal in the oxide semiconductor. Specifically, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor including an oxide semiconductor which contains nitrogen is likely to be normally-on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy (Vo), in some cases. Due to entry of hydrogen into the oxygen vacancy (Vo), an electron serving as a carrier is generated in some cases. Furthermore, in some cases, bonding of part of hydrogen to oxygen bonded to a metal atom causes generation of an electron serving as a carrier. Thus, a transistor including an oxide semiconductor that contains hydrogen is likely to be normally-on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

Note that oxygen vacancies (Vo) in the oxide semiconductor can be reduced by introduction of oxygen into the oxide semiconductor. That is, the oxygen vacancies (Vo) in the oxide semiconductor disappear when the oxygen vacancies (Vo) are filled with oxygen. Accordingly, diffusion of oxygen in the oxide semiconductor can reduce the oxygen vacancies (Vo) in a transistor and improve the reliability of the transistor.

As a method for introducing oxygen into the oxide semiconductor, for example, an oxide in which oxygen content is higher than that in the stoichiometric composition is provided in contact with the oxide semiconductor. That is, in the oxide, a region including oxygen in excess of that in the stoichiometric composition (hereinafter also referred to as an excess-oxygen region) is preferably formed. In particular, in the case of using an oxide semiconductor in a transistor, an oxide including an excess-oxygen region is provided in a base film, an interlayer film, or the like in the vicinity of the transistor, whereby oxygen vacancies in the transistor are reduced, and the reliability can be improved.

When an oxide semiconductor with sufficiently reduced impurity concentration is used for a channel formation region in a transistor, the transistor can have stable electrical characteristics.

<Method for Depositing Oxide Semiconductor>

An example of a method for depositing an oxide semiconductor by a sputtering method will be described below.

The oxide semiconductor is preferably deposited at a temperature higher than or equal to room temperature and lower than 140° C. Note that room temperature includes not only the case where temperature control is not performed but also the case where temperature control is performed.

As a sputtering gas, a rare gas (typically argon), oxygen, or a mixed gas of a rare gas and oxygen is used as appropriate. In the mixed gas, the proportion of oxygen to the rare gas is more than or equal to 5% and less than or equal to 30%, preferably more than or equal to 7% and less than or equal to 20%.

When the sputtering gas contains oxygen, oxygen can be added to a film under the oxide semiconductor and an excess-oxygen region can be provided at the same time as the deposition of the oxide semiconductor. In addition, increasing the purity of a sputtering gas is necessary. For example, when a gas which is highly purified to have a dew point of −40° C. or lower, preferably −80° C. or lower, further preferably −100° C. or lower, still further preferably −120° C. or lower, is used as a sputtering gas, i.e., the oxygen gas or the argon gas, entry of moisture or the like into the oxide semiconductor can be minimized.

In the case where the oxide semiconductor is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor, as much as possible. Alternatively, a turbo molecular pump and a cold trap are preferably combined so as to prevent a backflow of a gas, especially a gas containing carbon or hydrogen from an exhaust system to the inside of the chamber.

As a target, an In—Ga—Zn metal oxide target can be used. For example, a metal oxide target having an atomic ratio of [In]:[Ga]:[Zn]=4:2:4.1, [In]:[Ga]:[Zn]=5:1:6, or a neighborhood thereof is preferably used.

In the sputtering apparatus, the target may be rotated or moved. For example, a magnet unit is oscillated vertically and/or horizontally during the deposition, whereby the composite oxide semiconductor of the present invention can be formed. For example, the target may be rotated or moved with a beat (also referred to as rhythm, pulse, frequency, period, cycle, or the like) of greater than or equal to 0.1 Hz and less than or equal to 1 kHz. Alternatively, the magnet unit may be oscillated with a beat of greater than or equal to 0.1 Hz and less than or equal to 1 kHz. Note that the details of the sputtering apparatus will be described in a later embodiment.

The oxide semiconductor of the present invention can be formed, for example, in the following manner: a mixed gas of oxygen and a rare gas in which the proportion of oxygen is approximately 10% is used; the substrate temperature is 130° C.; and an In—Ga—Zn metal oxide target having an atomic ratio of [In]:[Ga]:[Zn]=4:2:4.1 is oscillated during the deposition.

First, in a deposition chamber, the rare gas or the oxygen gas is ionized to be separated into cations and electrons, and plasma is created. The cations in the plasma are accelerated toward the target by a potential applied to a target holder. Sputtered particles are generated when the cations collide with the In—Ga—Zn metal oxide target, and the sputtered particles are deposited on the substrate.

When the cations collide with the In—Ga—Zn metal oxide target, Ga and Zn, which have lower relative atomic masses than In, are preferentially sputtered from the target. The sputtered In, Ga, and Zn are bonded to oxygen and then deposited to the substrate, whereby the region B1 is deposited. At this time, In is segregated at the surface of the target.

Next, In segregated at the surface of the target is sputtered from the target as a structure like a plurality of particles. The segregated In having a structure like a plurality of particles is bonded to oxygen, collides with the region B1 deposited earlier, and spreads into a shape close to a circle, whereby the region A1 having an island-like shape is deposited. Note that since the segregated In is sputtered, In, Ga, and Zn exist at the surface of the target in a state close to the original atomic ratio.

When the cations further collide with the target, Ga and Zn, which have lower relative atomic masses than In, are preferentially sputtered from the target. At this time, In is segregated at the surface of the target. The region B1 is deposited again over the regions B1 and A1 deposited earlier, whereby the region B1 is formed such that the region A1 is surrounded therewith.

Note that in one region of the target surface, In is segregated, and in another region of the target surface, segregated In is sputtered. That is, a mechanism of In segregation and a mechanism of sputtering of segregated In occur at the same time, leading to a structure in which the region A1 is surrounded with the region B1 and distributed unevenly and irregularly.

The composite oxide semiconductor in which the region A1 and the region B1 are mixed as illustrated in FIGS. 1A and 1B, FIGS. 2A and 2B, FIGS. 3A and 3B, or FIGS. 4A and 4B is presumed to be formed after the above-described deposition model.

In the oxide semiconductor of the present invention, the region A1 which is high in In and has an atomic ratio shown in the region A2 and the region B1 which is low in In and has an atomic ratio shown in the region B2 are mixed to form a composite oxide semiconductor. That is, carrier movement occurs easily in the region A1, whereas carrier movement does not occur easily in the region B1. Therefore, the oxide semiconductor of the present invention can be used as a material with high carrier mobility, excellent switching characteristics, and favorable semiconductor characteristics.

The structure described in this embodiment can be combined with any of the structures described in the other embodiments and examples as appropriate.

(Embodiment 2)

In this embodiment, sputtering apparatuses and a deposition apparatus with which the oxide of one embodiment of the present invention can be deposited are described with reference to FIGS. 6A and 6B, FIGS. 7A and 7B, FIGS. 8A to 8C, FIGS. 9A and 9B, FIG. 10, and FIGS. 11A to 11C. The following descriptions of the sputtering apparatuses are made for easy understanding or the explanation of the operation during deposition, on the assumption that a substrate, a target, and the like are provided. Note that the substrate, the target, and the like are provided by a user; thus, the sputtering apparatus of one embodiment of the present invention does not necessarily include the substrate and the target.

<Sputtering Apparatus>

Examples of sputtering apparatuses include a parallel-plate-type sputtering apparatus and a facing-targets sputtering apparatus. Note that deposition using a parallel-plate-type sputtering apparatus can also be referred to as parallel electrode sputtering (PESP), and deposition using a facing-targets sputtering apparatus can also be referred to as vapor deposition sputtering (VDSP).

[Parallele-Plate-Type Sputtering Apparatus (PESP)]

Figure 6A:
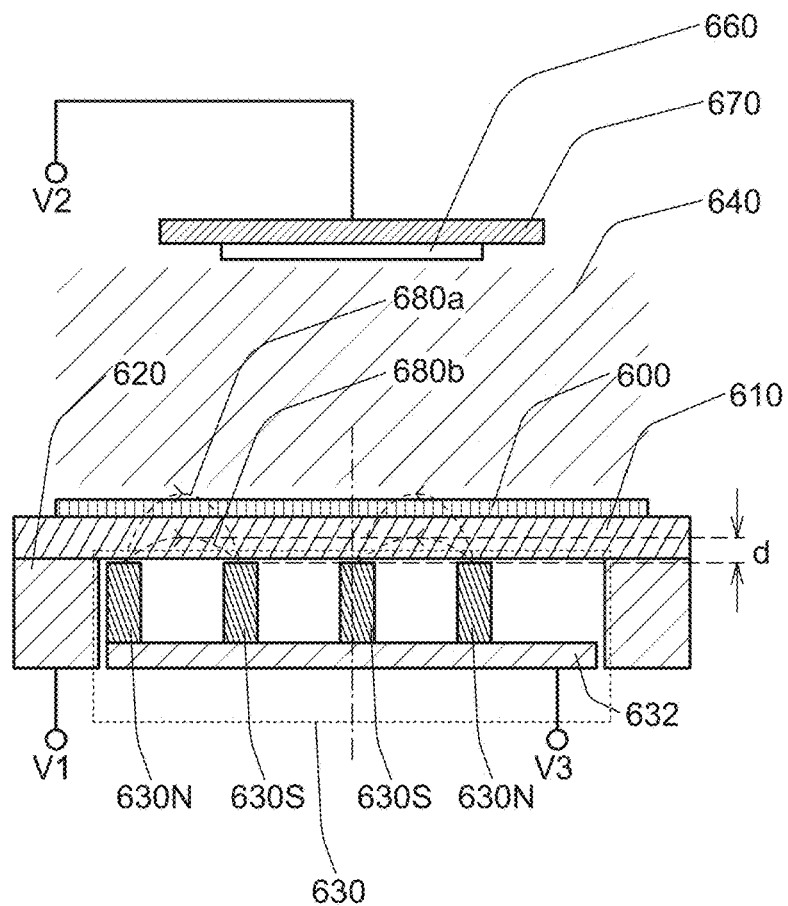
FIGS. 6A and 6B illustrate a sputtering apparatus.

First, the parallel-plate-type sputtering apparatus is described. FIG. 6A is a cross-sectional view of a deposition chamber 601 that is a parallel-plate-type sputtering apparatus. The deposition chamber 601 in FIG. 6A includes a target holder 620, a backing plate 610, a target 600, a magnet unit 630, and a substrate holder 670. Note that the target 600 is placed over the backing plate 610. The backing plate 610 is placed over the target holder 620. The magnet unit 630 is placed under the target 600 with the backing plate 610 positioned therebetween. The substrate holder 670 faces the target 600. Note that in this specification, a magnet unit means a group of magnets. The term "magnet unit" can be replaced with "cathode," "cathode magnet," "magnetic member," "magnetic part," or the like. The magnet unit 630 includes a magnet 630N, a magnet 630S, and a magnet holder 632. Note that in the magnet unit 630, the magnet 630N and the magnet 630S are placed over the magnet holder 632. The magnet 630N and the magnet 630S are spaced. When a substrate 660 is transferred into the deposition chamber 601, the substrate 660 is placed on the substrate holder 670.

The target holder 620 and the backing plate 610 are fixed to each other with a screw (e.g., a bolt) and have the same potential. The target holder 620 has a function of supporting the target 600 with the backing plate 610 positioned therebetween.

The target 600 is fixed to the backing plate 610. For example, the target 600 can be fixed to the backing plate 610 with a bonding member containing a low-melting-point metal such as indium.

FIG. 6A illustrates a magnetic line of force 680a and a magnetic line of force 680b formed by the magnet unit 630.

The magnetic line of force 680a is one of magnetic lines of force that form a horizontal magnetic field in the vicinity of the top surface of the target 600. The vicinity of the top surface of the target 600 corresponds to a region in which the vertical distance from the target 600 is, for example, greater than or equal to 0 mm and less than or equal to 10 mm, in particular, greater than or equal to 0 mm and less than or equal to 5 mm.

The magnetic line of force 680b is one of magnetic lines of force that form a horizontal magnetic field in a plane apart from the top surface of the magnet unit 630 by a vertical distance d. The vertical distance d is, for example, greater than or equal to 0 mm and less than or equal to 20 mm or greater than or equal to 5 mm and less than or equal to 15 mm.

Here, with the use of the strong magnet 630N and the strong magnet 630S, an intense magnetic field can be generated in the vicinity of the top surface of the substrate 660. Specifically, the magnetic flux density of the horizontal magnetic field on the top surface of the substrate 660 can be greater than or equal to 10 G and less than or equal to 100 G, preferably greater than or equal to 15 G and less than or equal to 60 G, further preferably greater than or equal to 20 G and less than or equal to 40 G.

Note that the magnetic flux density of the horizontal magnetic field may be measured when the magnetic flux density of the vertical magnetic field is 0 G.

By setting the magnetic flux density of the magnetic field in the deposition chamber 601 to be in the above range, an oxide with high density and high crystallinity can be deposited. The deposited oxide hardly includes a plurality of kinds of crystalline phases and has a substantially single crystalline phase.

Figure 6B:
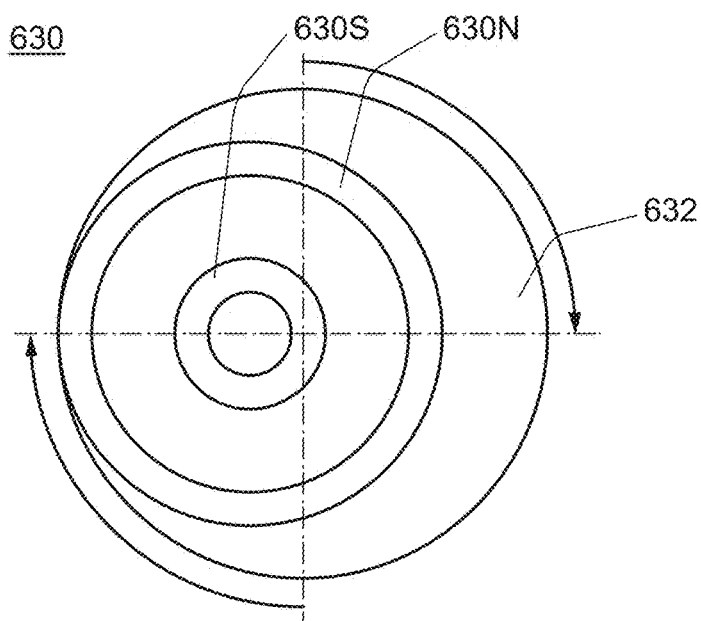

FIG. 6B is a top view of the magnet unit 630. In the magnet unit 630, the magnet 630N having a circular or substantially circular shape and the magnet 630S having a circular or substantially circular shape are fixed to the magnet holder 632. The magnet unit 630 can be rotated about a normal vector at the center of the top surface of the magnet unit 630 or a normal vector substantially at the center of the top surface of the magnet unit 630. For example, the magnet unit 630 may be rotated with a beat (also referred to as rhythm, pulse, frequency, period, cycle, or the like) of greater than or equal to 0.1 Hz and less than or equal to 1 kHz.

Thus, a region where a magnetic field on the target 600 is intense changes as the magnet unit 630 is rotated. The region with an intense magnetic field is a high-density plasma region;

thus, sputtering of the target 600 easily occurs in the vicinity of the region. For example, when the region with an intense magnetic field is fixed, only a specific region of the target 600 is used. In contrast, when the magnet unit 630 is rotated as shown in FIG. 6B, plasma 640 is generated between the target 600 and the substrate 660, and the target 600 can be uniformly used. By rotating the magnet unit 630, a film with a uniform thickness and uniform quality can be deposited.

By rotating the magnet unit 630, the direction of the magnetic line of force on the top surface of the substrate 660 can also be changed.

Although the magnet unit 630 is rotated in this example, one embodiment of the present invention is not limited to this example. For example, the magnet unit 630 may be oscillated vertically and/or horizontally. For example, the magnet unit 630 may be oscillated with a beat of greater than or equal to 0.1 Hz and less than or equal to 1 kHz. Alternatively, the target 600 may be rotated or moved. For example, the target 600 may be rotated or moved with a beat of greater than or equal to 0.1 Hz and less than or equal to 1 kHz. Further alternatively, the direction of a magnetic line of force on the top surface of the substrate 660 may be changed relatively by rotating the substrate 660. These methods may be combined.

The deposition chamber 601 may have a water channel inside or under the backing plate 610. By making a fluid (air, nitrogen, a rare gas, water, oil, or the like) flow through the water channel, discharge anomaly due to an increase in the temperature of the target 600 or damage to the deposition chamber 601 due to deformation of a component can be prevented in the sputtering. In that case, the backing plate 610 and the target 600 are preferably adhered to each other with a bonding member because the cooling capability is increased.

A gasket is preferably provided between the target holder 620 and the backing plate 610, in which case an impurity is less likely to enter the deposition chamber 601 from the outside, the water channel, or the like.

In the magnet unit 630, the magnet 630N and the magnet 630S are placed such that their surfaces on the target 600 side have opposite polarities. Here, the case where the pole of the magnet 630N on the target 600 side is the north pole and the pole of the magnet 630S on the target 600 side is the south pole is described. Note that the layout of the magnets and the poles in the magnet unit 630 is not limited to that described here or that illustrated in FIG. 6A.

In the deposition, a potential V1 applied to a terminal V1 connected to the target holder 620 is, for example, lower than a potential V2 applied to a terminal V2 connected to the substrate holder 670. The potential V2 applied to the terminal V2 connected to the substrate holder 670 is, for example, the ground potential. A potential V3 applied to a terminal V3 connected to the magnet holder 632 is, for example, the ground potential. Note that the potentials applied to the terminals V1, V2, and V3 are not limited to the above description. Not all the target holder 620, the substrate holder 670, and the magnet holder 632 are necessarily supplied with potentials. For example, the substrate holder 670 may be electrically floating. Note that although the potential V1 is applied to the terminal V1 connected to the target holder 620 (i.e., a DC sputtering method is employed) in the example illustrated in FIG. 6A, one embodiment of the present invention is not limited thereto. For example, it is possible to employ what is called an RF sputtering method, in which case a high-frequency power supply with a frequency of 13.56 MHz or 27.12 MHz, for example, is connected to the target holder 620.

FIG. 6A illustrates an example where the backing plate 610 and the target holder 620 are not electrically connected to the magnet unit 630 and the magnet holder 632, but electrical connection is not limited thereto. For example, the backing plate 610 and the target holder 620 may be electrically connected to the magnet unit 630 and the magnet holder 632, and the backing plate 610, the target holder 620, the magnet unit 630, and the magnet holder 632 may have the same potential.

To increase the crystallinity of the oxide to be obtained, the temperature of the substrate 660 may be set high. By setting the temperature of the substrate 660 high, migration of sputtered particles on the top surface of the substrate 660 can be promoted. Thus, an oxide with higher density and higher crystallinity can be deposited. Note that the temperature of the substrate 660 is, for example, higher than or equal to 100° C. and lower than or equal to 450° C., preferably higher than or equal to 150° C. and lower than or equal to 400° C., more preferably higher than or equal to 170° C. and lower than or equal to 350° C.

When the partial pressure of oxygen in the deposition gas is too high, an oxide including a plurality of kinds of crystalline phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 vol %, preferably less than or equal to 33 vol %, further preferably less than or equal to 20 vol %, and still further preferably less than or equal to 15 vol %.

The vertical distance between the target 600 and the substrate 660 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 600 and the substrate 660 can be, in some cases, small enough to suppress a decrease in the energy of the sputtered particles until the sputtered particles reach the substrate 660. Within the above range, the vertical distance between the target 600 and the substrate 660 can be, in some cases, large enough to make the incident direction of the sputtered particle substantially vertical to the substrate 660, so that damage to the substrate 660 caused by collision of the sputtered particles can be reduced.

Figure 7A:
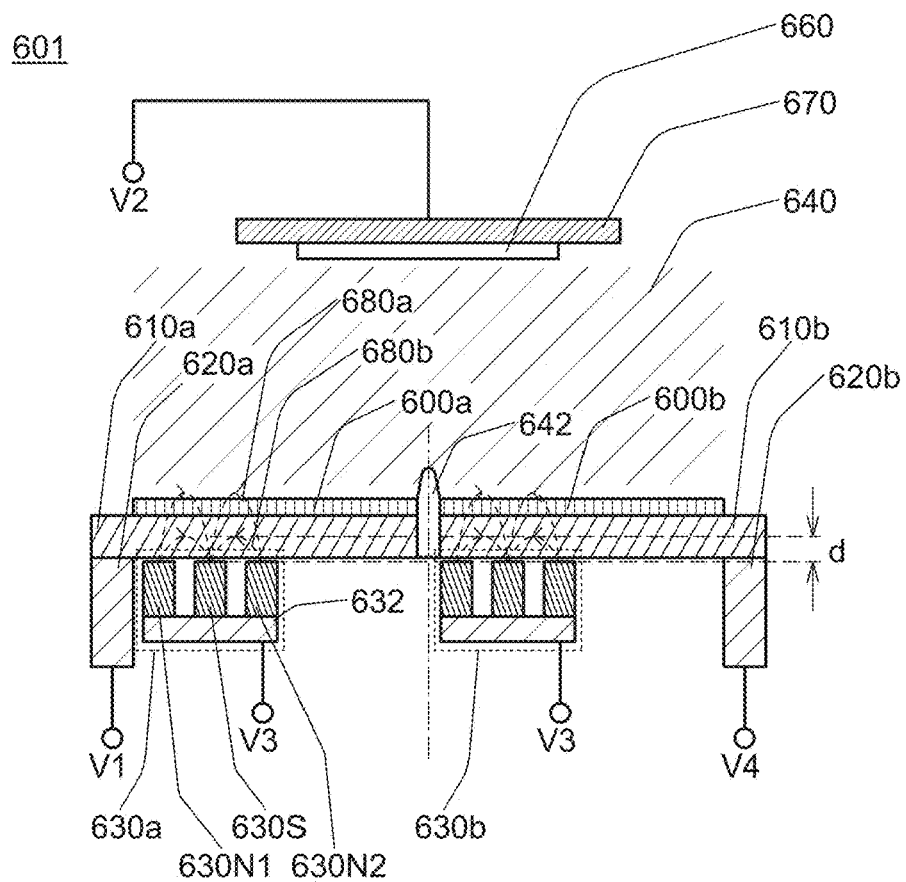
FIGS. 7A and 7B illustrate a sputtering apparatus.

FIG. 7A illustrates an example of a deposition chamber different from that in FIG. 6A.

The deposition chamber 601 in FIG. 7A includes a target holder 620a, a target holder 620b, a backing plate 610a, a backing plate 610b, a target 600a, a target 600b, a magnet unit 630a, a magnet unit 630b, a member 642, and the substrate holder 670. Note that the target 600a is placed over the backing plate 610a. The backing plate 610a is placed over the target holder 620a. The magnet unit 630a is placed under the target 600a with the backing plate 610a positioned therebetween. The target 600b is placed over the backing plate 610b. The backing plate 610b is placed over the target holder 620*b*. The magnet unit 630*b* is placed under the target 600*b* with the backing plate 610*b* positioned therebetween.

The magnet unit 630*a* includes a magnet 630N1, a magnet 630N2, the magnet 630S, and the magnet holder 632. Note that in the magnet unit 630*a*, the magnet 630N1, the magnet 630N2, and the magnet 630S are placed over the magnet holder 632. The magnet 630N1, the magnet 630N2, and the magnet 630S are spaced. Note that the magnet unit 630*b* has a structure similar to that of the magnet unit 630*a*. When the substrate 660 is transferred into the deposition chamber 601, the substrate 660 is placed on the substrate holder 670.

The target 600*a*, the backing plate 610*a*, and the target holder 620*a* are separated from the target 600*b*, the backing plate 610*b*, and the target holder 620*b* by the member 642. Note that the member 642 is preferably an insulator. However, the member 642 may be a conductor or a semiconductor. The member 642 may be a conductor or a semiconductor whose surface is covered with an insulator.

The target holder 620*a* and the backing plate 610*a* are fixed to each other with a screw (e.g., a bolt) and have the same potential. The target holder 620*a* has a function of supporting the target 600*a* with the backing plate 610*a* positioned therebetween. The target holder 620*b* and the backing plate 610*b* are fixed to each other with a screw (e.g., a bolt) and have the same potential. The target holder 620*b* has a function of supporting the target 600*b* with the backing plate 610*b* positioned therebetween.

The backing plate 610*a* has a function of fixing the target 600*a*. The backing plate 610*b* has a function of fixing the target 600*b*.

FIG. 7A illustrates the magnetic line of force 680*a* and the magnetic line of force 680*b* formed by the magnet unit 630*a*.

The magnetic line of force 680*a* is one of magnetic lines of force that form a horizontal magnetic field in the vicinity of the top surface of the target 600*a*. The vicinity of the top surface of the target 600*a* corresponds to a region in which the vertical distance from the target 600*a* is, for example, greater than or equal to 0 mm and less than or equal to 10 mm, in particular, greater than or equal to 0 mm and less than or equal to 5 mm.

The magnetic line of force 680*b* is one of magnetic lines of force that form a horizontal magnetic field in a plane apart from the top surface of the magnet unit 630*a* by a vertical distance d. The vertical distance d is, for example, greater than or equal to 0 mm and less than or equal to 20 mm or greater than or equal to 5 mm and less than or equal to 15 mm.

Here, with the use of the strong magnet 630N1, the strong magnet 630N2, and the strong magnet 630S, an intense magnetic field can be generated in the vicinity of the top surface of the substrate 660. Specifically, the magnetic flux density of the horizontal magnetic field on the top surface of the substrate 660 can be greater than or equal to 10 G and less than or equal to 100 G, preferably greater than or equal to 15 G and less than or equal to 60 G, further preferably greater than or equal to 20 G and less than or equal to 40 G.

By setting the magnetic flux density of the magnetic field in the deposition chamber 601 to be in the above range, an oxide with high density and high crystallinity can be deposited. The deposited oxide hardly includes a plurality of kinds of crystalline phases and has a substantially single crystalline phase.

Note that the magnet unit 630*b* forms magnetic lines of force similar to those formed by the magnet unit 630*a*.

Figure 7B:
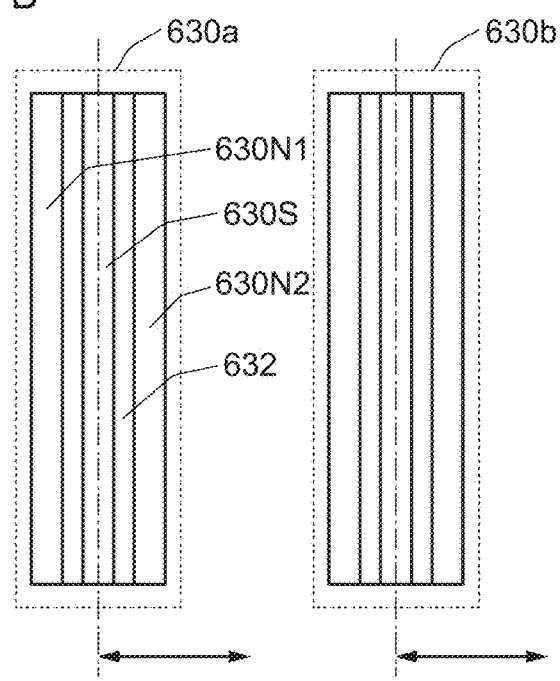

FIG. 7B is a top view of the magnet units 630*a* and 630*b*. In the magnet unit 630*a*, the magnet 630N1 having a rectangular or substantially rectangular shape, the magnet 630N2 having a rectangular or substantially rectangular shape, and the magnet 630S having a rectangular or substantially rectangular shape are fixed to the magnet holder 632. The magnet unit 630*a* can be oscillated horizontally as shown in FIG. 7B. For example, the magnet unit 630*a* may be oscillated with a beat of greater than or equal to 0.1 Hz and less than or equal to 1 kHz.

Thus, a region where a magnetic field on the target 600*a* is intense changes as the magnet unit 630*a* is oscillated. The region with an intense magnetic field is a high-density plasma region; thus, sputtering of the target 600*a* easily occurs in the vicinity of the region. For example, when the region with an intense magnetic field is fixed, only a specific region of the target 600*a* is used. In contrast, when the magnet unit 630*a* is oscillated as shown in FIG. 7B, plasma 640 is generated between the target 600*a* and the substrate 660, and the target 600*a* can be uniformly used. By oscillating the magnet unit 630*a*, a film with a uniform thickness and uniform quality can be deposited.

By oscillating the magnet unit 630*a*, the state of the magnetic lines of force on the top surface of the substrate 660 can also be changed. The same applies to the magnet unit 630*b*.

Although the magnet unit 630*a* and the magnet unit 630*b* are oscillated in this example, one embodiment of the present invention is not limited to this example. For example, the magnet unit 630*a* and the magnet unit 630*b* may be rotated. For example, the magnet unit 630*a* and the magnet unit 630*b* may be rotated with a beat of greater than or equal to 0.1 Hz and less than or equal to 1 kHz. Alternatively, the target 600 may be rotated or moved. For example, the target 600 may be rotated or moved with a beat of greater than or equal to 0.1 Hz and less than or equal to 1 kHz. Further alternatively, the state of magnetic lines of force on the top surface of the substrate 660 can be changed relatively by rotating the substrate 660. These methods may be combined.

The deposition chamber 601 may have a water channel inside or under the backing plate 610*a* and the backing plate 610*b*. By making a fluid (air, nitrogen, a rare gas, water, oil, or the like) flow through the water channel, discharge anomaly due to an increase in the temperature of the target 600*a* and the target 600*b* or damage to the deposition chamber 601 due to deformation of a component can be prevented in the sputtering. In that case, the backing plate 610*a* and the target 600*a* are preferably adhered to each other with a bonding member because the cooling capability is increased. Furthermore, the backing plate 610*b* and the target 600*b* are preferably adhered to each other with a bonding member because the cooling capability is increased.

A gasket is preferably provided between the target holder 620*a* and the backing plate 610*a*, in which case an impurity is less likely to enter the deposition chamber 601 from the outside, the water channel, or the like. A gasket is preferably provided between the target holder 620*b* and the backing plate 610*b*, in which case an impurity is less likely to enter the deposition chamber 601 from the outside, the water channel, or the like.

In the magnet unit 630*a*, the magnets 630N1 and 630N2 and the magnet 630S are placed such that their surfaces on the target 600*a* side have opposite polarities. Here, the case where the pole of each of the magnets 630N1 and 630N2 on the target 600*a* side is the north pole and the pole of the magnet 630S on the target 600*a* side is the south pole is described. Note that the layout of the magnets and the poles in the magnet unit 630a is not limited to that described here or that illustrated in FIG. 7A. The same applies to the magnet unit 630b.

In the deposition, a potential applied to the terminal V1 connected to the target holder 620a and a potential applied to the terminal V4 connected to the target holder 620b may be alternately switched between a high level and a low level. When the potential applied to the terminal V1 is one of the high level and the low level, the potential applied to the terminal V4 is the other of the high level and the low level. A potential applied to the terminal V2 connected to the substrate holder 670 is, for example, the ground potential. A potential applied to the terminal V3 connected to the magnet holder 632 is, for example, the ground potential. Note that the potentials applied to the terminals V1, V2, V3, and V4 are not limited to the above description. Not all the target holder 620a, the target holder 620b, the substrate holder 670, and the magnet holder 632 are necessarily supplied with potentials. For example, the substrate holder 670 may be electrically floating. Note that the potential applied to the terminal V1 connected to the target holder 620a and the potential applied to the terminal V4 connected to the target holder 620b are alternately switched between the high level and the low level (i.e., an AC sputtering method) in the example illustrated in FIG. 7A; however, one embodiment of the present invention is not limited thereto.

FIG. 7A illustrates an example where the backing plate 610a and the target holder 620a are not electrically connected to the magnet unit 630a and the magnet holder 632, but electrical connection is not limited thereto. For example, the backing plate 610a and the target holder 620a may be electrically connected to the magnet unit 630a and the magnet holder 632, and the backing plate 610a, the target holder 620a, the magnet unit 630a, and the magnet holder 632 may have the same potential. The backing plate 610b and the target holder 620b are not electrically connected to the magnet unit 630b and the magnet holder 632 in the example, but electrical connection is not limited thereto. For example, the backing plate 610b and the target holder 620b may be electrically connected to the magnet unit 630b and the magnet holder 632, and the backing plate 610b, the target holder 620b, the magnet unit 630b, and the magnet holder 632 may have the same potential.

To increase the crystallinity of the oxide to be obtained, the temperature of the substrate 660 may be set high. By setting the temperature of the substrate 660 high, migration of sputtered particles on the top surface of the substrate 660 can be promoted. Thus, an oxide with higher density and higher crystallinity can be deposited. Note that the temperature of the substrate 660 is, for example, higher than or equal to 100° C. and lower than or equal to 450° C., preferably higher than or equal to 150° C. and lower than or equal to 400° C., more preferably higher than or equal to 170° C. and lower than or equal to 350° C.

When the partial pressure of oxygen in the deposition gas is too high, an oxide including a plurality of kinds of crystalline phases is likely to be deposited; therefore, a mixed gas of oxygen and a rare gas such as argon (other examples of the rare gas are helium, neon, krypton, and xenon) is preferably used as the deposition gas. For example, the proportion of oxygen in the whole deposition gas is less than 50 vol %, preferably less than or equal to 33 vol %, further preferably less than or equal to 20 vol %, and still further preferably less than or equal to 15 vol %.

The vertical distance between the target 600a and the substrate 660 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 600a and the substrate 660 can be, in some cases, small enough to suppress a decrease in the energy of the sputtered particles until the sputtered particles reach the substrate 660. Within the above range, the vertical distance between the target 600a and the substrate 660 can be, in some cases, large enough to make the incident direction of the sputtered particle substantially vertical to the substrate 660, so that damage to the substrate 660 caused by collision of the sputtered particles can be reduced.

The vertical distance between the target 600b and the substrate 660 is greater than or equal to 10 mm and less than or equal to 600 mm, preferably greater than or equal to 20 mm and less than or equal to 400 mm, more preferably greater than or equal to 30 mm and less than or equal to 200 mm, further more preferably greater than or equal to 40 mm and less than or equal to 100 mm. Within the above range, the vertical distance between the target 600b and the substrate 660 can be, in some cases, small enough to suppress a decrease in the energy of the sputtered particles until the sputtered particles reach the substrate 660. Within the above range, the vertical distance between the target 600b and the substrate 660 can be, in some cases, large enough to make the incident direction of the sputtered particle substantially vertical to the substrate 660, so that damage to the substrate 660 caused by collision of the sputtered particles can be reduced.

[Facing-Targets Sputtering Apparatus (VDSP)]

Figure 8A:
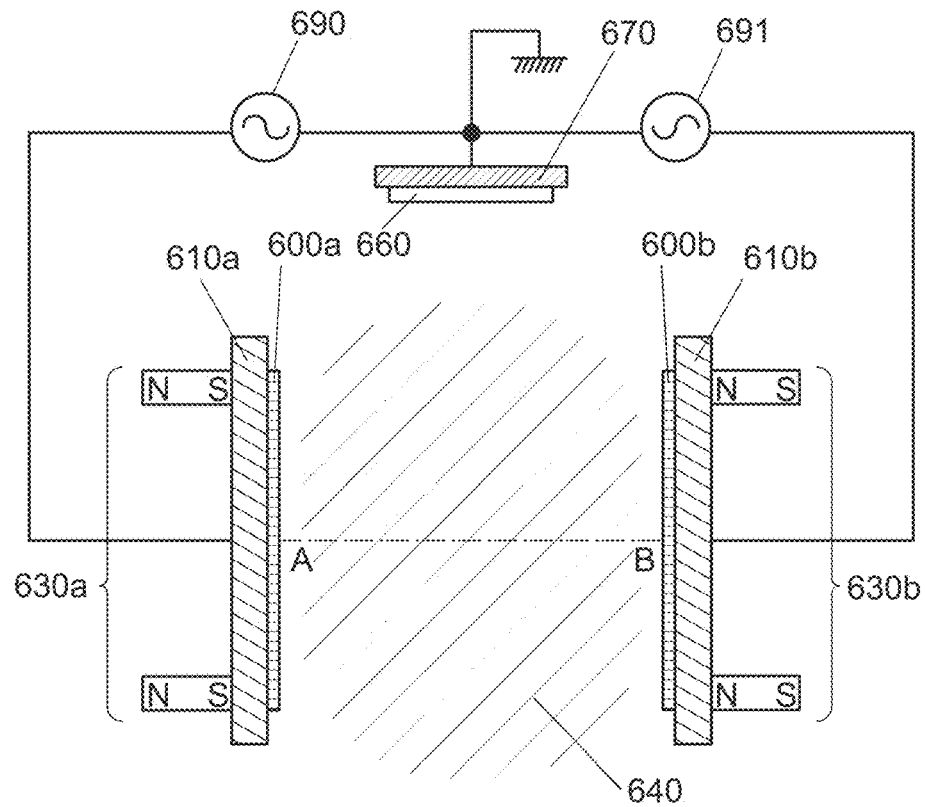
FIGS. 8A to 8C illustrate a sputtering apparatus.

Next, the facing-targets sputtering apparatus is described. FIG. 8A is a cross-sectional view of a deposition chamber in a facing-targets sputtering apparatus. The deposition chamber illustrated in FIG. 8A includes the target 600a, the target 600b, the backing plate 610a for holding the target 600a, the backing plate 610b for holding the target 600b, the magnet unit 630a placed behind the target 600a with the backing plate 610a positioned therebetween, and the magnet unit 630b placed behind the target 600b with the backing plate 610b positioned therebetween. The substrate holder 670 is placed between the target 600a and the target 600b. The substrate holder 670 is placed above a region where the target 600a and the target 600b face each other (also referred to as a region between targets). The substrate 660 is transferred into the deposition chamber, and then the substrate 660 is fixed to the substrate holder 670.

As illustrated in FIG. 8A, the substrate holder 670 is placed above the region between targets, but may be placed below the region. Alternatively, the substrate holders 670 may be placed above and below the region. Providing the substrate holders 670 above and below the region allows deposition on two or more substrates at once, leading to an increase in productivity.

As illustrated in FIG. 8A, a power source 690 and a power source 691 for applying potentials are connected to the backing plates 610a and 610b. It is preferable to use AC power sources, which alternately apply a high-level potential and a low-level potential to the backing plate 610a and the backing plate 610b. Although AC power sources are used as the power sources 690 and 691 illustrated in FIG. 8A, one embodiment of the present invention is not limited thereto. For example, RF power sources, DC power sources, or the like can be used as the power sources 690 and 691. Alternatively, different kinds of power sources may be used as the power sources 690 and 691.

The substrate holder 670 is preferably connected to GND. The substrate holder 670 may be in a floating state.

Figure 8B:
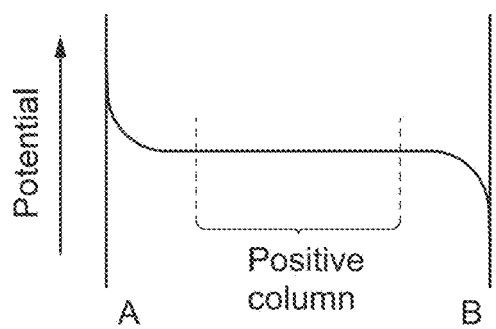
Figure 8C:
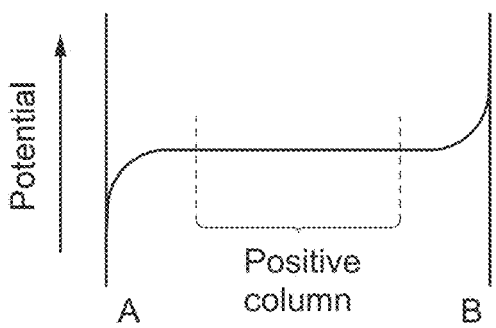

FIGS. 8B and 8C each show potential distribution of plasma 640 along dashed-dotted line A-B in FIG. 8A. FIG. 8B shows the potential distribution in the case where a high potential is applied to the backing plate 610a and a low potential is applied to the backing plate 610b. In that case, a cation is accelerated toward the target 600b. FIG. 8C shows the potential distribution in the case where a low potential is applied to the backing plate 610a and a high potential is applied to the backing plate 610b. In that case, a cation is accelerated toward the target 600a. The deposition can be performed by alternating the state in FIG. 8B and the state in FIG. 8C.

In FIG. 8A, the target 600a and the target 600b are parallel to each other. Moreover, the magnet unit 630a and the magnet unit 630b are placed so that opposite poles face each other.

Magnetic lines of force run from the magnet unit 630b to the magnet unit 630a. Therefore, in the deposition, the plasma 640 is confined in the magnetic field formed by the magnet units 630a and 630b. Thus, the substrate holder 670 and the substrate 660 are located outside the plasma 640. The substrate 660 is not exposed to a high electric field region of the plasma 640, leading to a reduction in damage due to the plasma 640.

The facing-targets sputtering apparatus can stably generate plasma even in a high vacuum. Thus, deposition can be performed at a pressure higher than or equal to 0.005 Pa and lower than or equal to 0.09 Pa, for example. As a result, the concentration of impurities contained during deposition can be reduced.

The use of the facing-targets sputtering apparatus allows deposition in a high vacuum or deposition with less plasma damage and thus can provide a film with high crystallinity even when the temperature of the substrate 660 is low (e.g., higher than or equal to 10° C. and lower than 100° C.).

Figure 9A:
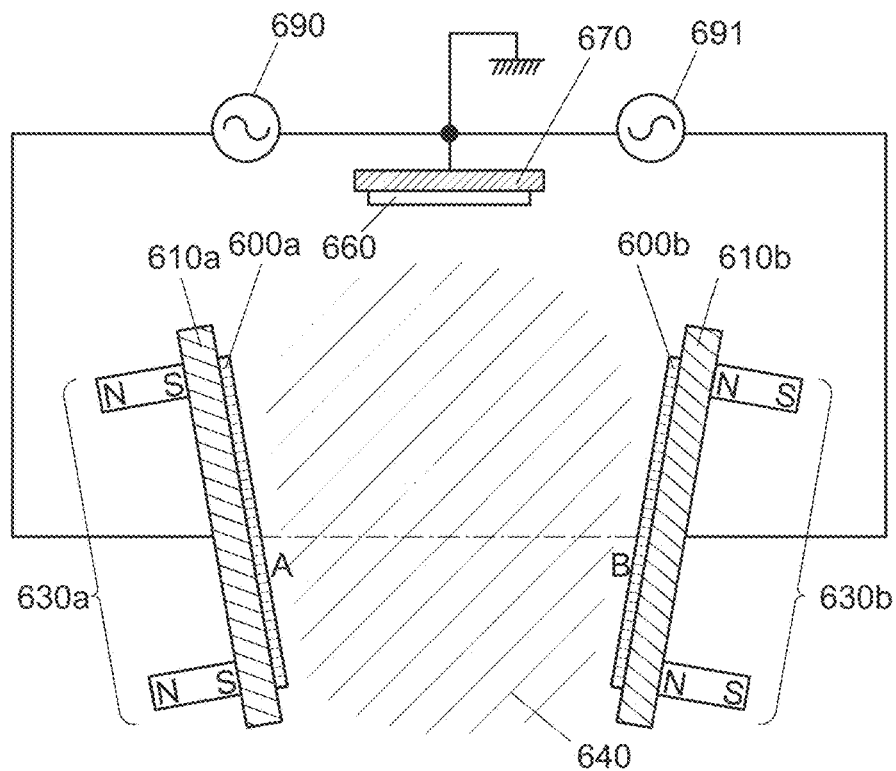
FIGS. 9A and 9B illustrate a sputtering apparatus.

A structure illustrated in FIG. 9A is different from that illustrated in FIG. 8A in that the target 600a and the target 600b that face each other are not parallel but inclined to each other (in V-shape). Thus, the description for FIG. 8A is referred to for the description except for the arrangement of the targets. The magnet unit 630a and the magnet unit 630b are placed so that opposite poles face each other. The substrate holder 670 and the substrate 660 are placed above the region between targets. With the targets 600a and 600b placed as illustrated in FIG. 9A, the proportion of sputtered particles that reach the substrate 660 can be increased; accordingly, the deposition rate can be increased.

Figure 9B:
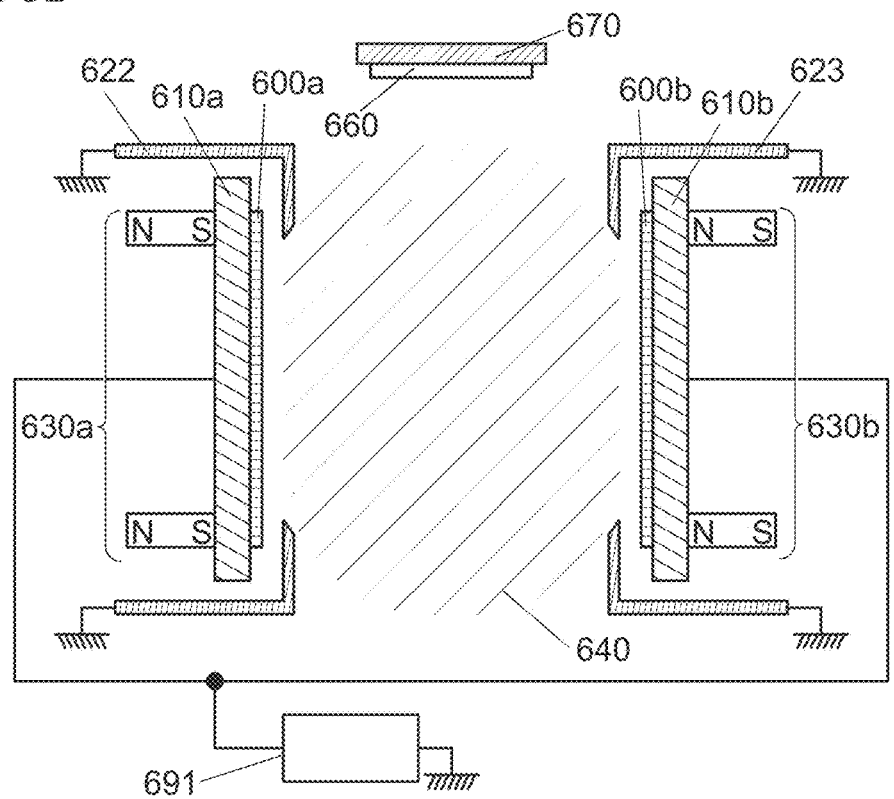

FIG. 9B illustrates another example of a facing-targets sputtering apparatus.

FIG. 9B is a schematic cross-sectional view of a deposition chamber of a facing-targets sputtering apparatus. Unlike in the deposition chamber illustrated in FIG. 8A, a target shield 622 and a target shield 623 are provided. The power source 691 connected to the backing plates 610a and 610b is also provided. The substrate holder 670 is placed above the region between targets. Thus, the substrate 660 is not exposed to a high electric field region of the plasma 640, leading to a reduction in damage due to the plasma 640.

As illustrated in FIG. 9B, the substrate holder 670 is placed above the region between targets, but may be placed below the region. Alternatively, the substrate holders 670 may be placed above and below the region. Providing the substrate holders 670 above and below the region allows deposition on two or more substrates at once, leading to an increase in productivity.

The target shields 622 and 623 are connected to GND as illustrated in FIG. 9B. This means that the plasma 640 is generated by a potential difference between the backing plates 610a and 610b to which a potential of the power source 691 is applied and the target shields 622 and 623 to which GND is applied.

In the above-described facing-targets sputtering apparatuses, plasma is confined by magnetic fields between targets; thus, plasma damage to a substrate can be reduced. Furthermore, a deposited film can provide improved step coverage because an incident angle of a sputtered particle to a substrate can be made smaller by the inclination of the target. Moreover, deposition in a high vacuum enables the concentration of impurities contained in the film to be reduced.

Note that a parallel-plate-type sputtering apparatus or an ion beam sputtering apparatus may be provided in the deposition chamber.

<Deposition Apparatus>

A deposition apparatus of one embodiment of the present invention including a deposition chamber in which a sputtering target can be placed will be described below.

First, a structure of a deposition apparatus which allows the entry of few impurities into a film at the time of the deposition or the like is described with reference to FIG. 10 and FIGS. 11A to 11C.

Figure 10:
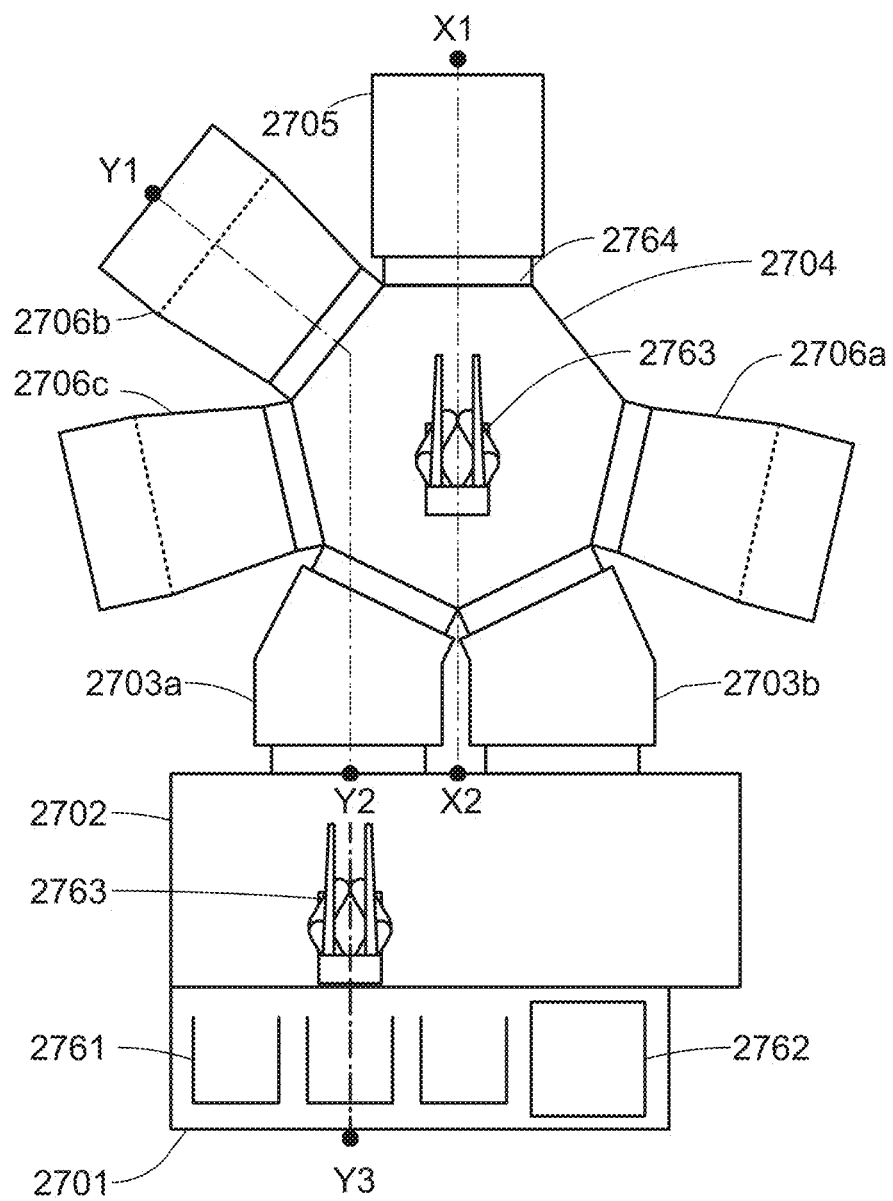
FIG. 10 is a top view illustrating an example of a deposition apparatus.

FIG. 10 is a schematic top view of a single wafer multi-chamber deposition apparatus 2700. The deposition apparatus 2700 includes an atmosphere-side substrate supply chamber 2701 including a cassette port 2761 for storing substrates and an alignment port 2762 for performing alignment of substrates, an atmosphere-side substrate transfer chamber 2702 through which a substrate is transferred from the atmosphere-side substrate supply chamber 2701, a load lock chamber 2703a where a substrate is carried in and the pressure is switched from atmospheric pressure to reduced pressure or from reduced pressure to atmospheric pressure, an unload lock chamber 2703b where a substrate is carried out and the pressure is switched from reduced pressure to atmospheric pressure or from atmospheric pressure to reduced pressure, a transfer chamber 2704 where a substrate is transferred in a vacuum, a substrate heating chamber 2705 where a substrate is heated, and deposition chambers 2706a, 2706b, and 2706c in each of 25 which a sputtering target is placed for deposition. Note that for the deposition chambers 2706a, 2706b, and 2706c, the structure of the above-described deposition chamber can be referred to.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705 and the deposition chambers 2706a, 2706b, and 2706c.

Note that gate valves 2764 are provided in connecting portions between the chambers so that each chamber excluding the atmosphere-side substrate supply chamber 2701 and the atmosphere-side substrate transfer chamber 2702 can be independently kept in a vacuum state. In each of the atmosphere-side substrate transfer chamber 2702 and the transfer chamber 2704, a transfer robot 2763 is provided, which is capable of transferring substrates.

It is preferable that the substrate heating chamber 2705 also serve as a plasma treatment chamber. In the deposition apparatus 2700, substrates can be transferred without being exposed to the air between treatments, and adsorption of impurities to substrates can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement and the process conditions.

Figure 11A:
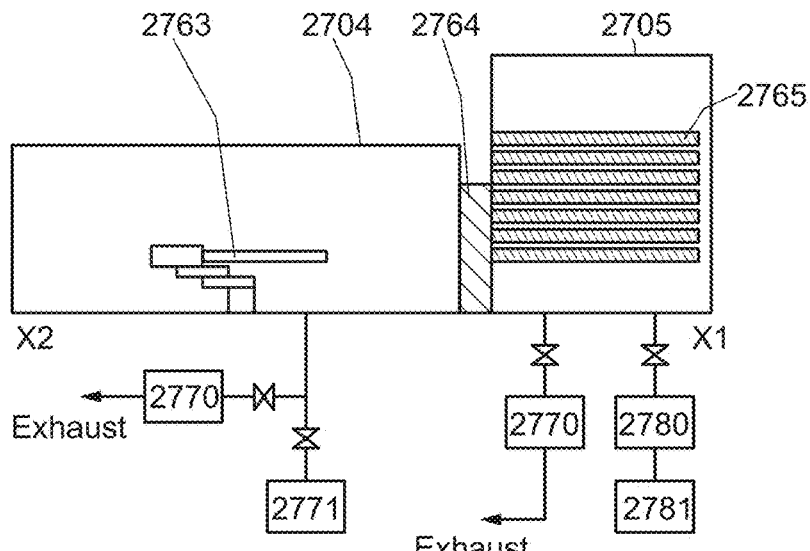
FIGS. 11A to 11C are cross-sectional views illustrating an example of a deposition apparatus.
Figure 11B:
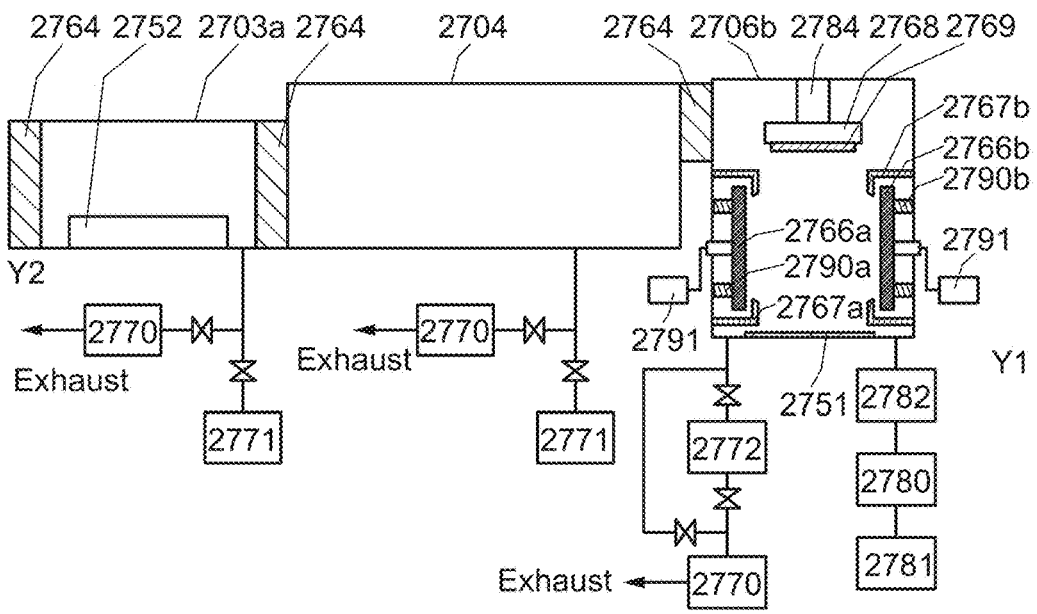
Figure 11C:
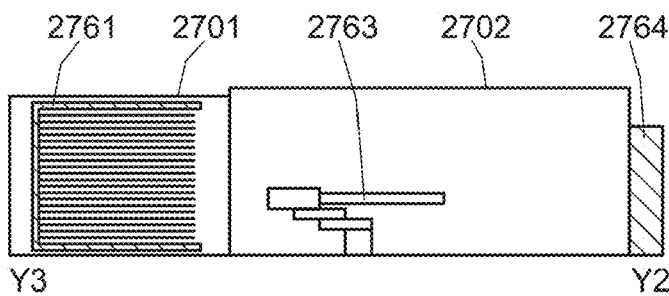

Next, FIG. 11A, FIG. 11B, and FIG. 11C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 2700 illustrated in FIG. 10.

FIG. 11A illustrates a cross section of the substrate heating chamber 2705 and the transfer chamber 2704, and the substrate heating chamber 2705 includes a plurality of heating stages 2765 which can hold a substrate. Note that the substrate heating chamber 2705 is connected to a vacuum pump 2770 through a valve. As the vacuum pump 2770, a dry pump and a mechanical booster pump can be used, for example.

As a heating mechanism which can be used for the substrate heating chamber 2705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are provided for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, exhaust is performed using the vacuum pump 2770 from the atmospheric pressure to low or medium vacuum (approximately 0.1 Pa to several hundred pascals) and then the valves are switched and exhaust is performed using the cryopump 2771 from the medium vacuum to high or ultra-high vacuum (0.1 Pa to $1\times10^{-7}$ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 11B illustrates a cross section of the deposition chamber 2706b, the transfer chamber 2704, and the load lock chamber 2703a.

Here, the details of the deposition chamber (sputtering chamber) are described with reference to FIG. 11B. The deposition chamber 2706b illustrated in FIG. 11B includes a target 2766a, a target 2766b, a target shield 2767a, a target shield 2767b, a magnet unit 2790a, a magnet unit 2790b, a substrate holder 2768, and power sources 2791. Although not illustrated, each of the targets 2766a and 2766b is fixed to a target holder with a backing plate provided therebetween. The power source 2791 is electrically connected to each of the targets 2766a and 2766b. The magnet unit 2790a is placed on a back side of the target 2766a, and the magnet unit 2790b is placed on a back side of the target 2766b. The target shield 2767a is provided so as to surround an end portion of the target 2766a, and the target shield 2767b is provided so as to surround an end portion of target 2766b. Note that here, a substrate 2769 is supported by the substrate holder 2768. The substrate holder 2768 is fixed to the deposition chamber 2706b by an adjustment member 2784. Owing to the adjustment member 2784, the substrate holder 2768 can be moved. The substrate holder 2768 is placed above a region between the target 2766a and the target 2766b (also referred to as a region between targets). Providing the substrate holder 2768 supporting the substrate 2769 above the region between targets can reduce damage due to plasma, for example. Although not illustrated, the substrate holder 2768 may include a substrate holding mechanism which holds the substrate 2769, a heater which heats the substrate 2769 from the back side, or the like.

As illustrated in FIG. 11B, the substrate holder 2768 is placed above the region between targets, but may be placed below the region. Alternatively, the substrate holders 2768 may be placed above and below the region. Providing the substrate holders 2768 above and below the region allows deposition on two or more substrates at once, leading to an increase in productivity.

The target shields 2767 can suppress deposition of a particle which is sputtered from the target 2766 on a region where deposition is not needed. Moreover, the target shields 2767 are preferably processed to prevent accumulated sputtered particles from being separated. For example, blasting treatment which increases surface roughness may be performed, or roughness may be formed on the surfaces of the target shields 2767.

The deposition chamber 2706b is connected to the mass flow controller 2780 through a gas heating mechanism 2782, and the gas heating mechanism 2782 is connected to the refiner 2781 through the mass flow controller 2780. With the gas heating mechanism 2782, a gas which is introduced to the deposition chamber 2706b can be heated to a temperature higher than or equal to 40° C. and lower than or equal to 400° C. Note that although the gas heating mechanism 2782, the mass flow controller 2780, and the refiner 2781 can be provided for each of a plurality of kinds of gases, only one gas heating mechanism 2782, one mass flow controller 2780, and one refiner 2781 are provided for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, and further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism which can adsorb a molecule (or an atom) having a relatively high melting point, such as water. The turbo molecular pump 2772 is capable of stably removing a large-sized molecule (or atom), needs low frequency of maintenance, and thus enables high productivity, whereas it has a low capability in removing hydrogen and water. Hence, the cryotrap 2751 is connected to the deposition chamber 2706b so as to have a high capability in removing water or the like. The temperature of a freezer of the cryotrap 2751 is set to be lower than or equal to 100 K, preferably lower than or equal to 80 K. In the case where the cryotrap 2751 includes a plurality of freezers, it is preferable to set the temperatures of the freezers at different temperatures because efficient exhaust is possible. For example, the temperature of a first-stage freezer may be set to be lower than or equal to 100 K and the temperature of a second-stage freezer may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b which are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, and further preferably less than or equal to $1\times10^{-5}$ Pa. In each of the above chambers, the partial pressure of a gas molecule (atom) having a mass-to-charge ratio (m/z) of 18 is less than or equal to $1\times10^{-5}$ Pa, and further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, and further preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, and further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706b which are described above preferably have a small amount of external leakage or internal leakage.

For example, in each of the transfer chamber 2704, the substrate heating chamber 2705, and the deposition chamber 2706b which are described above, the leakage rate is less than or equal to $3\times10^{-6}$ Pa·m³/s, preferably less than or equal to $1\times10^{-6}$ Pa·m³/s. The leakage rate of a gas molecule (atom) having a mass-to-charge ratio (m/z) of 18 is less than or equal to $1\times10^{-7}$ Pa·m³/s, preferably less than or equal to $3\times10^{-8}$ Pa·m³/s. The leakage rate of a gas molecule (atom) having a mass-to-charge ratio (m/z) of 28 is less than or equal to $1\times10^{-5}$ Pa·m³/s, preferably less than or equal to $1\times10^{-6}$ Pa·m³/s. The leakage rate of a gas molecule (atom) having a mass-to-charge ratio (m/z) of 44 is less than or equal to $3\times10^{-6}$ Pa·m³/s, preferably less than or equal to $1\times10^{-6}$ Pa·m³/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to desorb simply by exhaust, can be further increased. Note that when the inert gas which is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen which is a main component of the oxide is preferable in some cases. The baking is preferably performed using a lamp.

Alternatively, treatment for evacuating the inside of the deposition chamber is preferably performed for a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. As the dummy substrate, a substrate which releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703*a* illustrated in FIG. 11B and the atmosphere-side substrate transfer chamber 2702 and the atmosphere-side substrate supply chamber 2701 illustrated in FIG. 11C are described. Note that FIG. 11C illustrates a cross section of the atmosphere-side substrate transfer chamber 2702 and the atmosphere-side substrate supply chamber 2701.

For the transfer chamber 2704 illustrated in FIG. 11B, the description of the transfer chamber 2704 illustrated in FIG. 11A can be referred to.

The load lock chamber 2703*a* includes a substrate delivery stage 2752. When a pressure in the load lock chamber 2703*a* becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703*a* is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703*a* is connected to the vacuum pump 2770 and the cryopump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703*b* illustrated in FIG. 10 can have a structure similar to that of the load lock chamber 2703*a*.

The atmosphere-side substrate transfer chamber 2702 includes the transfer robot 2763. The transfer robot 2763 can deliver a substrate from the cassette port 2761 to the load lock chamber 2703*a* or deliver a substrate from the load lock chamber 2703*a* to the cassette port 2761. Furthermore, a mechanism for suppressing entry of dust or a particle, such as a high-efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., and further preferably about room temperature (typified by 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal of a bonding material used for adhesion between the backing plate and the target might be sputtered and might cause an increase in impurity concentration. Thus, it is preferable that the target be cooled sufficiently.

Specifically, to efficiently cool the target, a metal having high conductivity and a high heat dissipation property (specifically copper) is used for the backing plate, or a sufficient amount of cooling water is made to flow through a water channel formed in the backing plate.

Note that in the case where the target includes zinc, plasma damage is alleviated by the deposition in an oxygen gas atmosphere; thus, an oxide in which zinc is unlikely to be volatilized can be obtained.

The above-described deposition apparatus enables deposition of an oxide semiconductor whose hydrogen concentration measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$.

Furthermore, an oxide semiconductor whose nitrogen concentration measured by SIMS is lower than $5\times10^{19}$ atoms/cm$^3$, preferably lower than or equal to $1\times10^{19}$ atoms/cm$^3$, further preferably lower than or equal to $5\times10^{18}$ atoms/cm$^3$, and still further preferably lower than or equal to $1\times10^{18}$ atoms/cm$^3$ can be deposited.

Moreover, an oxide semiconductor whose carbon concentration measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ can be deposited.

An oxide having few impurities and oxygen vacancies is an oxide with low carrier density (specifically, lower than $8\times10^{11}$/cm$^3$, preferably lower than $1\times10^{11}$/cm$^3$, further preferably lower than $1\times10^{10}$/cm$^3$, and higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be regarded as an oxide having stable characteristics.

Furthermore, an oxide semiconductor can be deposited in which the released amount of each of the following gas molecules (atoms) measured by TDS is less than or equal to $1\times10^{19}$/cm$^3$ and preferably less than or equal to $1\times10^{18}$/cm$^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the oxide can be suppressed. Furthermore, when a film in contact with the oxide is formed with the use of the above deposition apparatus, the entry of impurities into the oxide from the film in contact therewith can be suppressed.

The structure described in this embodiment can be combined with any of the structures described in the other embodiments and examples as appropriate.

(Embodiment 3)

In this embodiment, one embodiment of a semiconductor device is described with reference to FIGS. 12A to 12C, FIGS. 13A to 13C, FIGS. 14A to 14C, FIGS. 15A to 15C, FIGS. 16A to 16C, FIGS. 17A to 17C, FIGS. 18A to 18C, FIGS. 19A to 19E, FIGS. 20A to 20D, FIGS. 21A to 21C, and FIGS. 22A to 22C.

<Transistor Structure 1>

An example of a transistor of one embodiment of the present invention is described below. FIGS. 12A to 12C are a top view and cross-sectional views of the transistor of one embodiment of the present invention. FIG. 12A is a top view. FIG. 12B is a cross-sectional view taken along dashed-dotted line X1-X2 in FIG. 12A. FIG. 12C is a cross-sectional view taken along dashed-dotted line Y1-Y2 in FIG. 12A. Note that for simplification of the drawing, some components are not illustrated in the top view in FIG. 12A.

A transistor 200 includes a conductor 205 (conductors 205a and 205b) and a conductor 260 which function as gate electrodes, insulators 220, 222, and 224 and an insulator 250 which function as gate insulating layers, an oxide 230 having a region where a channel is formed (oxides 230a, 230b, and 230c), a conductor 240a functioning as one of a source and a drain, a conductor 240b functioning as the other of the source and the drain, an insulator 280 containing excess oxygen, and an insulator 282 having a barrier property.

The oxide 230 includes the oxide 230a, the oxide 230b over the oxide 230a, and the oxide 230c over the oxide 230b. When the transistor 200 is turned on, current flows (a channel is formed) mainly in the oxide 230b. In contrast, although a current might flow in the vicinity of the interface (a mixed region in some cases) between the oxide 230b and the oxide 230a or 230c, the rest of the oxides 230a and 230c might function as insulators.

As illustrated in FIGS. 12A to 12C, the oxide 230c is preferably provided to cover side surfaces of the oxides 230a and 230b. The oxide 230c, which is provided between the insulator 280 and the oxide 230b including the region where the channel is formed, can prevent impurities such as hydrogen, water, and halogen from diffusing from the insulator 280 into the oxide 230b.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like. In particular, a metal nitride film such as a tantalum nitride film is preferable because it has a barrier property against hydrogen or oxygen and is difficult to oxidize (has a high oxidation resistance). Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

For example, it is preferable that a conductor having a barrier property against hydrogen, e.g., tantalum nitride, be used as the conductor 205a, and tungsten, which has high conductivity, be stacked thereover as the conductor 205b. The use of the combination of the materials can prevent diffusion of hydrogen into the oxide 230 while the conductivity of a wiring is ensured. Note that a two-layer structure of the conductors 205a and 205b is illustrated in FIGS. 12A to 12C; however, one embodiment of the present invention is not limited thereto, and a single-layer structure or a stacked-layer structure of three or more layers may be used. For example, between a conductor having a barrier property and a conductor having high conductivity, a conductor which is highly adhesive to the conductor having a barrier property and the conductor having high conductivity may be formed.

The insulator 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with the oxide 230 in the transistor 200, oxygen vacancies in the oxide 230 can be filled.

Furthermore, when the insulator 224 includes an excess-oxygen region, the insulator 222 preferably has a barrier property against oxygen, hydrogen, and water. When the insulator 222 has a barrier property against oxygen, oxygen in the excess-oxygen region is not diffused to the transistor 300 side but supplied to the oxide 230 efficiently. The conductor 205 can be inhibited from reacting with oxygen of the excess-oxygen region of the insulator 224.

The insulator 222 preferably has a single-layer structure or a stacked-layer structure using an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST). In particular, an insulating film having a barrier property against oxygen or hydrogen, e.g., an aluminum oxide film or a hafnium oxide film, is preferably used. The insulator 222 formed of such a material functions as a layer which prevents release of oxygen from the oxide 230 and entry of an impurity such as hydrogen from the outside.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

Note that the insulators 220, 222, and 224 each may have a stacked-layer structure of two or more layers. In that case, the stacked layers are not necessarily formed of the same material but may be formed of different materials.

Since the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode or the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205.

At this time, some of the moving electrons are trapped by the electron trap states of the insulator 222.

In the transistor in which a necessary amount of electrons is trapped by the electron trap states in the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0V.

Furthermore, the treatment for trapping the electrons may be performed in the manufacturing process of the transistor. For example, the treatment is preferably performed at any step before factory shipment, such as after the formation of a conductor connected to the source conductor or the drain conductor of the transistor, after pretreatment (wafer processing), after a wafer-dicing step, after packaging, or the like.

The threshold voltage can be controlled by appropriate adjustment of the thicknesses of the insulators 220, 222, and 224. For example, when the total thickness of the insulators 220, 222, and 224 is small, a voltage is efficiently applied from the conductor 205, resulting in low power consumption of the transistor. The total thickness of the insulators 220, 222, and 224 is less than or equal to 65 nm, preferably less than or equal to 20 nm.

Thus, a transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The oxides 230a, 230b, and 230c are each formed using a metal oxide such as In—M—Zn oxide (M is Al, Ga, Y, or Sn). An—In—Ga oxide or an In—Zn oxide may be used as the oxide 230.

Note that the oxide semiconductor described in the above embodiment can be used as the oxide 230b.

When the oxides 230a and 230b or the oxides 230b and 230c contain the same element (as a main component) in addition to oxygen, a mixed layer with a low density of defect states can be formed. For example, in the case where the oxide 230b is an In—Ga—Zn oxide, it is preferable to use an In—Ga—Zn oxide, a Ga—Zn oxide, gallium oxide, or the like as each of the oxides 230a and 230c.

At this time, the oxide 230b serves as a main carrier path. Since the density of defect states at the interface between the oxides 230a and 230b and the interface between the oxides 230b and 230c can be made low, the influence of interface scattering on carrier conduction is small, and high on-state current can be obtained.

When an electron is trapped in a trap state, the trapped electron behaves like fixed charge; thus, the threshold voltage of the transistor is shifted in the positive direction. The oxides 230a and 230c can make the trap state apart from the oxide 230b. This structure can prevent the positive shift of the threshold voltage of the transistor.

A material whose conductivity is sufficiently lower than that of the oxide 230b is used for the oxides 230a and 230c. In that case, the oxide 230b, the interface between the oxides 230b and 230a, and the interface between the oxides 230b and 230c mainly function as a channel region.

For example, in the case where an oxide in which the region A2 and the region B2 in FIG. 5 form a composite is used as the oxide 230b, it is preferable to use an oxide with [M]/[In] of greater than or equal to 1, preferably greater than or equal to 2, as each of the oxides 230a and 230c. In addition, it is preferable to use an oxide with sufficiently high insulation performance and [M]/([Zn]+[In]) of greater than or equal to 1 as the oxide 230c.

As the insulator 250, an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used, for example. The insulator may have a single-layer structure or a stacked-layer structure. Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the above insulator.

As the insulator 250, like the insulator 224, an oxide insulator that contains more oxygen than that in the stoichiometric composition is preferably used. When such an insulator containing excess oxygen is provided in contact with the oxide 230, oxygen vacancies in the oxide 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties against oxygen or hydrogen, can be used. The insulator 250 formed of such a material serves as a layer that prevents release of oxygen from the oxide 230 and entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons are trapped by electron trap states, the threshold voltage of the transistor 200 can be shifted in the positive direction. The transistor 200 having the structure is a normally-off transistor which is in a non-conduction state (also referred to as an off state) even when the gate voltage is 0V.

In addition to the insulator 250, a barrier film may be provided between the oxide 230 and the conductor 260 in the transistor illustrated in FIGS. 12A to 12C. Alternatively, the oxide 230c may have a barrier property.

For example, an insulating film containing excess oxygen is provided in contact with the oxide 230 and enclosed with a barrier film, whereby the composition of the oxide can be substantially the same as the stoichiometric composition or can be in a supersaturated state containing more oxygen than that in the stoichiometric composition. It is also possible to prevent entry of impurities such as hydrogen into the oxide 230.

One of the conductors 240a and 240b functions as a source electrode, and the other thereof functions as a drain electrode.

Any of metals such as aluminum, titanium, chromium, nickel, copper, yttrium, zirconium, molybdenum, silver, tantalum, and tungsten, or an alloy containing any of these metals as its main component can be used for each of the conductors 240a and 240b. In particular, a metal nitride film such as a tantalum nitride film is preferable because it has a barrier property against hydrogen or oxygen and has a high oxidation resistance.

Although a single-layer structure is shown in FIGS. 12A to 12C, a stacked-layer structure of two or more layers may be used. For example, a tantalum nitride film and a tungsten film may be stacked. Alternatively, a titanium film and an aluminum film may be stacked. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

The conductor 260 functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. In particular, a metal nitride film such as a tantalum nitride film is preferable because it has a barrier property against hydrogen or oxygen and has a high oxidation resistance. Furthermore, one or both of manganese and zirconium may be used. Alternatively, a semiconductor typified by polycrystalline silicon doped with an impurity element such as phosphorus, or a silicide such as nickel silicide may be used. Although a single-layer structure is shown in FIGS. 12A to 12C, a stacked-layer structure of two or more layers may be used.

A two-layer structure where a titanium film is stacked over an aluminum film may be employed, for example. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. Alternatively, an alloy film or a nitride film that contains aluminum and one or more elements selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure using any of the above-described light-transmitting conductive materials and any of the above-described metals.

Next, the insulator 280 and the insulator 282 are provided over the transistor 200.

The insulator 280 preferably includes an oxide containing oxygen in excess of that in the stoichiometric composition. That is, in the insulator 280, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided in an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 that covers the transistor 200 may function as a planarization film that covers a roughness thereunder.

The insulator 282 is preferably formed using an insulating film having a barrier property against oxygen or hydrogen, e.g., an aluminum oxide film or a hafnium oxide film. The insulator 282 formed of such a material functions as a layer which prevents release of oxygen from the oxide 230 and entry of an impurity such as hydrogen from the outside.

The above structure makes it possible to provide a transistor including an oxide semiconductor with high on-state current. Alternatively, a transistor including an oxide semiconductor with low off-state current can be provided. Furthermore, when the transistor with the above structure is used in a semiconductor device, variation in the electrical characteristics of the semiconductor device can be reduced, and the reliability thereof can be improved. Alternatively, the power consumption of the semiconductor device can be reduced.

<Transistor Structure 2>

Figure 13A:
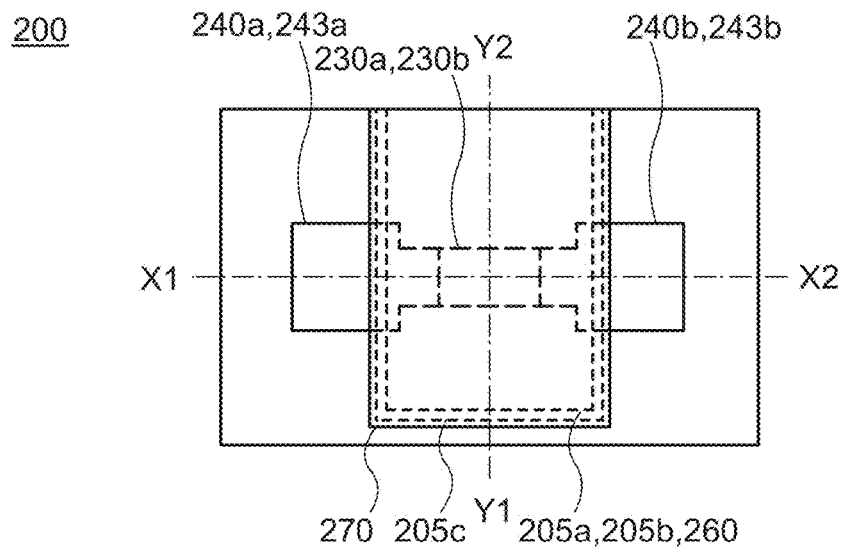
FIGS. 13A to 13C illustrate a top view and a cross-sectional structure of a transistor of one embodiment.
Figure 13B:
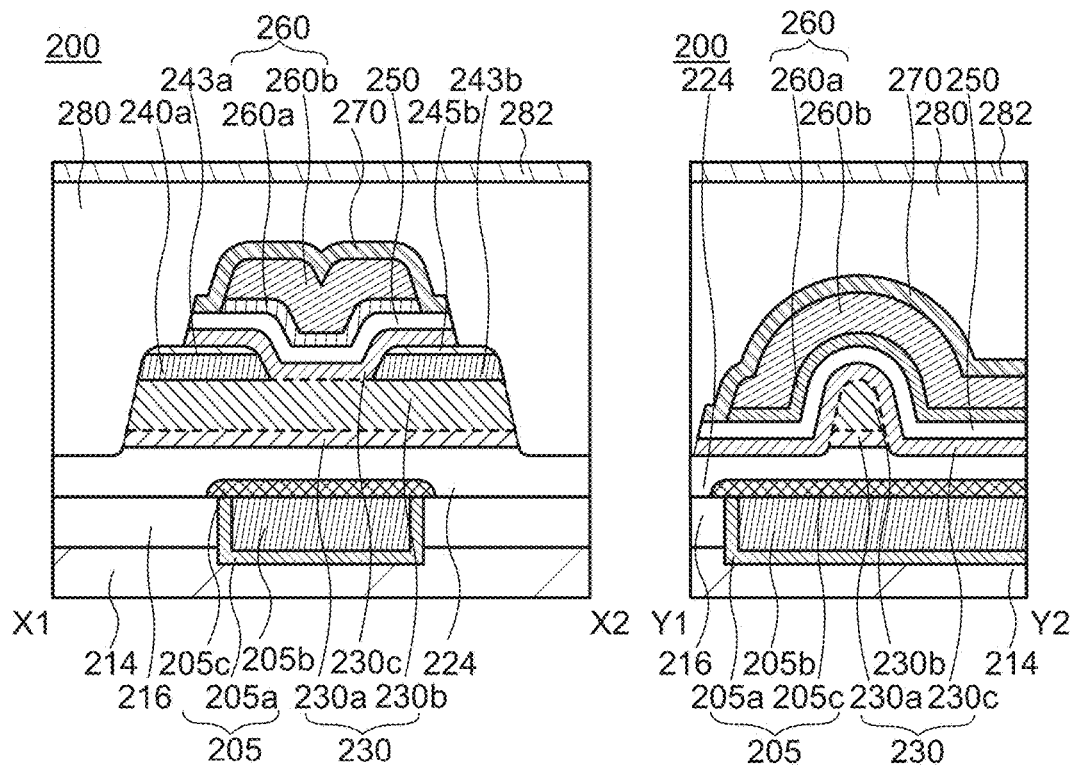
Figure 13C:
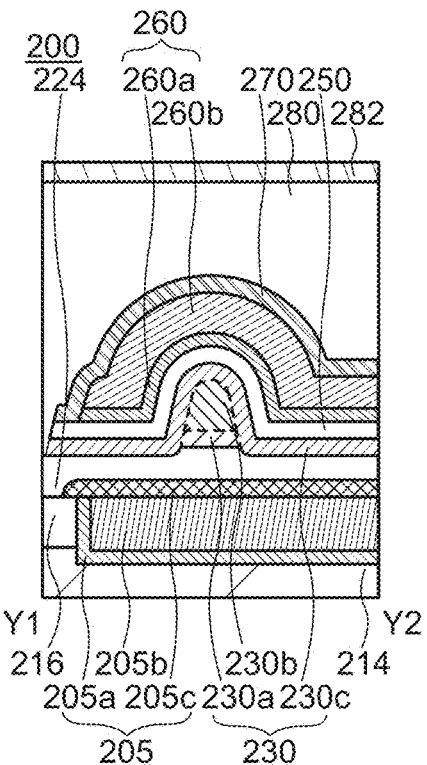

FIGS. 13A to 13C illustrate another example applicable to the transistor 200. FIG. 13A illustrates a top surface of the transistor 200. For simplification of the drawing, some films are not illustrated in FIG. 13A. FIG. 13B is a cross-sectional view taken along the dashed-dotted line X1-X2 in FIG. 13A, and FIG. 13C is a cross-sectional view taken along the dashed-dotted line Y1-Y2 in FIG. 13A.

Note that in the transistor 200 illustrated in FIGS. 13A to 13C, components having the same functions as the components in the transistor 200 in FIGS. 12A to 12C are denoted by the same reference numerals.

In the structure illustrated in FIGS. 13A to 13C, the conductor 260 has a two-layer structure. For example, a conductor 260*a* can be formed using an oxide typified by an In—Ga—Zn oxide. An oxide semiconductor typified by an In—Ga—Zn oxide has an increased carrier density by being supplied with nitrogen or hydrogen. In other words, the oxide semiconductor functions as an oxide conductor (OC). When a metal nitride is provided as a conductor 260*b*, the oxide semiconductor has a higher carrier density and thus, the conductor 260*a* functions as a gate electrode.

An oxide semiconductor typified by an In—Ga—Zn oxide can be used as the conductor 260*a*. The conductor 260*a* can also be formed using a light-transmitting conductive material such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide containing silicon (also referred to as an In—Sn—Si oxide or ITSO).

The use of a metal nitride for the conductor 260*b* produces either of the following effects: the resistance of the conductor 260*a* is reduced by the diffusion of the constituent element (especially, nitrogen) of the metal nitride into the conductor 260*a*; and the resistance is reduced by damage (e.g., sputtering damage) during the deposition of the conductor 260*b*. Note that the conductor 260*b* may have a stacked-layer structure of two or more layers. For example, by stacking a low-resistance metal film over a metal nitride, a transistor driven by a low voltage can be provided.

Furthermore, the conductor 260*a* is preferably formed by a sputtering method in an atmosphere containing an oxygen gas. In the case where the conductor 260*a* is formed in an atmosphere containing an oxygen gas, an excess-oxygen region can be formed in the insulator 250. Note that a method for forming the conductor 260*a* is not limited to a sputtering method, and other methods such as an ALD method may be used.

In the structure illustrated in FIGS. 13A to 13C, an insulator 270 is provided to cover the conductor 260. In the case where the insulator 280 is formed using an oxide material from which oxygen is released, the insulator 270 is formed using a substance having a barrier property against oxygen. With this structure, oxygen vacancies in the conductor 260*a* are filled, which inhibits a reduction in carrier density and prevents oxidation of the conductor 260*b* due to diffused oxygen.

For example, the insulator 270 can be formed using a metal oxide such as aluminum oxide. The insulator 270 is formed to a thickness with which the oxidation of the conductor 260 is prevented.

As shown in the drawings, a structure may be employed in which the insulator 220 and the insulator 222 are not provided and the conductor 205*c* is provided using a conductor with a barrier property. With this structure, even when the insulator 224 includes an excess-oxygen region, the conductor 205*b* can be inhibited from reacting with oxygen of the excess-oxygen region and from generating an oxide.

Furthermore, an insulator 243*a* and an insulator 243*b* may be provided over the conductor 240*a* and the conductor 240*b*. The insulator 243*a* and the insulator 243*b* are formed using a substance having a barrier property against oxygen. With this structure, the conductor 240*a* and the conductor 240*b* can be inhibited from being oxidized when the oxide 230*c* is deposited. Oxygen of the excess-oxygen region in the insulator 280 can be prevented from reacting with the conductor 240*a* and the conductor 240*b* and from oxidizing them.

The insulator 243*a* and the insulator 243*b* can be formed using a metal oxide, for example. In particular, an insulating film having a barrier property against oxygen or hydrogen, e.g., an aluminum oxide film, a hafnium oxide film, or a gallium oxide film, is preferably used. Alternatively, silicon nitride deposited by a CVD method may be used.

Accordingly, the above structure allows expansion of the range of choices for the materials for the conductor 240*a*, the conductor 240*b*, the conductor 205, and the conductor 260. For example, the conductor 205*b* and the conductor 260*b* can be formed using a material with a low oxidation resistance and high conductivity, e.g., aluminum. Furthermore, a conductor that can be easily deposited or processed can be used, for example.

In addition, the oxidation of the conductor 205 and the conductor 260 can be prevented, and oxygen released from the insulator 224 and the insulator 280 can be supplied to the oxide 230 efficiently. Furthermore, a conductor that has high conductivity is used for the conductor 205 and the conductor 260, whereby the transistor 200 with low power consumption can be provided.

<Transistor Structure 3>

FIGS. 14A to 14C illustrate another example applicable to the transistor 200. FIG. 14A illustrates a top surface of the transistor 200. For simplification of the drawing, some films are not illustrated in FIG. 14A. FIG. 14B is a cross-sectional view taken along the dashed-dotted line X1-X2 in FIG. 14A, and FIG. 14C is a cross-sectional view taken along the dashed-dotted line Y1-Y2 in FIG. 14A.

Note that in the transistor 200 illustrated in FIGS. 14A to 14C, components having the same functions as the components in the transistor 200 in FIGS. 12A to 12C are denoted by the same reference numerals.

In the structure illustrated in FIGS. 14A to 14C, the conductor 260 has a two-layer structure. In the two-layer structure, layers formed using the same material may be stacked. For example, the conductor 260a is formed by a thermal CVD method, an MOCVD method, or an ALD method. In particular, the conductor 260a is preferably formed by an ALD method. By employing an ALD method or the like, damage to the insulator 250 at the time of the deposition can be reduced. In addition, by employing an ALD method or the like, the conductor 260a capable of providing high step coverage can be deposited. Thus, the transistor 200 having high reliability can be provided.

Next, the conductor 260b is formed by a sputtering method. At that time, since the conductor 260a is provided over the insulator 250, damage caused during deposition of the conductor 260b can be prevented from affecting the insulator 250. Since the deposition rate in a sputtering method is higher than that in an ALD method, the productivity can be improved with a high yield.

In the structure illustrated in FIGS. 14A to 14C, the insulator 270 is provided to cover the conductor 260. In the case where the insulator 280 is formed using an oxide material from which oxygen is released, the insulator 270 is formed using a substance having a barrier property against oxygen. With this structure, oxygen vacancies in the conductor 260a are filled, which inhibits a reduction in carrier density and prevents oxidation of the conductor 260b due to diffused oxygen.

For example, the insulator 270 can be formed using a metal oxide such as aluminum oxide. The insulator 270 is formed to a thickness with which the oxidation of the conductor 260 is prevented.

<Transistor Structure 4>

FIGS. 15A to 15C illustrate another example applicable to the transistor 200. FIG. 15A illustrates a top surface of the transistor 200. For simplification of the drawing, some films are not illustrated in FIG. 15A. FIG. 15B is a cross-sectional view taken along the dashed-dotted line X1-X2 in FIG. 15A, and FIG. 15C is a cross-sectional view taken along the dashed-dotted line Y1-Y2 in FIG. 15A.

Note that in the transistor 200 illustrated in FIGS. 15A to 15C, components having the same functions as the components in the transistor 200 in FIGS. 12A to 12C are denoted by the same reference numerals.

In the structure shown in FIGS. 15A to 15C, the conductor 260 functioning as a gate electrode includes the conductor 260a, the conductor 260b, and a conductor 260c. The oxide 230c may be cut over the insulator 224 as long as the oxide 230c covers a side surface of the oxide 230b.

In the structure illustrated in FIGS. 15A to 15C, the conductor 260 has a three-layer structure. The conductor 260 may have a single-layer structure, a two-layer structure, or a stacked-layer structure of four or more layers. Note that in the case of the two-layer structure, layers formed using the same material may be stacked. For example, the conductor 260a is formed by a thermal CVD method, an MOCVD method, or an ALD method. In particular, the conductor 260a is preferably formed by an ALD method. By employing an ALD method or the like, damage to the insulator 250 at the time of the deposition can be reduced. In addition, by employing an ALD method or the like, the conductor 260a capable of providing high step coverage can be deposited. Thus, the transistor 200 having high reliability can be provided.

Next, the conductor 260b is formed by a sputtering method. At that time, since the conductor 260a is provided over the insulator 250, damage caused during deposition of the conductor 260b can be prevented from affecting the insulator 250. Since the deposition rate in a sputtering method is higher than that in an ALD method, the productivity can be improved with a high yield.

The conductor 260b is formed using a material having high conductivity such as tantalum, tungsten, copper, or aluminum. The conductor 260c formed over the conductor 260b is preferably formed using a conductor with a high oxidation resistance, such as tungsten nitride.

For example, when the insulator 280 is formed using an oxide material from which oxygen is released, the use of a conductor with a high oxidation resistance for the conductor 260c, which is in contact with the insulator 280 having an excess-oxygen region in a large area, can inhibit oxygen released from the excess-oxygen region from being absorbed by the conductor 260. In addition, the oxidation of the conductor 260 can be prevented, and oxygen released from the insulator 280 can be supplied to the oxide 230 efficiently. Furthermore, a conductor that has high conductivity is used for the conductor 260b, whereby the transistor 200 with low power consumption can be provided.

As illustrated in FIG. 15C, the oxide 230b is covered with the conductor 260 in the channel width direction of the transistor 200. The insulator 224 has a projection, whereby the side surface of the oxide 230b is also covered with the conductor 260. For example, the bottom surface of the conductor 260 in a region where the insulator 224 and the oxide 230c are in contact with each other is preferably positioned closer to the substrate than the bottom surface of the oxide 230b by adjusting the shape of the projection of the insulator 224. In other words, the transistor 200 has a structure where the oxide 230b can be electrically surrounded by an electric field of the conductor 260. A structure where the oxide 230b is electrically surrounded by the electric field of the conductor is referred to as a surrounded channel (s-channel) structure. In the transistor 200 with an s-channel structure, the channel can be formed in the whole oxide 230b (bulk). In the s-channel structure, the drain current of the transistor can be increased, so that a larger amount of on-state current (current which flows between the source and the drain when the transistor is turned on) can be obtained. Furthermore, the entire channel formation region of the oxide 230b can be depleted by the electric field of the conductor 260. Accordingly, the off-state current of the s-channel transistor can be further reduced. When the channel width is shortened, the effects of the s-channel structure, such as an increase in on-state current and a reduction in off-state current, can be enhanced.

<Transistor Structure 5>

FIGS. 16A to 16C illustrate another example applicable to the transistor 200. FIG. 16A illustrates a top surface of the transistor 200. For simplification of the drawing, some films are not illustrated in FIG. 16A. FIG. 16B is a cross-sectional view taken along the dashed-dotted line X1-X2 in FIG. 16A, and FIG. 16C is a cross-sectional view taken along the dashed-dotted line Y1-Y2 in FIG. 16A.

Note that in the transistor 200 illustrated in FIGS. 16A to 16C, components having the same functions as the components in the transistor 200 in FIGS. 12A to 12C are denoted by the same reference numerals.

In the structure illustrated in FIGS. 16A to 16C, the conductors functioning as the source and the drain each have a stacked-layered structure. It is preferable that a conductor which is highly adhesive to the oxide 230b be used as the conductors 240a and 240b, and a material with high conductivity be used as conductors 241a and 241b. The conductors 240a and 240b are preferably formed by an ALD method. The use of an ALD method or the like can improve the coverage.

For example, when a metal oxide including indium is used as the oxide 230b, titanium nitride or the like may be used as the conductors 240a and 240b. When a material with high conductivity, such as tantalum, tungsten, copper, or aluminum, is used as the conductors 241a and 241b, the transistor 200 with high reliability and low power consumption can be provided.

As illustrated in FIG. 16C, the oxide 230b is covered with the conductor 260 in the channel width direction of the transistor 200. The insulator 222 has a projection, whereby the side surface of the oxide 230b is also covered with the conductor 260.

Here, when a high-k material such as hafnium oxide is used for the insulator 222, the equivalent oxide ($SiO_2$) thickness (EOT) of the insulator 222 can be small because the insulator 222 has a high relative permittivity. Accordingly, the distance between the conductor 205 and the oxide 230 can be increased owing to the physical thickness of the insulator 222, without a reduction in the influence of the electric field which is applied from the conductor 205 to the oxide 230. Thus, the distance between the conductor 205 and the oxide 230 can be adjusted by changing the thickness of the insulator 222.

For example, the bottom surface of the conductor 260 in a region where the insulator 222 and the oxide 230c are in contact with each other is preferably positioned closer to the substrate than the bottom surface of the oxide 230b by adjusting the shape of the projection of the insulator 222. In other words, the transistor 200 has a structure where the oxide 230b can be electrically surrounded by an electric field of the conductor 260. A structure where the oxide 230b is electrically surrounded by the electric field of the conductor is referred to as a surrounded channel (s-channel) structure. In the transistor 200 with an s-channel structure, the channel can be formed in the whole oxide 230b (bulk). In the s-channel structure, the drain current of the transistor can be increased, so that a larger amount of on-state current (current which flows between the source and the drain when the transistor is turned on) can be obtained. Furthermore, the entire channel formation region of the oxide 230b can be depleted by the electric field of the conductor 260. Accordingly, the off-state current of the s-channel transistor can be further reduced. When the channel width is shortened, the effects of the s-channel structure, such as an increase in on-state current and a reduction in off-state current, can be enhanced.

<Transistor Structure 6>

FIGS. 17A to 17C illustrate another example applicable to the transistor 200. FIG. 17A illustrates a top surface of the transistor 200. For simplification of the drawing, some films are not illustrated in FIG. 17A. FIG. 17B is a cross-sectional view taken along the dashed-dotted line X1-X2 in FIG. 17A, and FIG. 17C is a cross-sectional view taken along the dashed-dotted line Y1-Y2 in FIG. 17A.

Note that in the transistor 200 illustrated in FIGS. 17A to 17C, components having the same functions as the components in the transistor 200 in FIGS. 12A to 12C are denoted by the same reference numerals.

In the transistor 200 illustrated in FIGS. 17A to 17C, the oxide 230c, the insulator 250, and the conductor 260 are formed in an opening formed in the insulator 280. Furthermore, one end portion of each of the conductors 240a and 240b is aligned with an end portion of the opening formed in the insulator 280. Furthermore, three end portions of each of the conductors 240a and 240b are aligned with parts of end portions of each of the oxides 230a and 230b. Therefore, the conductors 240a and 240b can be formed concurrently with the oxide 230 or the opening in the insulator 280. Accordingly, the number of masks and steps can be reduced, and yield and productivity can be improved.

The conductor 240a, the conductor 240b, and the oxide 230b are in contact with the insulator 280 having the excess-oxygen region with an oxide 230d positioned therebetween. Thus, the oxide 230d, which is provided between the insulator 280 and the oxide 230b including the region where the channel is formed, can prevent impurities such as hydrogen, water, and halogen from diffusing from the insulator 280 into the oxide 230b.

Since the transistor 200 illustrated in FIGS. 17A to 17C has a structure in which the conductors 240a and 240b hardly overlap with the conductor 260, the parasitic capacitance generated between the conductor 260 and the conductors 240a and 240b can be reduced. Thus, the transistor 200 with a high operation frequency can be provided.

<Transistor Structure 7>

Figure 18A:
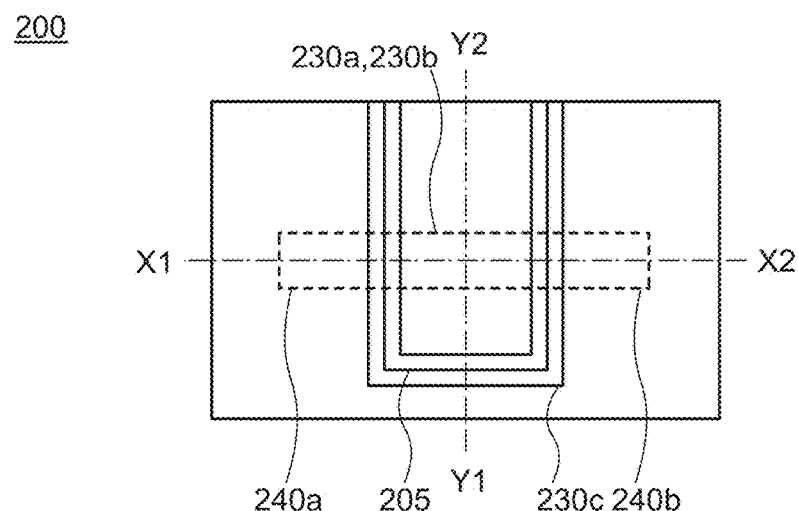
FIGS. 18A to 18C illustrate a top view and a cross-sectional structure of a transistor of one embodiment.
Figures 18B, 18C:
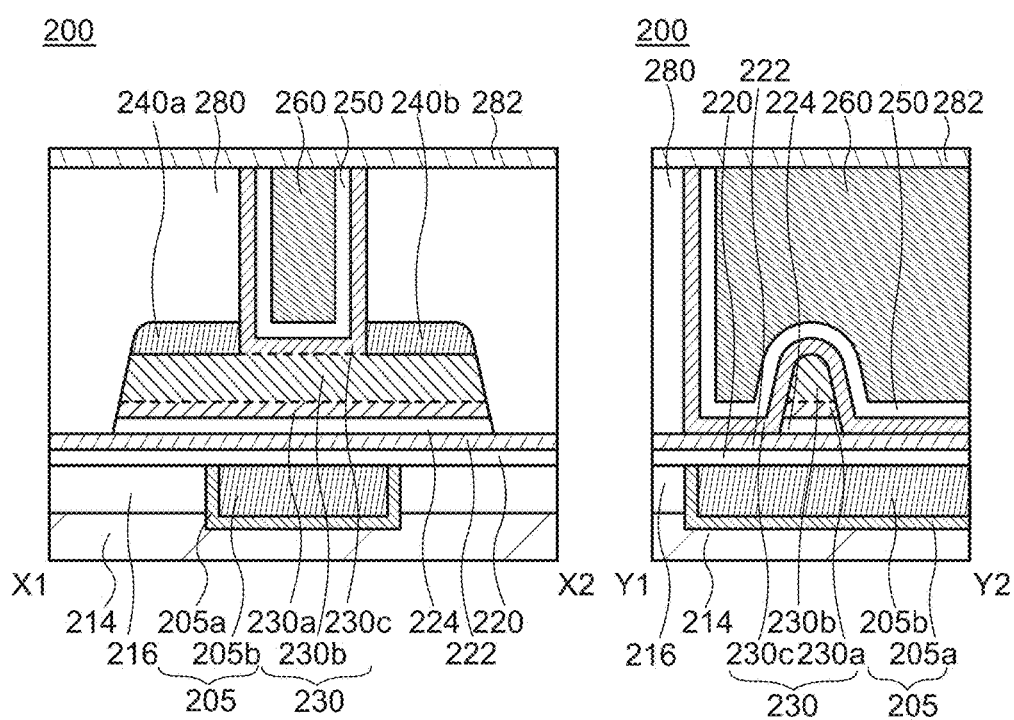

FIGS. 18A to 18C illustrate another example applicable to the transistor 200. FIG. 18A illustrates a top surface of the transistor 200. For simplification of the drawing, some films are not illustrated in FIG. 18A. FIG. 18B is a cross-sectional view taken along the dashed-dotted line X1-X2 in FIG. 18A, and FIG. 18C is a cross-sectional view taken along the dashed-dotted line Y1-Y2 in FIG. 18A.

Note that in the transistor 200 illustrated in FIGS. 18A to 18C, components having the same functions as the components in the transistor 200 in FIGS. 17A to 17C are denoted by the same reference numerals.

The transistor 200 illustrated in FIGS. 18A to 18C does not have the oxide 230d. For example, when the conductor 240a and the conductor 240b are formed using a conductor with a high oxidation resistance, the oxide 230d is not necessarily provided. Accordingly, the number of masks and steps can be reduced, and yield and productivity can be improved.

The insulator 224 may be provided in only the region overlapping with the oxide 230a and the oxide 230b. In that case, the oxide 230a, the oxide 230b, and the insulator 224 can be processed using the insulator 222 as an etching stopper. As a result, yield and productivity can be improved.

Since the transistor 200 illustrated in FIGS. 18A to 18C has a structure in which the conductors 240a and 240b hardly overlap with the conductor 260, the parasitic capacitance generated between the conductor 260 and the conductors 240a and 240b can be reduced. Thus, the transistor 200 with a high operation frequency can be provided.

<Method for Manufacturing Transistor>

An example of a method for manufacturing the transistor illustrated in FIGS. 12A to 12C is described below with reference to FIGS. 19A to 19E, FIGS. 20A to 20D, FIGS. 21A to 21C, and FIGS. 22A to 22C.

First, a substrate is prepared (not illustrated). Although there is no particular limitation on the substrate, it preferably has heat resistance high enough to withstand heat treatment performed later. For example, a glass substrate of barium borosilicate glass, aluminoborosilicate glass, or the like, a ceramic substrate, a quartz substrate, or a sapphire substrate can be used. Alternatively, a single crystal semiconductor substrate or a polycrystalline semiconductor substrate of silicon, silicon carbide, or the like; a compound semiconductor substrate of silicon germanium, gallium arsenide, indium arsenide, or indium gallium arsenide; a silicon-on-insulator (SOI) substrate; a germanium-on-insulator (GOI) substrate; or the like can be used. Further alternatively, any of these substrates provided with a semiconductor element may be used as the substrate.

Further alternatively, a flexible substrate may be used as the substrate to manufacture the semiconductor device. To manufacture a flexible semiconductor device, a transistor may be directly formed over a flexible substrate; alternatively, a transistor may be formed over a manufacturing substrate and then separated from the manufacturing substrate and transferred to a flexible substrate. In order that the transistor be separated from the manufacturing substrate to be transferred to the flexible substrate, it is preferable to provide a separation layer between the manufacturing substrate and the transistor including an oxide semiconductor.

Figure 19A:
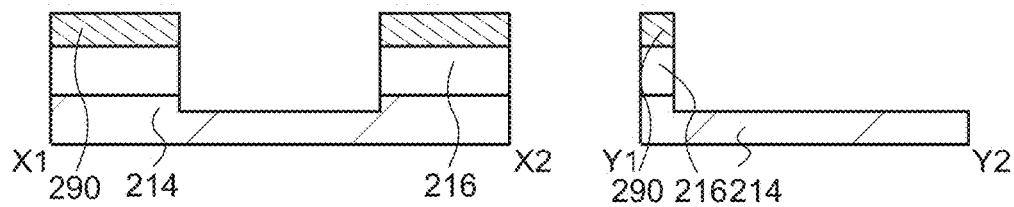
FIGS. 19A to 19E illustrate an example of a method for manufacturing a transistor of one embodiment.

Next, an insulator 214 and an insulator 216 are formed. Then, a resist mask 290 is formed over the insulator 216 by a lithography process or the like to remove unnecessary portions of the insulators 214 and 216 (FIG. 19A). After that, the resist mask 290 is removed; thus, an opening can be formed.

Here, a method for processing a film is described. To process a film finely, a variety of fine processing techniques can be used. For example, it is possible to use a method in which a resist mask formed by a lithography process or the like is subjected to slimming treatment.

Alternatively, a dummy pattern is formed by a lithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning with a beam such as an electron beam, a photomask is not needed.

An organic resin film having a function of improving the adhesion between a film and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film preventing reflection of light for the exposure is preferably used for the organic resin film. Examples of the organic resin film having such a function include a bottom anti-reflection coating (BARC) film. The organic resin film may be removed at the same time as the removal of the resist mask or after the removal of the resist mask.

Figure 19B:
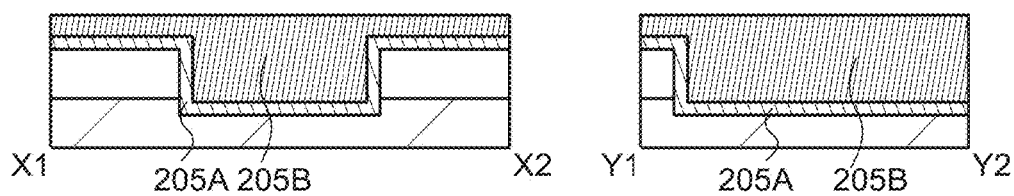

Next, a conductor 205A and a conductor 205B are deposited over the insulator 214 and the insulator 216. The conductor 205A and the conductor 205B can be deposited by, for example, a sputtering method, an evaporation method, or a CVD method (including a thermal CVD method, an MOCVD method, a PECVD method, and the like). It is preferable to use a thermal CVD method, an MOCVD method, or an ALD method in order to reduce plasma damage (FIG. 19B).

Figure 19C:
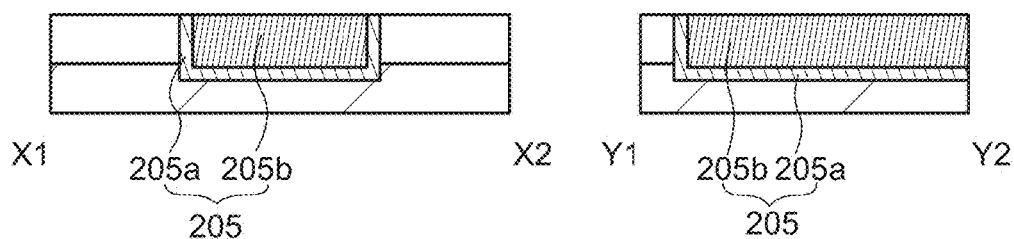

Then, unnecessary portions of the conductors 205A and 205B are removed. For example, part of the conductor 205A and part of the conductor 205B are removed by etch-back process, a chemical mechanical polishing (CMP) process, or the like until the insulator 216 is exposed, whereby the conductor 205 is formed (FIG. 19C). At that time, the insulator 216 can be used as a stopper layer, and the thickness of the insulator 216 is reduced in some cases.

The CMP process is a process for planarizing a surface of an object to be processed by a combination of chemical and mechanical actions. More specifically, the CMP process is a process in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing between the object to be processed and the polishing cloth.

Note that the CMP process may be performed only once or a plurality of times. When the CMP process is performed a plurality of times, it is preferable that first polishing be performed at a high polishing rate and final polishing be performed at a low polishing rate. In this manner, polishing processes using different polishing rates may be used in combination.

Figure 19D:
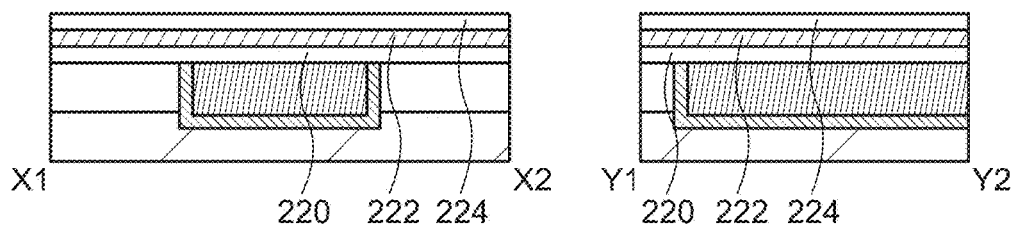
Figure 19E:
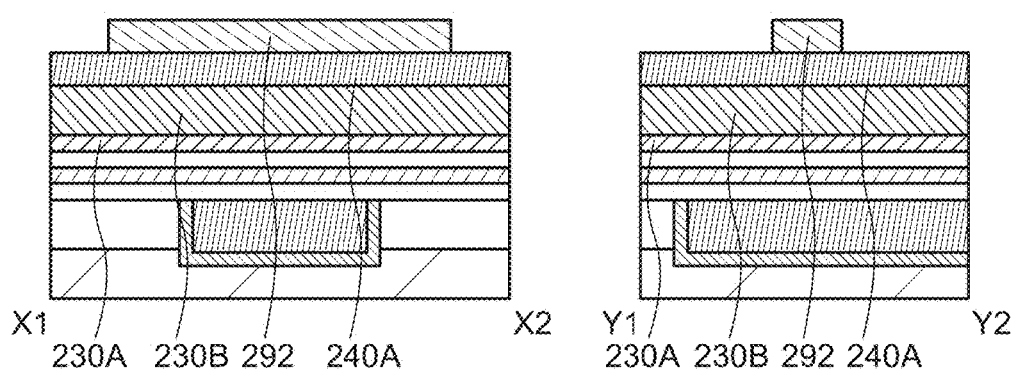

Then, the insulator 220, the insulator 222, and the insulator 224 are formed (FIG. 19D).

Note that the insulator 220 and the insulator 222 are not necessarily provided. For example, when the insulator 224 has an excess-oxygen region, a conductor with a barrier property may be formed over the conductor 205. The conductor with a barrier property can inhibit the conductor 205 from reacting with oxygen in the excess-oxygen region and from generating an oxide.

The insulators 220, 222, and 224 can each be formed using, for example, silicon oxide, silicon oxynitride, silicon nitride oxide, silicon nitride, aluminum oxide, aluminum oxynitride, aluminum nitride oxide, aluminum nitride, or the like. It is particularly preferable to use a high-k material such as hafnium oxide as the insulator 222.

The insulators 220, 222, and 224 can be formed using a sputtering method, a chemical vapor deposition (CVD) method (including a thermal CVD method, a metal organic CVD (MOCVD) method, a plasma-enhanced CVD (PECVD) method, and the like), a molecular beam epitaxy (MBE) method, an atomic layer deposition (ALD) method, a pulsed laser deposition (PLD) method, or the like. In particular, it is preferable that the insulators be deposited by a CVD method, further preferably an ALD method or the like, because coverage can be further improved. It is preferable to use a thermal CVD method, an MOCVD method, or an ALD method in order to reduce plasma damage. The insulators can also be formed using a silicon oxide film capable of providing high step coverage that is formed by reacting tetraethyl orthosilicate (TEOS), silane, or the like with oxygen, nitrous oxide, or the like.

Note that the insulators 220, 222, and 224 are preferably deposited successively. By successive deposition, impurities do not attach to the interfaces between the insulators 220 and 222 and between the insulators 222 and 224, resulting in high reliability of the insulators.

Then, an oxide 230A to be the oxide 230*a* and an oxide 230B to be the oxide 230*b* are sequentially deposited. The oxides are preferably deposited successively without exposure to the air.

Then, a conductive film 240A to be the conductors 240*a* and 240*b* is formed over the oxide 230A. As the conductive film 240A, a material which has a barrier property against hydrogen or oxygen and has a high oxidation resistance is preferably used. Although the conductive film 240A has a single-layer structure in the drawing, it may have a structure of two or more stacked layers. Then, a resist mask 292 is formed by a method similar to that described above (FIG. 19E).

Figure 20A:
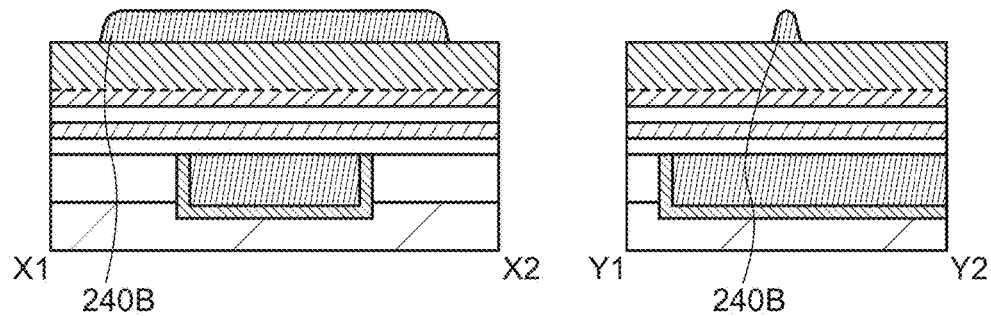
FIGS. 20A to 20D illustrate an example of a method for manufacturing a transistor of one embodiment.

An unnecessary portion of the conductive film 240A is removed by etching using the resist mask 292 to form a conductive layer 240B having an island shape (FIG. 20A). After that, unnecessary portions of the oxides 230A and 230B are removed by etching using the conductive layer 240B as a mask.

At that time, the insulator 224 may also be processed into an island-shape. For example, even when the total thickness of the insulators 220, 222, and 224 is small, the use of the insulator 222 with a barrier property as an etching stopper film can prevent over-etching of the wiring layer positioned below the insulators. In addition, when the total thickness of the insulators 220, 222, and 224 is small, a voltage is efficiently applied from the conductor 205; therefore, the transistor with low power consumption can be obtained.

Figure 20B:
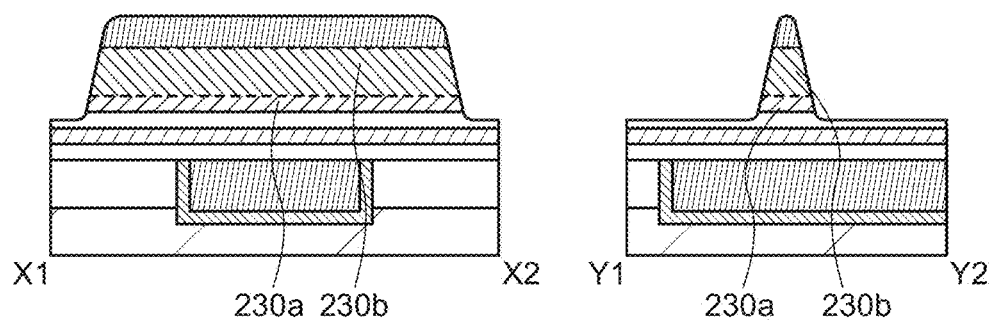

Then, the resist mask is removed. Thus, a stacked-layer structure of the island-shaped oxide 230*a*, the island-shaped oxide 230*b*, and the island-shaped conductive layer 240B can be formed (FIG. 20B).

Figure 20C:
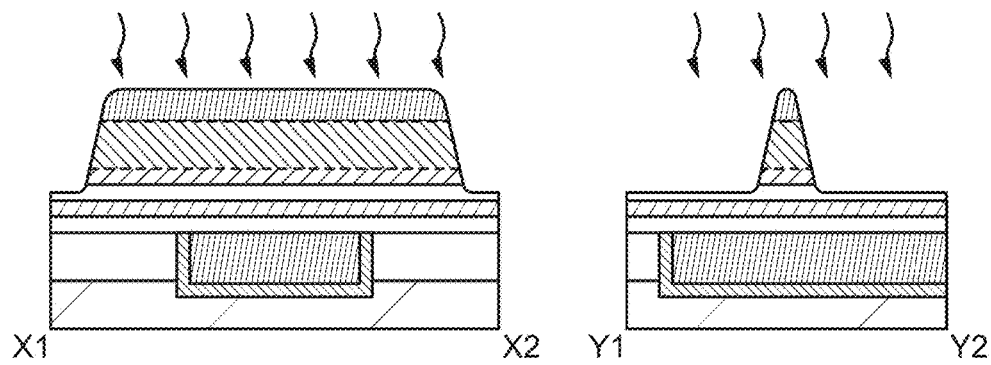
Figure 20D:
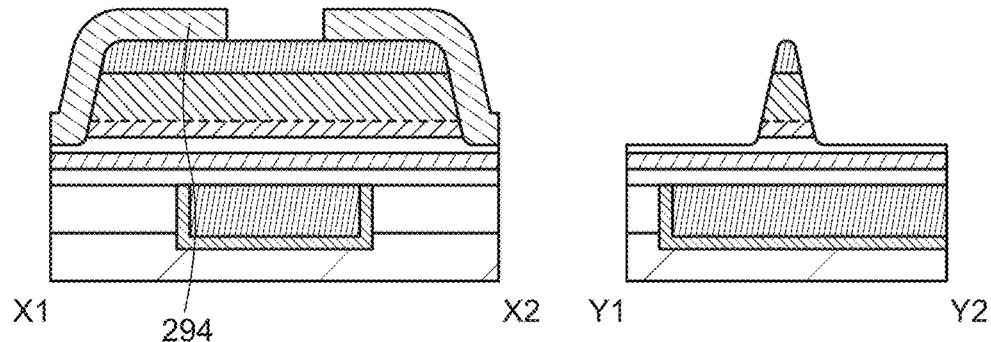

Next, heat treatment is preferably performed (arrows in FIG. 20C denote the heat treatment). The heat treatment may be performed at a temperature higher than or equal to 250° C. and lower than or equal to 400° C., preferably higher than or equal to 320° C. and lower than or equal to 380° C., in an inert gas atmosphere, in an atmosphere containing an oxidizing gas at 10 ppm or more, or under reduced pressure. Alternatively, the heat treatment may be performed in such a manner that heat treatment is performed in an inert gas atmosphere, and then another heat treatment is performed in an atmosphere containing an oxidization gas at 10 ppm or more, in order to compensate for released oxygen. The heat treatment can remove hydrogen that is an impurity for the oxides 230*a* and 230*b*. In addition, oxygen is supplied from the insulator formed below the oxide 230*a* to the oxides 230*a* and 230*b*, so that oxygen vacancies in the oxides can be reduced.

Figure 21A:
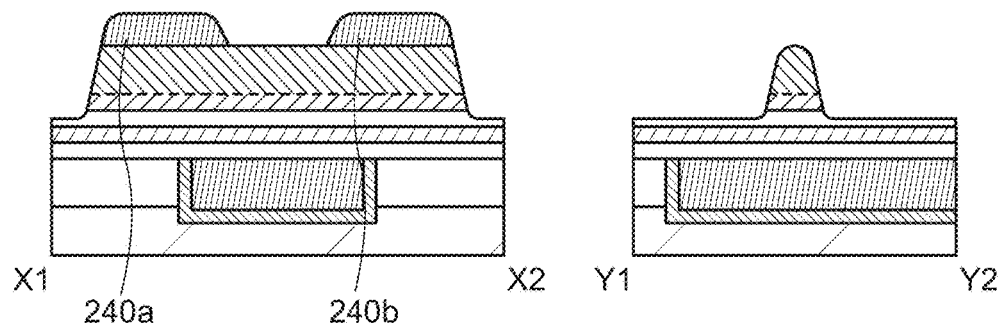
FIGS. 21A to 21C illustrate an example of a method for manufacturing a transistor of one embodiment.
Figure 21B:
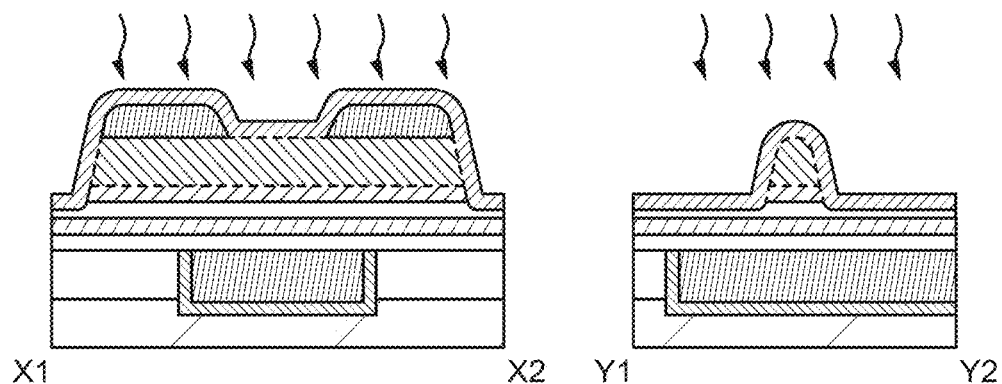
Figure 21C:
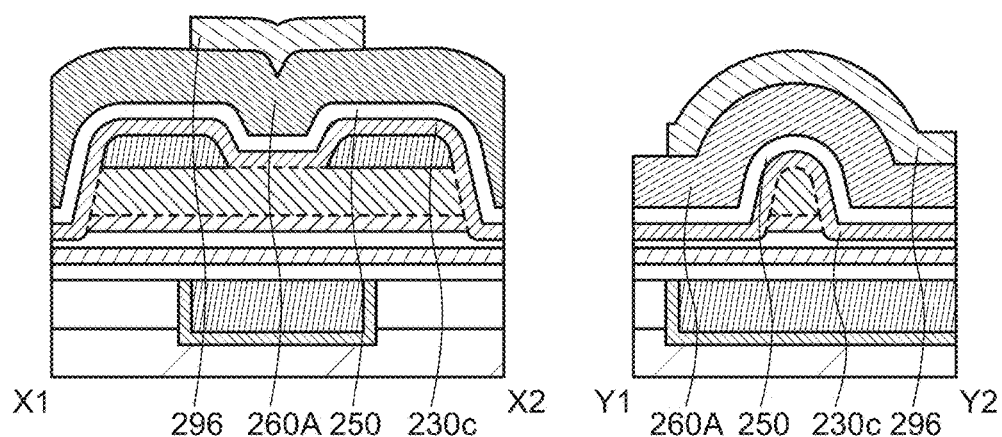

Next, a resist mask 294 is formed over the island-shaped conductive layer 240B by a method similar to that described above (FIG. 20D). Then, an unnecessary portion of the conductive layer 240B is removed by etching, and then the resist mask 294 is removed, whereby the conductor 240*a* and the conductor 240*b* are formed (FIG. 21A). At that time, part of the insulator 222 or the insulator 224 may be thinned by etching to obtain an s-channel structure.

Here, heat treatment may be performed. The heat treatment may be performed under the conditions similar to those of the heat treatment described with reference to FIG. 20C. The heat treatment can remove hydrogen that is an impurity for the oxides 230*a* and 230*b*. In addition, oxygen can be supplied from the insulator formed below the oxide 230*a* to the oxides 230*a* and 230*b*, so that oxygen vacancies in the oxides can be reduced. In the case where the heat treatment is performed using an oxidizing gas, an oxidizing gas is in direct contact with the region where the channel is formed, whereby oxygen vacancies included in the region where the channel is formed can be reduced efficiently.

Next, the oxide 230*c* is deposited. Here, heat treatment may be performed (the arrows in FIG. 21B denote the heat treatment). The heat treatment may be performed under the conditions similar to those of the heat treatment described with reference to FIG. 21C. The heat treatment can remove hydrogen that is an impurity for the oxides 230*a* and 230*b*. In addition, oxygen can be supplied from the insulator formed below the oxide 230*a* to the oxides 230*a* and 230*b*, so that oxygen vacancies in the oxides can be reduced. In the case where the heat treatment is performed using an oxidizing gas, an oxidizing gas is in direct contact with the region where the channel is formed, whereby oxygen vacancies included in the region where the channel is formed can be reduced efficiently.

The insulator 250 and a conductive film 260A to be the conductor 260 are sequentially deposited. As the conductive film 260A, a material which has a barrier property against hydrogen or oxygen and has a high oxidation resistance is preferably used. Although the conductive film 260A has a single-layer structure in the drawing, it may have a structure of two or more stacked layers.

For example, the stacked two layers may be formed of the same material. A first conductive film is formed by a thermal CVD method, an MOCVD method, or an ALD method, for example. In particular, an ALD method is preferably used. By employing an ALD method or the like, damage to the insulator 250 at the time of the deposition can be reduced. In addition, by employing an ALD method or the like, the conductive film 260A capable of providing high step coverage can be deposited. Thus, the transistor 200 having high reliability can be provided.

Then, a second conductive film is formed by a sputtering method. At that time, since the first conductive film is provided over the insulator 250, damage caused during deposition of the second conductive film can be prevented from affecting the insulator 250. Since the deposition rate in a sputtering method is higher than that in an ALD method, the productivity can be improved with a high yield. Note that it is preferable to use a deposition gas which does not contain chlorine in deposition of the conductive film 260A.

Figure 22A:
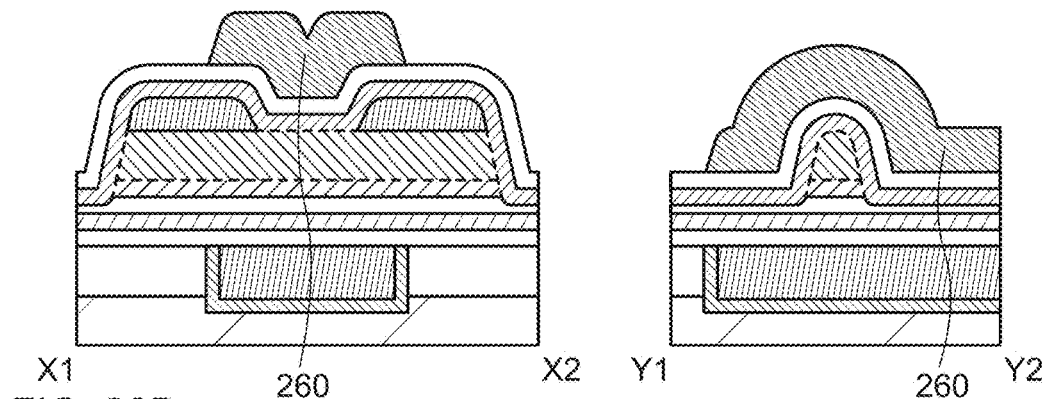
FIGS. 22A to 22C illustrate an example of a method for manufacturing a transistor of one embodiment.

Next, a resist mask 296 is formed over the conductive film 260A by a method similar to that described above (FIG. 21C). Then, an unnecessary portion of the conductive film 260A is removed by etching to form the conductor 260. After that, the resist mask 296 is removed (FIG. 22A).

Subsequently, the insulator 280 is formed over the conductor 260. The insulator 280 is an insulator containing oxygen, such as a silicon oxide film or a silicon oxynitride film. As the insulator containing excess oxygen, a silicon oxide film or a silicon oxynitride film containing a large amount of oxygen can be formed by a CVD method or a sputtering method under the conditions that are set as appropriate. After the silicon oxide film or the silicon oxynitride film is formed, oxygen may be added by an ion implantation method, an ion doping method, or plasma treatment.

Figure 22B:
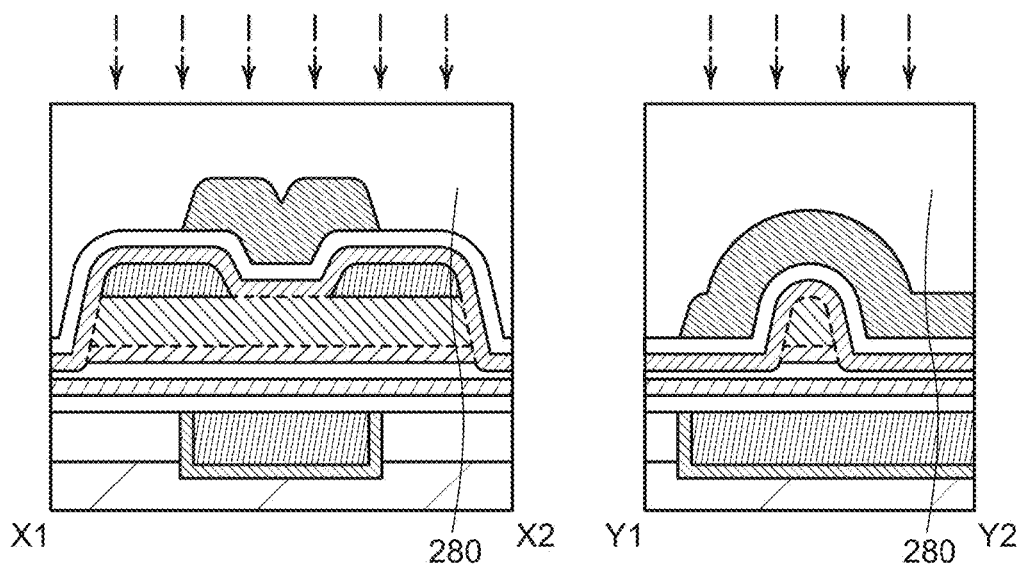

In particular, oxygen plasma treatment is preferably performed (arrows in FIG. 22B denote the plasma treatment). In typical oxygen plasma treatment, the surface of an oxide semiconductor is processed by radicals generated from an oxygen gas by glow discharge plasma. However, as a gas from which plasma is generated, a mixed gas of an oxygen gas and a rare gas may be used, as well as oxygen. For example, oxygen plasma treatment may be performed at a temperature higher than or equal to 250° C. and lower than or equal to 400° C., preferably higher than or equal to 300° C. and lower than or equal to 400° C., in an atmosphere containing an oxidizing gas or under reduced pressure.

The oxygen plasma treatment dehydrates or dehydrogenates the insulator 280 and the oxide 230 and introduces excess oxygen to the insulator 280; as a result, an excess-oxygen region can be formed. In addition, oxygen vacancies are generated in the dehydrated or dehydrogenated oxide 230 and the resistance of the oxide 230 is reduced. Meanwhile, the excess oxygen of the insulator 280 fills oxygen vacancies of the oxide 230. Therefore, owing to the oxygen plasma treatment, hydrogen and water that serve as impurities can be removed from the insulator 280 while an excess-oxygen region is formed in the insulator 280. In addition, hydrogen and water that serve as impurities can be removed from the oxide 230 while oxygen vacancies in the oxide 230 are filled. Thus, the electrical characteristics of the transistor 200 can be improved and variation in the electrical characteristics thereof can be reduced.

Figure 22C:
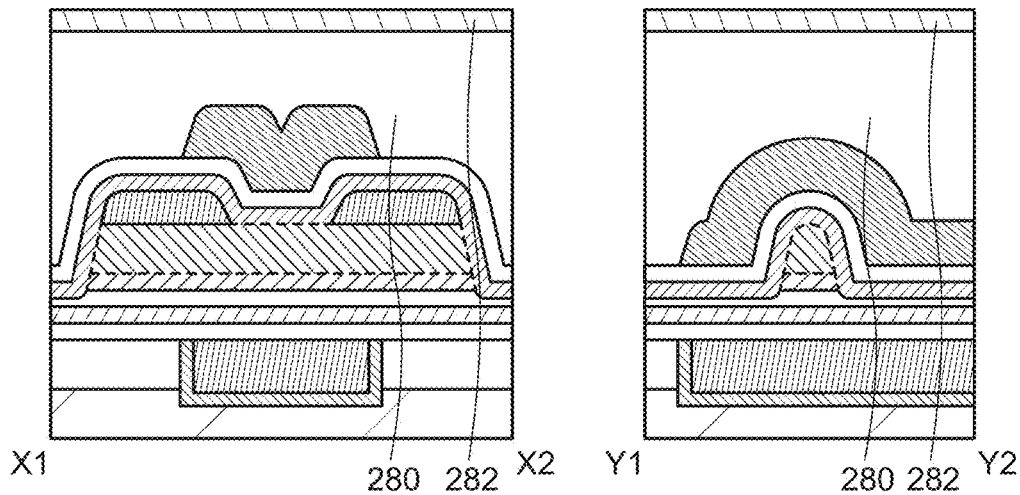

Then, the insulator 282 is formed over the insulator 280 (FIG. 22C). The insulator 282 is preferably formed with a sputtering apparatus. By using a sputtering method, an excess-oxygen region can be formed easily in the insulator 280 positioned under the insulator 282.

During deposition by a sputtering method, ions and sputtered particles exist between a target and a substrate. For example, a potential $E_0$ is supplied to the target, to which a power source is connected. A potential $E_1$ such as a ground potential is supplied to the substrate. Note that the substrate may be electrically floating. In addition, there is a region at a potential $E_2$ between the target and the substrate. The potential relationship is $E_2>E_1>E_0$.

The ions in plasma are accelerated by a potential difference $(E_2-E_0)$ and collide with the target; accordingly, sputtered particles are ejected from the target. These sputtered particles attach to a deposition surface and deposited thereover; as a result, a film is formed. Some ions recoil by the target and might be taken, as recoil ions, into the insulator 280 positioned below the formed film, through the formed film. The ions in the plasma are accelerated by a potential difference $(E_2-E_1)$ and collide with the deposition surface. At that time, some ions reach the inside of the insulator 280. The ions are taken into the insulator 280; accordingly, a region into which the ions are taken is formed in the insulator 280. That is, an excess-oxygen region is formed in the insulator 280 in the case where the ions include oxygen.

Introduction of excess oxygen to the insulator 280 can form an excess-oxygen region. The excess oxygen in the insulator 280 is supplied to the oxide 230 and can fill oxygen vacancies in the oxide 230. Here, in the case where a conductor with a high oxidation resistance is used as each of the conductors 240a and 240b and the conductor 260 in contact with the insulator 280, excess oxygen in the insulator 280 is not absorbed by the conductor 260 and the conductors 240a and 240b but can be efficiently supplied to the oxide 230. Thus, the electrical characteristics of the transistor 200 can be improved and variation in the electrical characteristics thereof can be reduced.

Through the above steps, the transistor 200 of one embodiment of the present invention can be manufactured.

The structures, the methods, and the like described in this embodiment can be combined as appropriate with any of the structures, the methods, and the like described in the other embodiments and examples.

(Embodiment 4)

In this embodiment, one embodiment of a semiconductor device is described with reference to FIGS. 23 to 28, FIGS. 29A and 29B, FIGS. 30A and 30B, FIGS. 31A and 31B, FIGS. 32A and 32B, and FIG. 33.

[Structure Example]

Figure 30A:
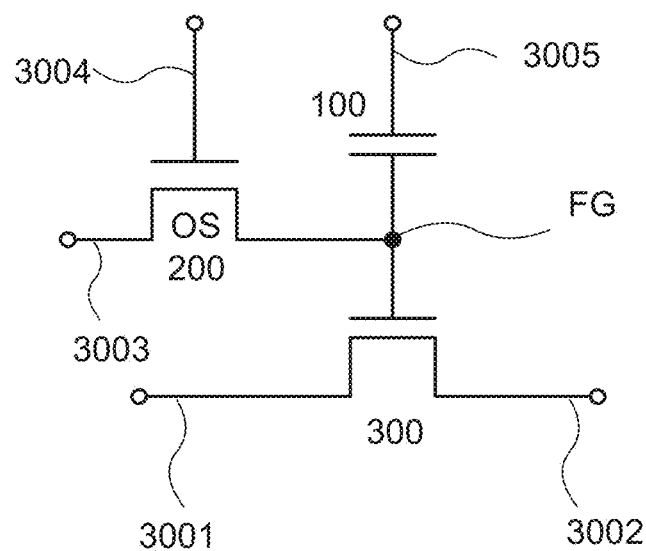
FIGS. 30A and 30B are circuit diagrams of semiconductor devices of one embodiment.

Examples of a semiconductor device (a memory device) of one embodiment of the present invention are shown in FIGS. 23 to 28, FIGS. 29A and 29B, and FIGS. 30A and 30B. Note that FIG. 30A is a circuit diagram of FIGS. 23 to 26. FIGS. 29A and 29B show end portions of regions where semiconductor devices shown in FIGS. 23 to 26 are formed.

<Circuit Configuration of Semiconductor Device>

Semiconductor devices shown in FIG. 30A and FIGS. 23 to 28 each include a transistor 300, a transistor 200, and a capacitor 100.

The transistor 200 is a transistor in which a channel is formed in a semiconductor layer including an oxide semiconductor. Since the off-state current of the transistor 200 is low, by using the transistor 200 in a semiconductor device (a memory device), stored data can be retained for a long time. In other words, such a semiconductor device (a memory device) does not require refresh operation or has an extremely low frequency of the refresh operation, which leads to a sufficient reduction in power consumption.

In FIG. 30A, a wiring 3001 is electrically connected to a source of the transistor 300. A wiring 3002 is electrically connected to a drain of the transistor 300. A wiring 3003 is electrically connected to one of a source and a drain of the transistor 200. A wiring 3004 is electrically connected to a gate of the transistor 200. A gate of the transistor 300 and the other of the source and the drain of the transistor 200 are electrically connected to one electrode of the capacitor 100. A wiring 3005 is electrically connected to the other electrode of the capacitor 100.

The semiconductor device in FIG. 30A has a feature that the potential of the gate of the transistor 300 can be retained, and thus enables writing, retaining, and reading of data as follows.

Writing and retaining of data will be described. First, the potential of the wiring 3004 is set to a potential at which the transistor 200 is turned on, so that the transistor 200 is turned on. Accordingly, the potential of the wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the wiring 3004 is set to a potential at which the transistor 200 is turned off, so that the transistor 200 is turned off. Thus, the charge is retained at the node FG (retaining).

In the case where the off-state current of the transistor 200 is low, the charge of the node FG is retained for a long time.

Next, reading of data is described. An appropriate potential (a reading potential) is supplied to the wiring 3005 while a predetermined potential (a constant potential) is supplied to the wiring 3001, whereby the potential of the wiring 3002 varies depending on the amount of charge retained in the node FG. This is because in the case of using an n-channel transistor as the transistor 300, an apparent threshold voltage $V_{th\_H}$ at the time when the high-level charge is given to the gate of the transistor 300 is lower than an apparent threshold voltage $V_{th\_L}$ at the time when the low-level charge is given to the gate of the transistor 300. Here, an apparent threshold voltage refers to the potential of the wiring 3005 which is needed to make the transistor 300 be in "on state." Thus, the potential of the wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the wiring 3005 is $V_0$ ($>V_{th\_H}$), the transistor 300 is brought into "on state." On the other hand, in the case where the low-level charge is supplied to the node FG in writing, even when the potential of the wiring 3005 is $V_0(<V_{th\_L})$, the transistor 300 remains in "off state." Thus, the data retained in the node FG can be read by determining the potential of the wiring 3002.

By arranging semiconductor devices each having the structure illustrated in FIG. 30A in a matrix, a memory device (a memory cell array) can be formed.

Note that in the case where memory cells are arrayed, it is necessary that data of a desired memory cell is read in read operation. For example, when a p-channel transistor is used as the transistor 300, the memory cell has a NOR-type structure. Thus, only data of a desired memory cell can be read by supplying a potential at which the transistor 300 is in "off state" regardless of the charge supplied to the node FG, that is, a potential lower than $V_{th\_H}$ to the wiring 3005 of memory cells from which data is not read. Alternatively, when an n-channel transistor is used as the transistor 300, the memory cell has a NAND-type structure. Thus, only data of a desired memory cell can be read by supplying a potential at which the transistor 300 is in "on state" regardless of the charge supplied to the node FG, that is, a potential higher than $V_{th\_L}$ to the wiring 3005 of memory cells from which data is not read.

<Circuit Configuration 2 of Semiconductor Device>

Figure 30B:
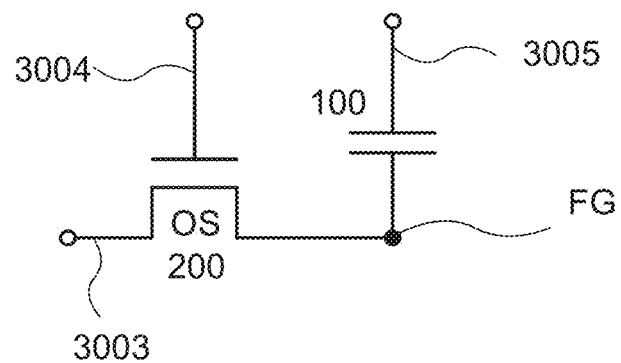

A semiconductor device in FIG. 30B is different from the semiconductor device in FIG. 30A in that the transistor 300 is not provided. Also in this case, data can be written and retained in a manner similar to that of the semiconductor device in FIG. 30A.

Reading of data in the semiconductor device in FIG. 30B is described. When the transistor 200 is brought into an on state, the wiring 3003 which is in a floating state and the capacitor 100 are electrically connected to each other, and the charge is redistributed between the wiring 3003 and the capacitor 100. As a result, the potential of the wiring 3003 is changed. The amount of change in the potential of the wiring 3003 varies depending on the potential of the one electrode of the capacitor 100 (or the charge accumulated in the capacitor 100).

For example, the potential of the wiring 3003 after the charge redistribution is $(C_B \times V_{B0}+C \times V)/(C_B+C)$, where V is the potential of the one electrode of the capacitor 100, C is the capacitance of the capacitor 100, $C_B$ is the capacitance component of the wiring 3003, and $V_{B0}$ is the potential of the wiring 3003 before the charge redistribution. Thus, it can be found that, assuming that the memory cell is in either of two states in which the potential of the one electrode of the capacitor 100 is $V_1$ and $V_0(V_1>V_0)$, the potential of the wiring 3003 in the case of retaining the potential $V_1 (=(C_B \times V_{B0}+C \times V_1)/(C_B+C))$ is higher than the potential of the wiring 3003 in the case of retaining the potential $V_0 (=(C_B \times V_{B0}+C \times V_0)/(C_B+C))$.

Then, by comparing the potential of the wiring 3003 with a predetermined potential, data can be read.

In the case of employing the configuration, a transistor using silicon may be used for a driver circuit for driving a memory cell, and a transistor using an oxide semiconductor may be stacked as the transistor 200 over the driver circuit.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the state of the transistor (on or off), whereby high-speed operation can be achieved.

<Structure 1 of Semiconductor Device>

The semiconductor device of one embodiment of the present invention includes the transistor 300, the transistor 200, and the capacitor 100 as shown in FIG. 23. The transistor 200 is provided above the transistor 300, and the capacitor 100 is provided above the transistor 300 and the transistor 200.

The transistor 300 is provided over a substrate 311 and includes a conductor 316, an insulator 314, a semiconductor region 312 that is a part of the substrate 311, and low-resistance regions 318a and 318b functioning as a source region and a drain region.

The transistor 300 may be a p-channel transistor or an n-channel transistor.

It is preferable that a region of the semiconductor region 312 where a channel is formed, a region in the vicinity thereof, the low-resistance regions 318a and 318b functioning as a source region and a drain region, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 318a and 318b contain an element which imparts n-type conductivity, such as arsenic or phosphorus, or an element which imparts p-type conductivity, such as boron, in addition to a semiconductor material used for the semiconductor region 312.

The conductor 316 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a stacked layer of metal materials such as tungsten and aluminum as the conductor. In particular, tungsten is preferable in terms of heat resistance.

Note that the transistor 300 shown in FIG. 23 is just an example and is not limited to the structure shown therein; an appropriate transistor may be used in accordance with a circuit configuration or a driving method. In the case of using the circuit configuration shown in FIG. 30B, the transistor 300 may be omitted.

An insulator 320, an insulator 322, an insulator 324, and an insulator 326 are stacked sequentially so as to cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 may function as a planarization film for eliminating a level difference caused by the transistor 300 or the like underlying the insulator 322. For example, a top surface of the insulator 322 may be planarized by planarization treatment using a chemical mechanical polishing (CMP) method or the like to increase the level of planarity.

The insulator 324 is preferably formed using a film having a barrier property that prevents impurities such as hydrogen from diffusing from the substrate 311, the transistor 300, or the like into a region where the transistor 200 is formed. The barrier property herein refers to a high oxidation resistance and a function of inhibiting the diffusion of oxygen and impurities typified by hydrogen, and water. For example, the diffusion length of oxygen or hydrogen in a film with a barrier property in an atmosphere at 350° C. or 400° C. is less than or equal to 50 nm per hour. The diffusion length of oxygen or hydrogen in the film with a barrier property at 350° C. or at 400° C. is preferably less than or equal to 30 nm per hour, further preferably less than or equal to 20 nm per hour.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

Note that the permittivity of the insulator 326 is preferably lower than that of the insulator 324. For example, the relative permittivity of the insulator 324 is preferably lower than 4, more preferably lower than 3. For example, the relative permittivity of the insulator 326 is preferably 0.7 times or less that of the insulator 324, more preferably 0.6 times or less that of the insulator 324. In the case where a material with a low permittivity is used as an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 23, an insulator 350, an insulator 352, and an insulator 354 are stacked sequentially. Furthermore, a conductor 356 is formed in the insulator 350, the insulator 352, and the insulator 354. The conductor 356 functions as a plug or a wiring. Note that the conductor 356 can be formed using a material similar to that used for forming the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening in the insulator 350 having a barrier property against hydrogen. In such a structure, the transistor 300 and the transistor 200 can be separated by a barrier layer, so that diffusion of hydrogen from the transistor 300 into the transistor 200 can be prevented.

Note that as the conductor having a barrier property against hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property against hydrogen is preferably in contact with the insulator 350 having a barrier property against hydrogen.

An insulator 358, an insulator 210, an insulator 212, an insulator 213, an insulator 214, and an insulator 216 are stacked sequentially over the insulator 354. A material having a barrier property against oxygen or hydrogen is preferably used for any of the insulators 358, 210, 212, 213, 214, and 216.

The insulators 358 and 212 are preferably formed using, for example, a film having a barrier property that prevents impurities such as hydrogen from diffusing from the substrate 311, a region where the transistor 300 is formed, or the like into a region where the transistor 200 is formed. Therefore, the insulators 358 and 212 can be formed using a material similar to that used for forming the insulator 324.

As an example of the film having a barrier property against hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the film having a barrier property against hydrogen, for example, as each of the insulators 213 and 214, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

For example, the insulators 210 and 216 can be formed using a material similar to that used for forming the insulator 320. In the case where a material with a relatively low permittivity is used as an interlayer film, the parasitic capacitance between wirings can be reduced. For example, a silicon oxide film, a silicon oxynitride film, or the like can be used as the insulator 216.

A conductor 218, a conductor (the conductor 205) included in the transistor 200, and the like are embedded in the insulators 358, 210, 212, 213, 214, and 216. Note that the conductor 218 functions as a plug or a wiring that is electrically connected to the capacitor 100 or the transistor 300. The conductor 218 can be formed using a material similar to that used for forming the conductor 328 and the conductor 330.

In particular, the conductor 218 in a region in contact with the insulators 358, 212, 213, and 214 is preferably a conductor having a barrier property against oxygen, hydrogen, and water. In such a structure, the transistor 300 and the transistor 200 can be completely separated by a layer having a barrier property against oxygen, hydrogen, and water, so that diffusion of hydrogen from the transistor 300 into the transistor 200 can be prevented.

For example, when the insulator 224 includes an excess-oxygen region, the conductor in contact with the insulator 224, such as the conductor 218, is preferably a conductor with a high oxidation resistance. As shown in the drawing, a conductor 219 with a barrier property may be provided over the conductor 218 and the conductor (the conductor 205) included in the transistor 200. With this structure, it is possible to inhibit the conductor 218 and the conductor (the conductor 205) included in the transistor 200 from reacting with oxygen of the excess-oxygen region and from generating an oxide.

The transistor 200 is provided over the insulator 224. Note that any of the transistor structures described in the above-described embodiment can be used as the structure of the transistor 200. The transistor 200 shown in FIG. 23 is just an example and is not limited to the structure shown therein; an appropriate transistor may be used in accordance with a circuit configuration or a driving method.

The insulator 280 is provided over the transistor 200. In the insulator 280, an excess-oxygen region is preferably formed. In particular, in the case of using an oxide semiconductor in the transistor 200, when an insulator including an excess-oxygen region is provided in an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 that covers the transistor 200 may function as a planarization film that covers a roughness thereunder. A conductor 244 and the like are embedded in the insulator 280.

The conductor 244 functions as a plug or a wiring that is electrically connected to the capacitor 100, the transistor 200, or the transistor 300. The conductor 244 can be formed using a material similar to that used for forming the conductor 328 and the conductor 330.

For example, when the conductor 244 is formed to have a stacked-layer structure, the conductor 244 preferably includes a conductor that is unlikely to be oxidized (that has a high oxidation resistance). In particular, a conductor with a high oxidation resistance is preferably provided in a region in contact with the insulator 280 including the excess-oxygen region. Such a structure can prevent the conductor 244 from absorbing excess oxygen from the insulator 280. Furthermore, the conductor 244 preferably includes a conductor having a barrier property against hydrogen. In particular, a conductor having a barrier property against an impurity such as hydrogen is provided in a region in contact with the insulator 280 including the excess-oxygen region, whereby diffusion of the impurity of the conductor 244, diffusion of part of the conductor 244, and diffusion of an impurity from the outside through the conductor 244 can be prevented.

A conductor 246, a conductor 124, a conductor 112a, and a conductor 112b may be provided over the conductor 244. The conductor 246 and the conductor 124 function as a plug or a wiring that is electrically connected to the capacitor 100, the transistor 200, or the transistor 300. The conductor 112a and the conductor 112b function as an electrode of the capacitor 100. The conductor 246 and the conductor 112a can be formed at the same time. The conductor 124 and the conductor 112b can be formed at the same time.

For the conductor 246, the conductor 124, the conductor 112a, and the conductor 112b, a metal film containing an element selected from molybdenum, titanium, tantalum, tungsten, aluminum, copper, chromium, neodymium, and scandium; a metal nitride film containing any of the above elements as its component (e.g., a tantalum nitride film, a titanium nitride film, a molybdenum nitride film, or a tungsten nitride film); or the like can be used. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

It is particularly preferable to use a metal nitride film such as a tantalum nitride film for the conductor 246 and the conductor 112*a* because such a metal nitride film has a barrier property against hydrogen or oxygen and is not easily oxidized (has a high oxidation resistance). Meanwhile, the conductor 124 and the conductor 112*b* are preferably formed by stacking a material with high conductivity such as tungsten. The use of the combination of the materials can prevent diffusion of hydrogen into the insulator 280 and the transistor 200 while the conductivity of the wiring is ensured. A two-layer structure of the conductor 246 and the conductor 124 is shown in FIG. 23, but the structure is not limited thereto, and a single-layer structure or a stacked-layer structure of three or more layers may be used. For example, between a conductor having a barrier property and a conductor with high conductivity, a conductor which is highly adhesive to the conductor having a barrier property and the conductor with high conductivity may be formed.

Furthermore, a barrier layer 281 may be provided over the conductor 124. With the barrier layer 281, the conductor 124 can be inhibited from being oxidized in a later step. In addition, diffusion of impurities contained in the conductor 124 and diffusion of part of the conductor 124 can be inhibited. Impurities can be inhibited from penetrating the conductor 124, the conductor 246, and the conductor 244 to be diffused into the insulator 280.

Note that the barrier layer 281 can be formed using an insulating material. In that case, the barrier layer 281 may function as part of the dielectric of the capacitor 100. The barrier layer 281 may be formed using a conductive material. In that case, the barrier layer 281 may function as part of a wiring or an electrode.

A metal oxide such as aluminum oxide, hafnium oxide, or tantalum oxide, a metal nitride such as tantalum nitride, or the like is preferably used for the barrier layer 281. In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of the conductor 124 and impurities such as hydrogen and moisture into the transistor 200 in and after a manufacturing process of the semiconductor device.

The insulator 282 is provided over the barrier layer 281 and the insulator 280. A material having a barrier property against oxygen or hydrogen is preferably used for the insulator 282. Thus, the insulator 282 can be formed using a material similar to that used for forming the insulator 214. As the insulator 282, a metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from the oxide in the transistor 200 can be prevented. Therefore, aluminum oxide is suitably used as a protective film for the transistor 200.

Therefore, the transistor 200 and the insulator 280 including the excess-oxygen region can be positioned between a stacked-layer structure of the insulators 212, 213, and 214 and the insulator 282. The insulators 212, 213, 214, and 282 each have a barrier property that prevents diffusion of oxygen or impurities such as hydrogen and water.

Oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

Here, a dicing line (also referred to as a scribe line, a dividing line, or a cutting line) that is provided when a large-sized substrate is divided into semiconductor elements so that a plurality of semiconductor devices are each formed in a chip form will be described. In an example of a dividing method, for example, a groove (a dicing line) for separating the semiconductor elements is formed on the substrate and then, the substrate is cut along the dicing line so that a plurality of semiconductor devices that are separated are obtained. FIGS. 29A and 29B are each a cross-sectional view of the vicinity of a dicing line.

For example, as illustrated in FIG. 29A, an opening is provided in the insulators 212, 213, 214, 216, 224, and 280 in the vicinity of a region overlapping with the dicing line (shown by a dashed-dotted line in FIG. 29A) formed in an edge of a memory cell including the transistor 200. In addition, the insulator 282 is provided to cover the side surfaces of the insulators 212, 213, 214, 216, 224, and 280.

Here, when the barrier layer 281 has an insulating property, the insulator 282 is preferably provided in the opening with the barrier layer 281 positioned between the insulator 282 and the inner surface of the opening. Diffusion of impurities can be more inhibited owing to the barrier layer 281.

Thus, in the opening, the insulators 212, 213, and 214 are in contact with the barrier layer 281. At that time, at least one of the insulators 212, 213, and 214 is formed using the same material and method as those used for forming the insulator 282, whereby adhesion therebetween can be improved. Note that the barrier layer 281 and the insulator 282 are preferably formed using the same material. Aluminum oxide can be used, for example. When the barrier layer 281 is formed by a method by which a dense film can be formed, e.g., an ALD method, and then the insulator 282 is formed by a method with a high deposition rate such as a sputtering method, high productivity and a high barrier property can be achieved.

In the structure, the insulator 280 and the transistor 200 can be enclosed with the insulators 212, 213, 214, and 282. Since the insulators 212, 213, 214, and 282 each have a function of preventing diffusion of oxygen, hydrogen, and water, entry and diffusion of impurities such as hydrogen or water from the direction of the side surface of the divided substrate into the transistor 200 can be prevented even when the substrate is divided into circuit regions each of which is provided with the semiconductor element in this embodiment to form a plurality of chips.

Furthermore, in the structure, excess oxygen in the insulator 280 can be prevented from diffusing into the outside of the insulators 282 and 214. Accordingly, excess oxygen in the insulator 280 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

As another example, as illustrated in FIG. 29B, openings may be provided in the insulators 212, 213, 214, 216, 224, and 280 on both sides of the dicing line (shown by the dashed-dotted line in FIG. 29B). Although the number of the openings in the drawing is two, a plurality of openings may be provided as needed.

Since the insulators 212, 213, and 214 are in contact with the barrier layer 281 in at least two regions in the openings provided on both sides of the dicing line, higher adhesion is obtained. Note that also in that case, when at least one of the insulators 212, 213, and 214 is formed using the same material and method as those used for forming the insulator 282, the adhesion therebetween can be improved.

Since the plurality of openings are provided, the insulator 282 can be in contact with the insulators 212, 213, and 214 in a plurality of regions. Therefore, impurities that enter from the dicing line can be prevented from reaching the transistor 200.

In such a structure, the transistor 200 and the insulator 280 can be sealed tightly. Thus, the oxide where the channel is formed in the transistor 200 can be an oxide semiconductor with a low density of defect states and stable characteristics. That is, a change in electrical characteristics of the transistor 200 can be prevented and the reliability can be improved.

The capacitor 100 is provided above the transistor 200. The capacitor 100 includes a conductor 112 (the conductor 112a and the conductor 112b), the barrier layer 281, the insulator 282, an insulator 130, and a conductor 116.

The conductor 112 functions as the electrode of the capacitor 100. For example, in the structure in FIG. 23, part of the conductor 244 functioning as a plug or a wiring that is connected to the transistor 200 and the transistor 300 functions as the conductor 112. Note that when the barrier layer 281 has conductivity, the barrier layer 281 functions as part of the electrode of the capacitor 100. When the barrier layer 281 has an insulating property, the barrier layer 281 functions as part of the dielectric of the capacitor 100.

Such a structure can increase the productivity owing to a reduction of the number of steps in the process as compared to the case where the electrode and the wiring are formed separately.

A region of the insulator 282 which is located between the conductor 112 and the conductor 116 functions as a dielectric. For example, the use of a high dielectric constant (high-k) material, such as aluminum oxide, for the insulator 282 can ensure a sufficient capacitance of the capacitor 100.

The insulator 130 may be provided as part of the dielectric. The insulator 130 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, in the case where a high dielectric constant (high-k) material, such as aluminum oxide, is used for the insulator 282, a material with high dielectric strength, such as silicon oxynitride, is preferably used for the insulator 130. In the capacitor 100 having the structure, the dielectric strength can be increased and the electrostatic breakdown of the capacitor 100 can be prevented because of the insulator 130.

The conductor 116 is provided so as to cover the top and side surfaces of the conductor 112 with the barrier layer 281, the insulator 282, and the insulator 130 located therebetween. In the structure where the side surfaces of the conductor 112 are wrapped by the conductor 116 with the insulators located therebetween, capacitance is also formed on the side surfaces of the conductor 112, resulting in an increase in the capacitance per unit projected area of the capacitor. Thus, the semiconductor device can be reduced in area, highly integrated, and miniaturized.

Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

An insulator 150 is provided over the conductor 116 and the insulator 130. The insulator 150 can be formed using a material similar to that used for forming the insulator 320. The insulator 150 may function as a planarization film that covers roughness due to underlying layers.

The above is the description of the structure example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Modification Example 1>

Figure 24:
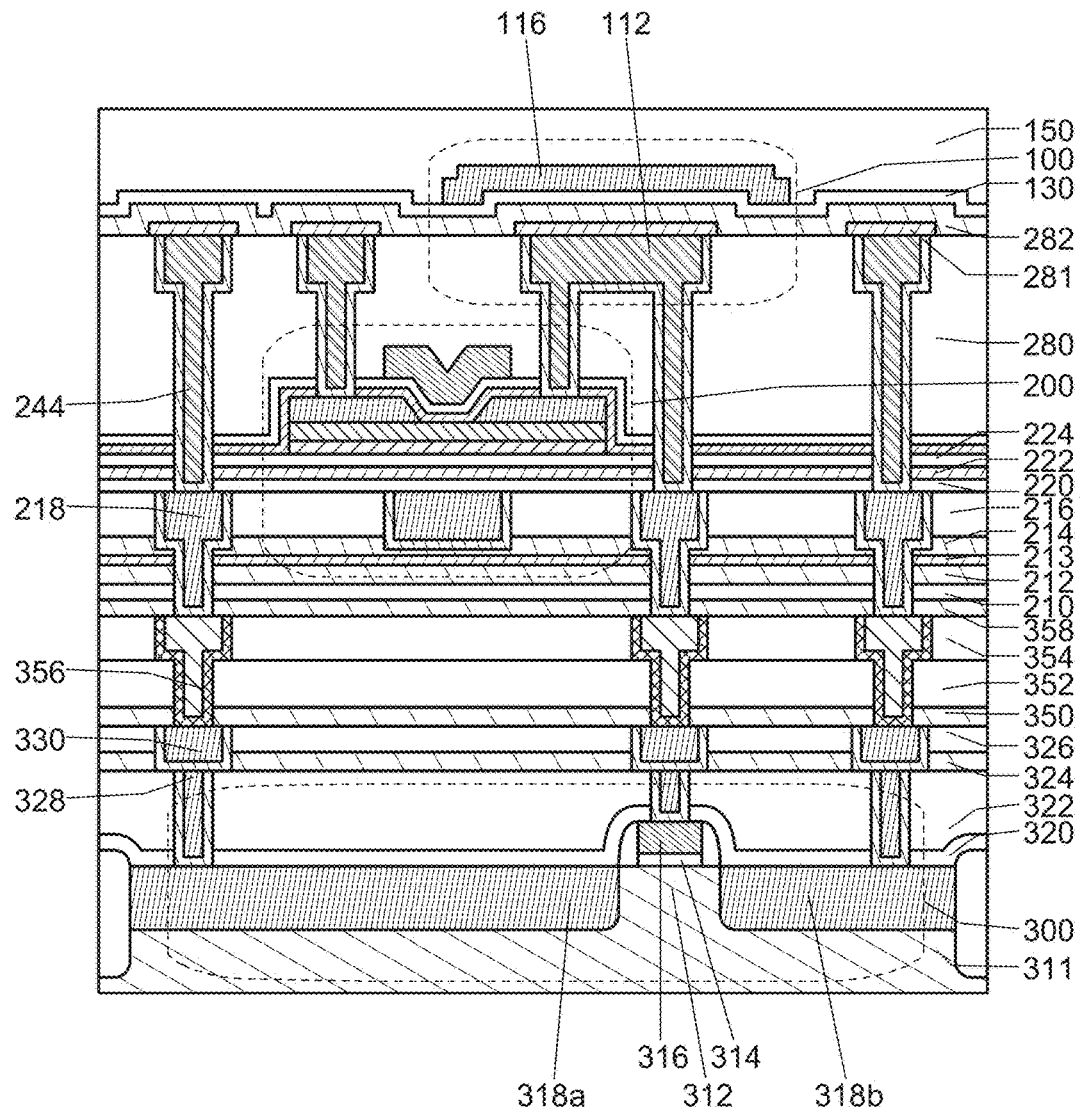
FIG. 24 illustrates a cross-sectional structure of a semiconductor device of one embodiment.

In a modification example of this embodiment, the conductor 244 and the barrier layer 281 may be formed as illustrated in FIG. 24. In other words, the conductor 244 serving as a plug or a wiring and the conductor 112 serving as part of the electrode of the capacitor 100 may be embedded in the insulator 280, and the barrier layer 281 may be formed using a conductor or an insulator with a barrier property over the conductor 244. In that case, the barrier layer 281 is preferably formed using a conductor with not only a high barrier property but also a high oxidation resistance. Since part of the conductor 244 functions as the electrode (the conductor 112) of the capacitor in this structure, a separate conductor does not need to be provided.

Thus, as illustrated in FIG. 24, the capacitor 100 includes the conductor 112 that is a region of the conductor 244, the insulator 282, the insulator 130, and the conductor 116.

The conductor 112 functioning as the electrode of the capacitor 100 can be formed concurrently with the conductor 244. Such a structure can increase the productivity. Furthermore, the number of steps in the process can be reduced because a mask for forming the electrode of the capacitor is not needed.

The insulator 220, the insulator 222, and the insulator 224 are stacked in this order over the insulator 216. A material having a barrier property against oxygen or hydrogen is preferably used for any of the insulators 220, 222, and 224. Note that the insulator 220, the insulator 222, and the insulator 224 function as part (a gate insulator) of the transistor 200 in some cases.

The insulator 224 preferably includes an oxide containing oxygen in excess of that in the stoichiometric composition. That is, in the insulator 224, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided in a base film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. An oxide that releases part of oxygen by heating is an oxide film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

Furthermore, when the insulator 224 includes an excess-oxygen region, the insulator 222 or the insulator 220 preferably has a barrier property against oxygen, hydrogen, and water. When the insulator 222 or the insulator 220 has a barrier property against oxygen, oxygen in the excess-oxygen region is not diffused to the transistor 300 side but supplied to the oxide 230 of the transistor 200 efficiently. The conductor 218 and the conductor (the conductor 205) included in the transistor 200 can be inhibited from reacting with oxygen of the excess-oxygen region and from generating an oxide.

The above is the description of the modification example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Modification Example 2>

Figure 25:
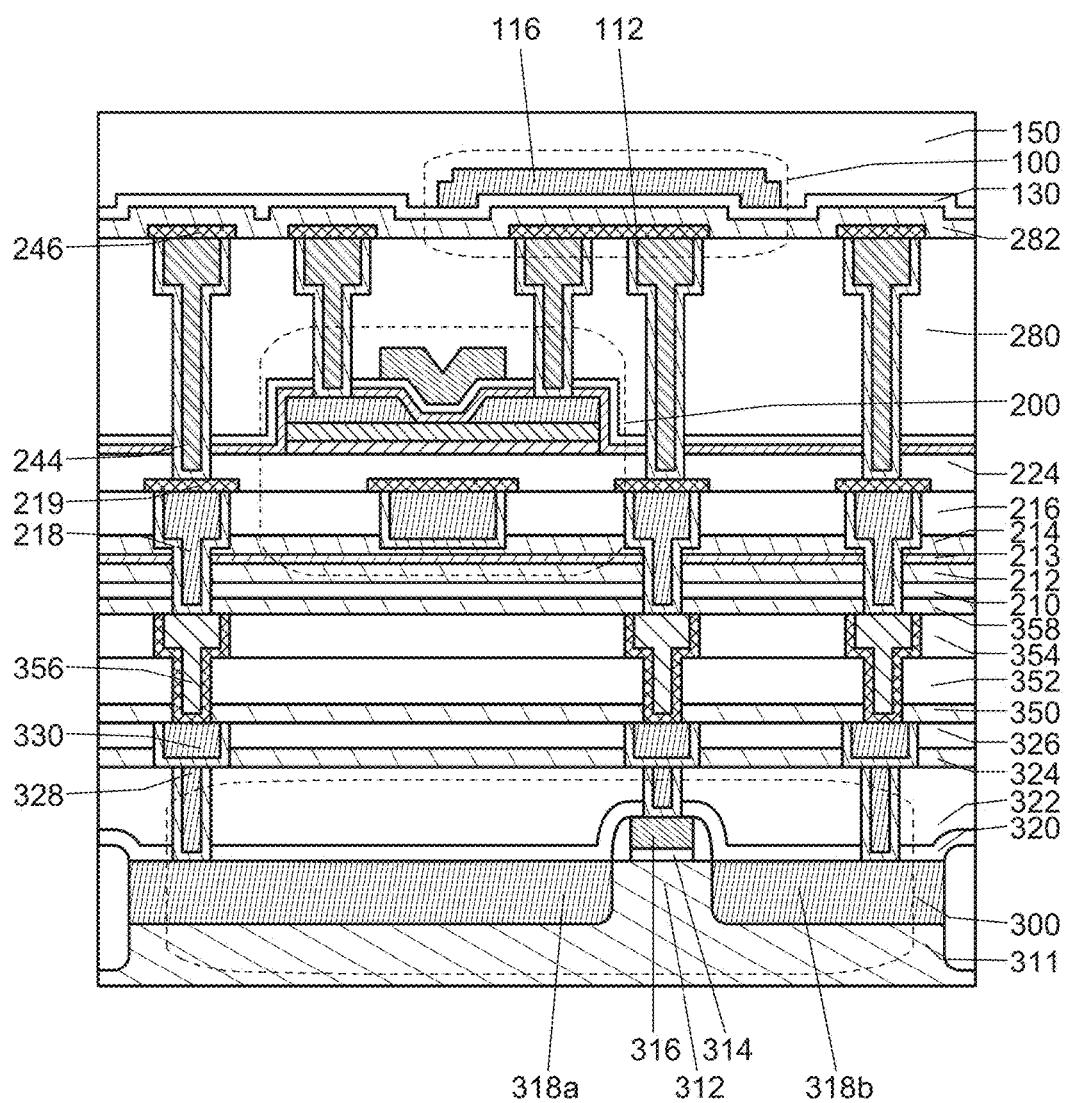
FIG. 25 illustrates a cross-sectional structure of a semiconductor device of one embodiment.

In a modification example of this embodiment, the conductor 219, the conductor 244, and the conductor 246 with a barrier property may be formed as illustrated in FIG. 25. In other words, the conductor 244 serving as a plug or a wiring may be embedded in the insulator 280, and the conductor 246 with a barrier property may be formed over the conductor 244. In that case, the conductor 246 is preferably formed using a conductor with not only a high barrier property but also a high oxidation resistance. With this structure, the conductor 246 and the conductor 112 serving as the electrode of the capacitor can be formed at the same time. In addition, since the conductor 246 also functions as a barrier layer in this structure, a separate barrier layer does not need to be provided.

Thus, as illustrated in FIG. 25, the capacitor 100 includes the conductor 112, the insulator 282, the insulator 130, and the conductor 116. The conductor 112 functioning as the electrode of the capacitor 100 can be formed concurrently with the conductor 246.

The above is the description of the modification example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Modification Example 3>

Figure 26:
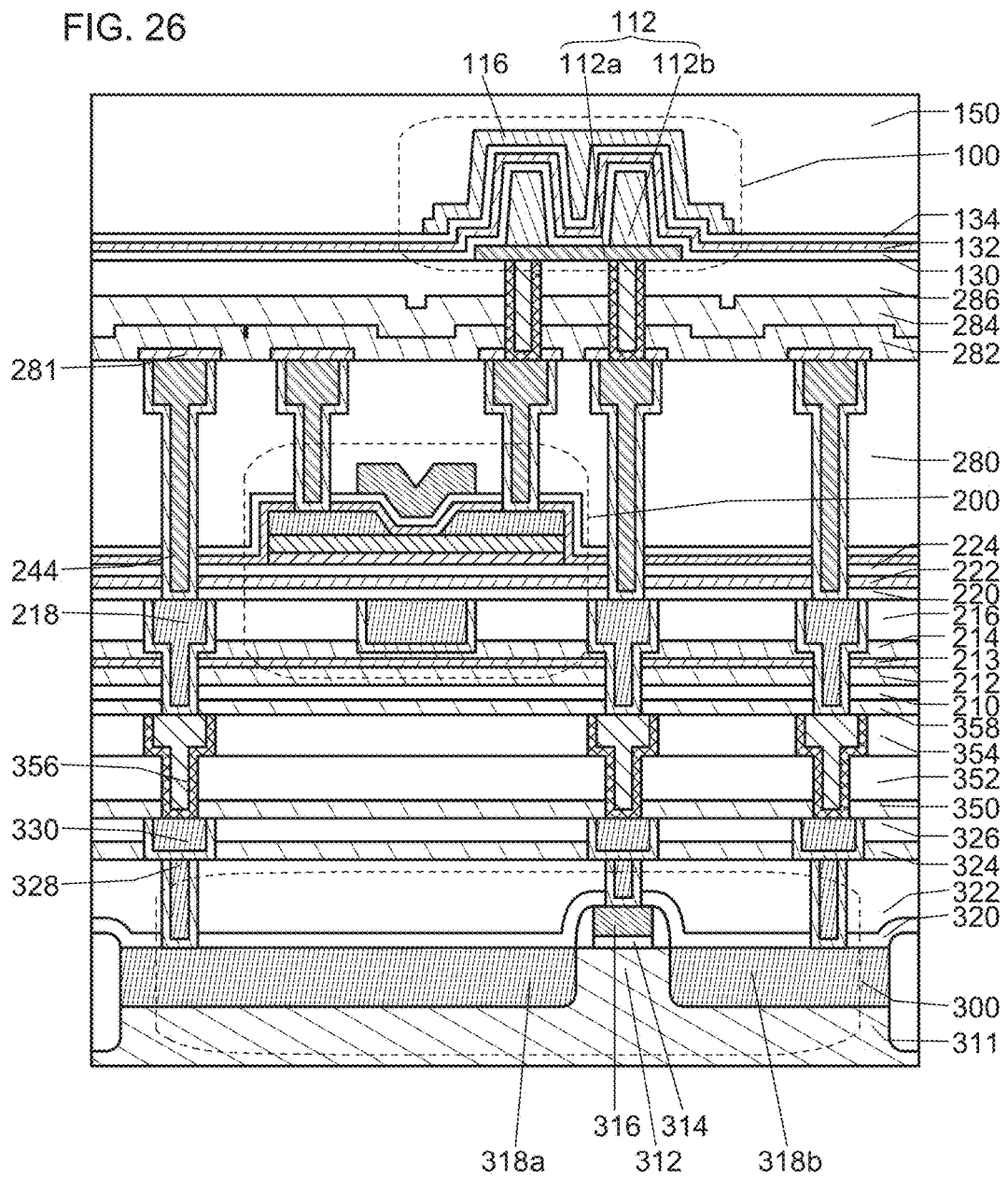
FIG. 26 illustrates a cross-sectional structure of a semiconductor device of one embodiment.

In a modification example of this embodiment, the capacitor 100 as illustrated in FIG. 26 may be provided. That is, the conductor 244 serving as a plug or a wiring is embedded in the insulator 280, the barrier layer 281 with a barrier property is provided over the conductor 244, and then the insulator 282 with a barrier property and an insulator 284 are provided. After that, an insulator 286 with high planarity is formed over the insulator 284, whereby the capacitor 100 can be provided over the insulator 286 with high planarity.

The capacitor 100 is provided over the insulator 286 and includes the conductor 112 (the conductor 112a and the conductor 112b), the insulator 130, an insulator 132, an insulator 134, and the conductor 116. Note that the conductor 124 functions as a plug or a wiring that is electrically connected to the capacitor 100, the transistor 200, or the transistor 300.

The conductor 112 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 112 is formed concurrently with another component such as a conductor, Cu (copper), Al (aluminum), or the like which is a low-resistance metal material may be used.

The insulators 130, 132, and 134 are provided over the conductor 112. The insulators 130, 132, and 134 can each be formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like. Although the three-layer structure is illustrated in the drawing, a single-layer structure, a stacked-layer structure of two layers, or a stacked-layer structure of four or more layers may be employed.

For example, a material with high dielectric strength, such as silicon oxynitride, is preferably used for the insulators 130 and 134, and a high dielectric constant (high-k) material, such as aluminum oxide, is preferably used for the insulator 132. In the capacitor 100 having the structure, a sufficient capacitance can be provided because of the high dielectric constant (high-k) insulator, and the dielectric strength can be increased and the electrostatic breakdown of the capacitor 100 can be prevented because of the insulator with high dielectric strength.

The conductor 116 is provided over the conductor 112 with the insulators 130, 132, and 134 positioned therebetween. Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

Note that when the conductor 112, which functions as one electrode, includes a projecting structure body like the conductor 112b, the capacitance of the capacitor per projected area can be increased. Thus, the semiconductor device can be reduced in area, highly integrated, and miniaturized.

The above is the description of the structure example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Modification Example 4>

Figure 27:
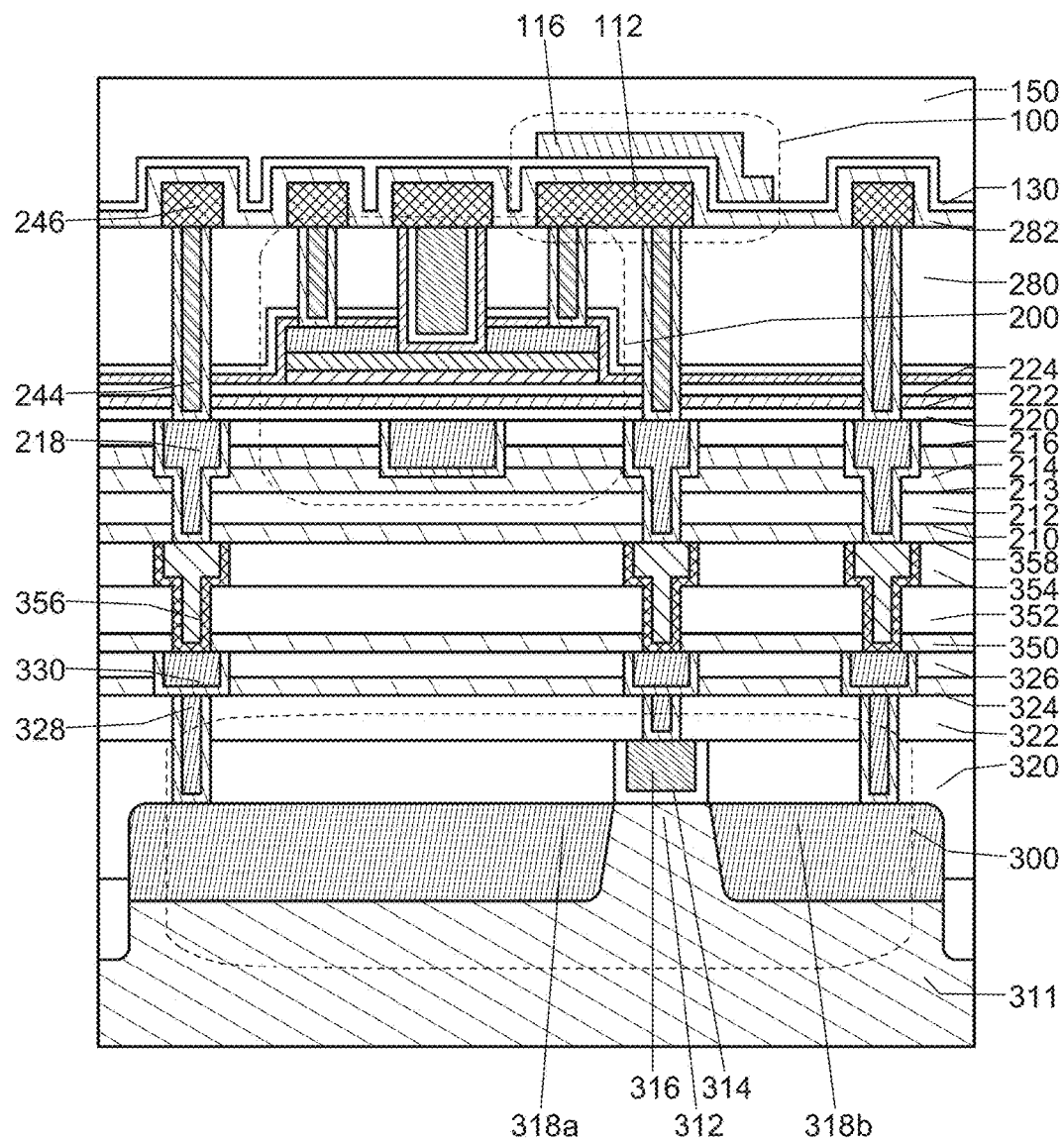
FIG. 27 illustrates a cross-sectional structure of a semiconductor device of one embodiment.

FIG. 27 illustrates another modification example of this embodiment. FIG. 27 is different from FIG. 23 in the structures of the transistors 300 and 200.

In the transistor 300 illustrated in FIG. 27, the semiconductor region 312 (part of the substrate 311) in which the channel is formed has a projecting shape. Furthermore, the conductor 316 is provided to cover top and side surfaces of the semiconductor region 312 with the insulator 314 positioned therebetween. Note that the conductor 316 may be formed using a material for adjusting the work function. The transistor 300 having such a structure is also referred to as a FIN transistor because the projection of the semiconductor substrate is utilized. An insulator serving as a mask for forming the projection may be provided in contact with a top surface of the projection. Although the case where the projection is formed by processing part of the semiconductor substrate is described here, a semiconductor film having a projection may be formed by processing an SOI substrate.

Details of the structure of the transistor 200 in FIG. 27 are described in the above embodiment. An oxide, a gate insulator, and a conductor serving as a gate are formed in an opening formed in the insulator 280. Thus, it is preferable to form the conductor 246 with a barrier property at least over the conductor serving as a gate.

In the case where the conductor 112 (the conductor 246) has a stacked-layer structure of a conductor having a barrier property against oxygen, hydrogen, or water (e.g., tantalum nitride) and a conductor having high conductivity (e.g., tungsten or copper), the conductor having high conductivity (e.g., tungsten or copper) is completely sealed with tantalum nitride and the barrier layer 281. Thus, not only diffusion of the conductor itself (e.g., copper) but also entry of impurities from above the insulator 282 through the conductor 244 can be prevented.

Note that the capacitor 100 is provided above the transistor 200. In the structure in FIG. 27, the capacitor 100 includes the conductor 112, the conductor 246 having a barrier property, the insulator 282, the insulator 130, and the conductor 116.

The conductor 112 functions as the electrode of the capacitor 100. For example, in the structure in FIG. 27, part of the conductor 244 functioning as a plug or a wiring that is connected to the transistor 200 and the transistor 300 functions as the conductor 112. Note that when the barrier layer 281 has conductivity, the barrier layer 281 functions as part of the electrode of the capacitor 100. When the barrier layer 281 has an insulating property, the barrier layer 281 functions as a dielectric of the capacitor 100.

Such a structure can increase the productivity owing to a reduction of the number of steps in the process as compared to the case where the electrode and the wiring are formed separately.

The above is the description of the modification example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Modification Example 5>

Figure 28:
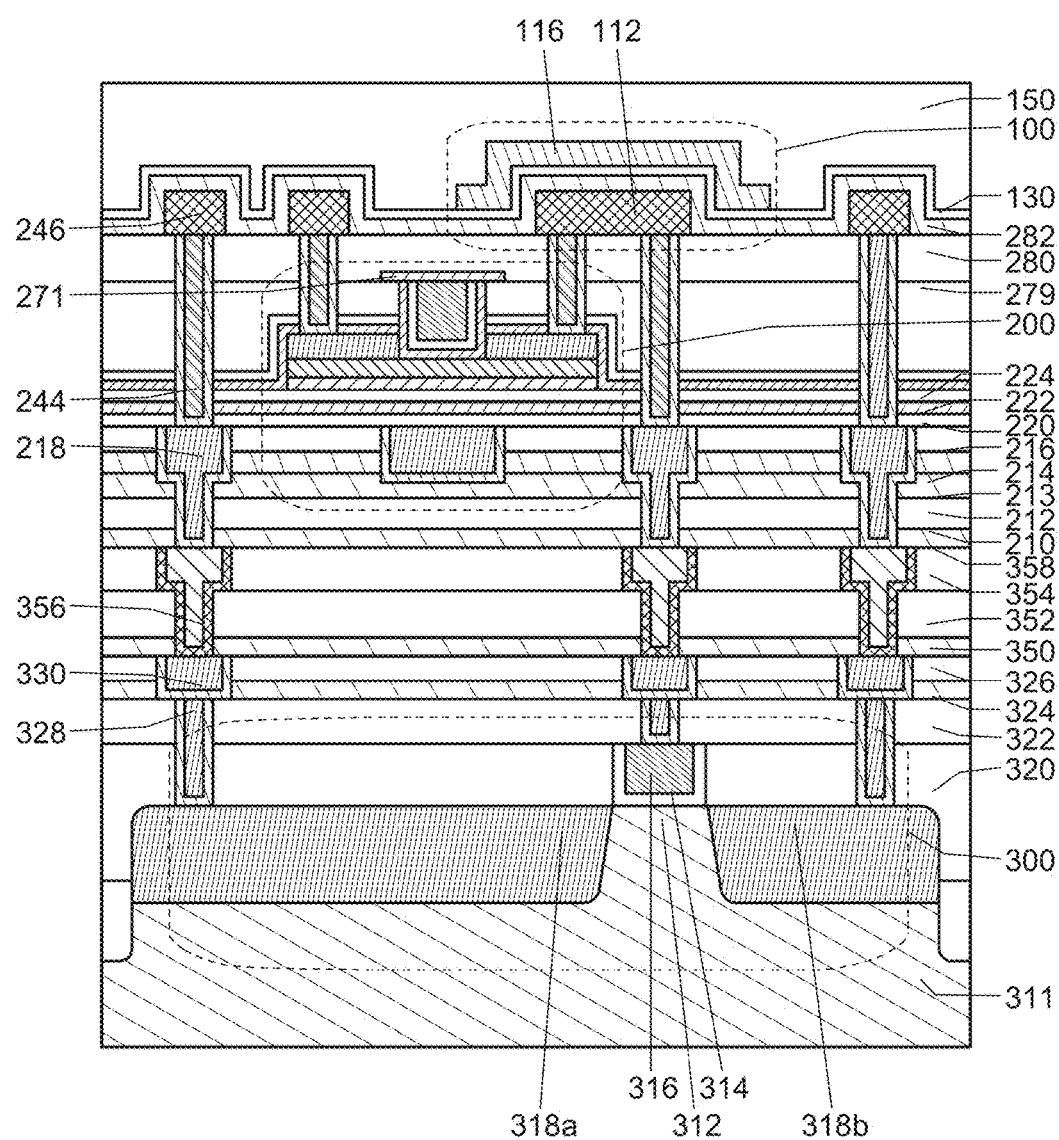
FIG. 28 illustrates a cross-sectional structure of a semiconductor device of one embodiment.

FIG. 28 illustrates another modification example of this embodiment. FIG. 28 is different from FIG. 26 in the structure of the transistor 200.

As illustrated in FIG. 28, an insulator 279 and a barrier layer 271 may be provided.

The insulator 279 can be formed using a material and a method similar to those used for forming the insulator 280. That is, like the insulator 280, the insulator 279 preferably includes an oxide containing oxygen in excess of that in the stoichiometric composition. Thus, the insulator 279 is an insulator containing oxygen, such as a silicon oxide film or a silicon oxynitride film. As the insulator containing excess oxygen, a silicon oxide film or a silicon oxynitride film containing a large amount of oxygen can be formed by a CVD method or a sputtering method under the conditions that are set as appropriate. After an insulator to be the insulator 279 is formed, planarization treatment using a CMP method or the like may be performed to improve the planarity of a top surface of the insulator. To form an excess-oxygen region in the insulator 279, for example, oxygen may be added by an ion implantation method, an ion doping method, or plasma treatment.

The barrier layer 271 is formed using an insulator or a conductor having a barrier property against oxygen. The barrier layer 271 can be formed using, for example, aluminum oxide, hafnium oxide, tantalum oxide, tantalum nitride, or the like by a sputtering method or an atomic layer deposition (ALD) method.

The insulator 280 is provided over the insulator 279 and the barrier layer 271. In the case where treatment for making an oxygen-excess state is performed on the insulator 280, excess oxygen which is introduced is diffused not only into the insulator 280 but also into the insulator 279 when the insulator 280 is formed using the same material and method as those used for forming the insulator 279. To form an excess-oxygen region in the insulator 280 and the insulator 279, for example, oxygen may be added to the insulator 280 by an ion implantation method, an ion doping method, or plasma treatment.

The above is the description of the modification example. With the use of the structure, a change in electrical characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

<Modification Example 6>

Figure 31B:
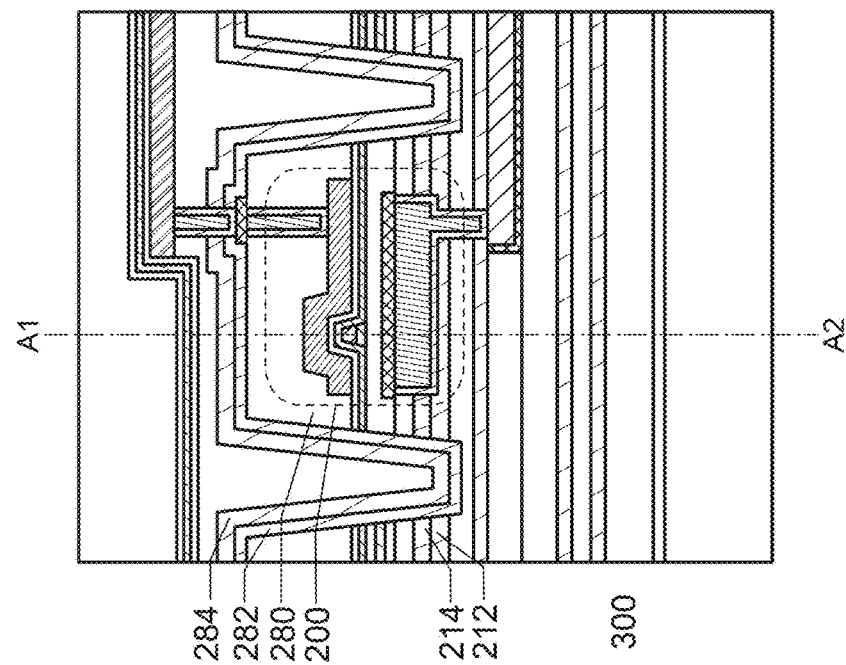
FIGS. 31A and 31B illustrate a cross-sectional structure of a semiconductor device of one embodiment.
Figure 31A:
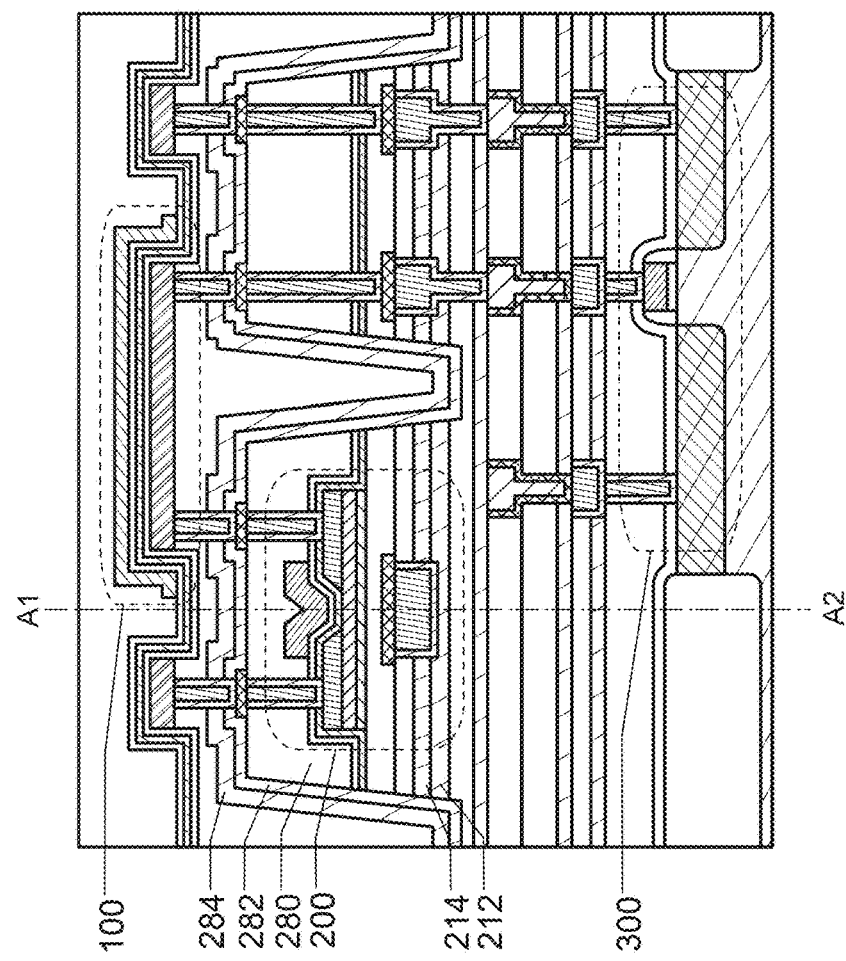

FIGS. 31A and 31B illustrate another modification example of this embodiment. FIGS. 31A and 31B are cross-sectional views of the transistor 200 in the channel length direction and in the channel width direction, respectively, with the dashed dotted line A1-A2 serving as an axis.

As illustrated in FIGS. 31A and 31B, the transistor 200 and the insulator 280 including the excess-oxygen region may be enclosed with a stacked-layer structure of the insulators 212 and 214 and a stacked-layer structure of the insulators 282 and 284. At that time, in a region between the transistor 200 and a through electrode which connects the transistor 300 and the capacitor 100, the stacked-layer structure of the insulators 212 and 214 is preferably in contact with the stacked-layer structure of the insulators 282 and 284.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

<Modification Example 7>

Figure 32A:
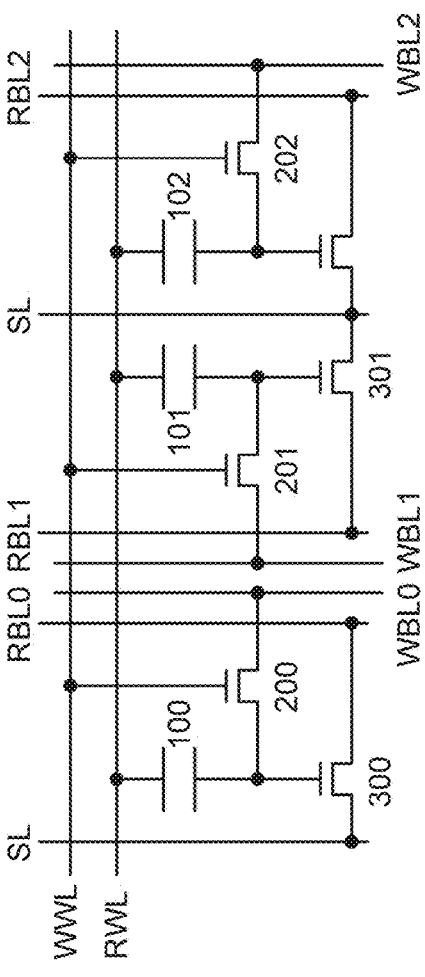
FIGS. 32A and 32B illustrate a circuit diagram and a cross-sectional structure of a semiconductor device of one embodiment.
Figure 32B:
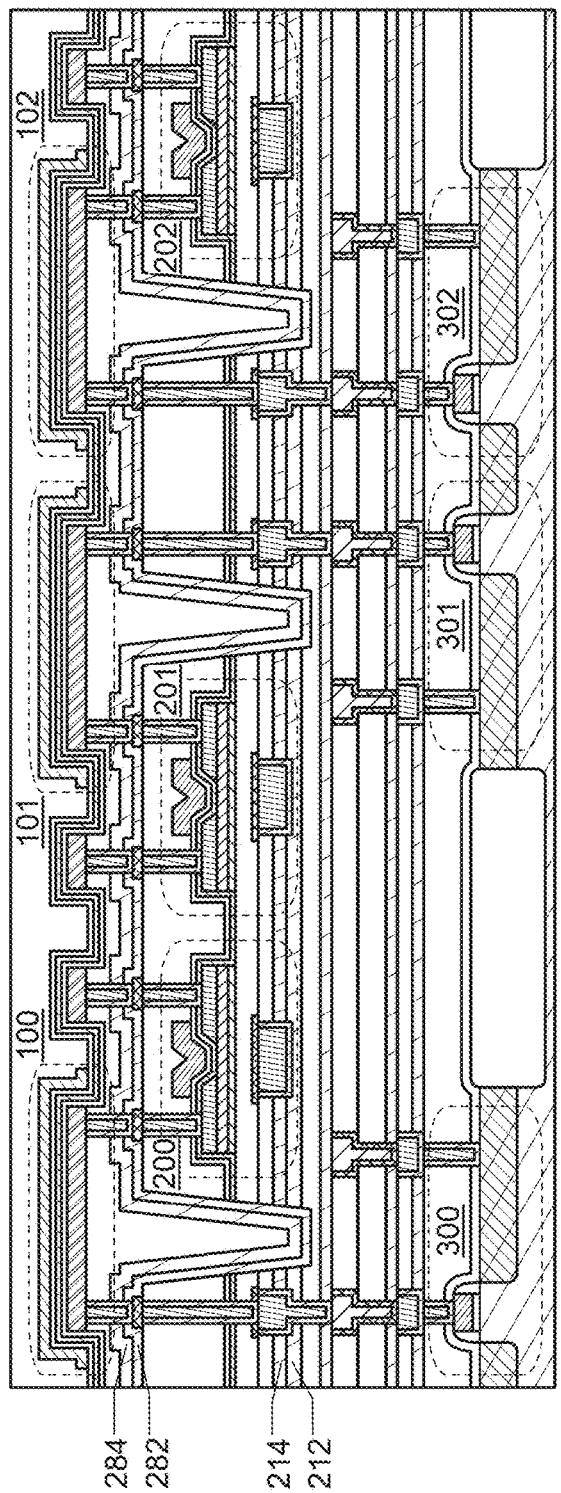

FIGS. 32A and 32B illustrate another modification example of this embodiment. FIG. 32A is a circuit diagram which shows part of a row in which the semiconductor devices each of which is illustrated in FIG. 30A are arranged in a matrix. FIG. 32B is a cross-sectional view of the semiconductor devices which corresponds to FIG. 32A.

In FIGS. 32A and 32B, the semiconductor device which includes the transistor 300, the transistor 200, and the capacitor 100; the semiconductor which includes a transistor 301, a transistor 201, and a capacitor 101; and the semiconductor device which includes a transistor 302, a transistor 202, and a capacitor 102 are arranged in the same row.

As illustrated in FIG. 32B, a plurality of transistors (the transistors 200 and 201 in the drawing) and the insulator 280 including an excess-oxygen region may be enclosed with the stacked-layer structure of the insulators 212 and 214 and the stacked-layer structure of the insulators 282 and 284. At that time, a structure in which the insulators 212 and 214 and the insulators 282 and 284 are stacked is preferably formed between the transistor 200, 201, or 202 and a through electrode which connects the transistor 300, 301, or 302 and the capacitor 100, 101, or 102.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

<Modification Example 8>

Figure 33:
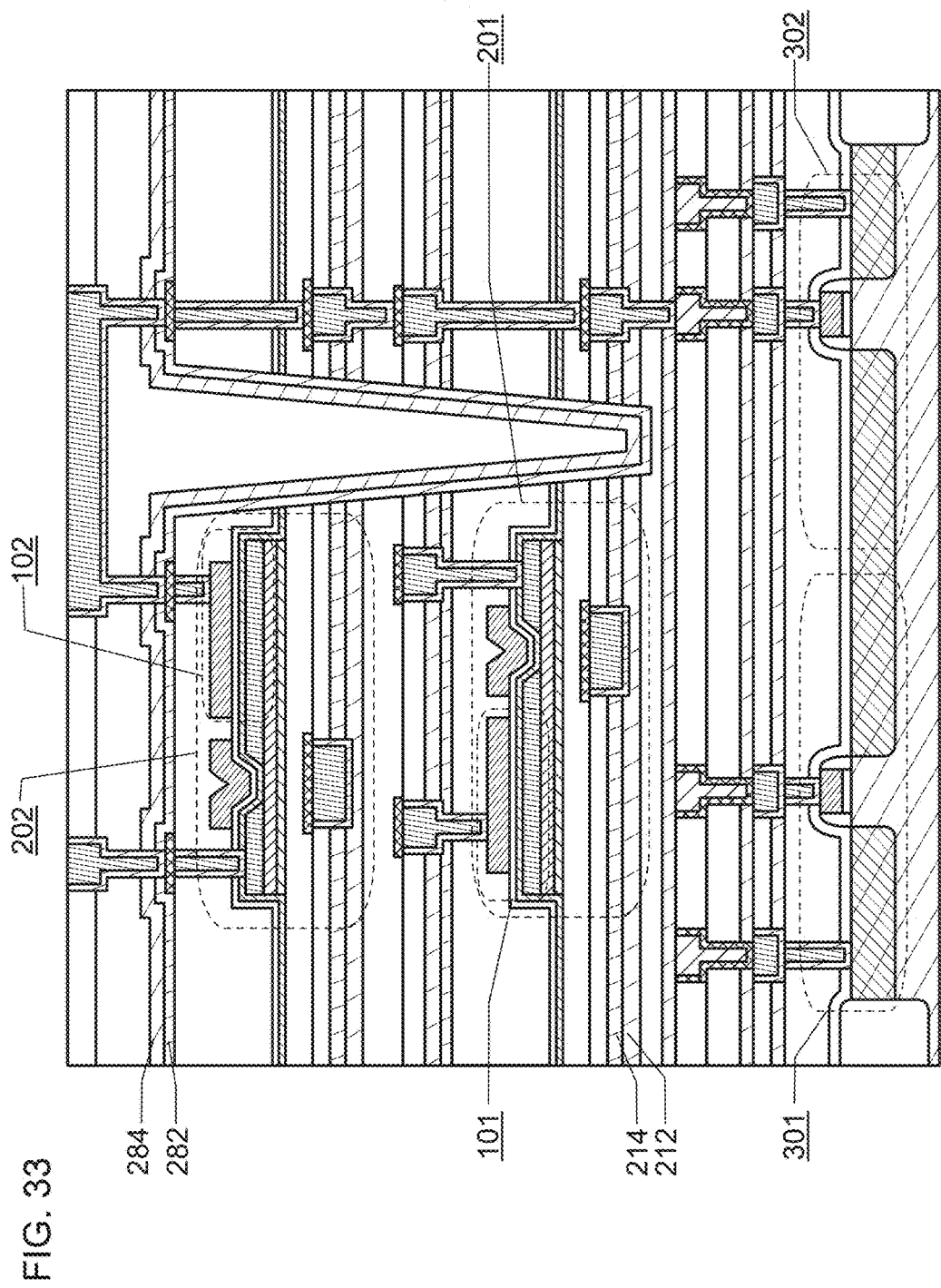
FIG. 33 illustrates a cross-sectional structure of a semiconductor device of one embodiment.

FIG. 33 illustrates another modification example of this embodiment. FIG. 33 is a cross-sectional view of the semiconductor devices illustrated in FIGS. 32A and 32B in which the transistor 201 and the transistor 202 are integrated.

As illustrated in FIG. 33, the conductor serving as the source electrode or the drain electrode of the transistor 201 may have a function of the conductor 112 serving as one electrode of the capacitor 101. At that time, a region in which the oxide of the transistor 201 and the insulator serving as the gate insulator of the transistor 201 extend over the conductor serving as the source or drain electrode of the transistor 201 functions as the insulator of the capacitor 101. Therefore, the conductor 116 serving as the other electrode of the capacitor 101 may be stacked over the conductor 240a with the insulator 250 and the oxide 230c positioned therebetween. This structure can lead to a reduction in area, higher integration, and miniaturization of the semiconductor device.

The transistor 201 and the transistor 202 may overlap with each other. This structure can lead to a reduction in area, higher integration, and miniaturization of the semiconductor device.

A plurality of transistors (the transistors 201 and 202 in the drawing) and the insulator 280 including an excess-oxygen region may be enclosed with the stacked-layer structure of the insulators 212 and 214 and the stacked-layer structure of the insulators 282 and 284. At that time, a structure in which the insulators 212 and 214 and the insulators 282 and 284 are stacked is preferably formed between the transistor 200, 201, or 202 and a through electrode which connects the transistor 300, 301, or 302 and the capacitor 100, 101, or 102.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from a layer above the insulator 282 and a layer below the insulator 214 into the transistor 200.

That is, oxygen can be efficiently supplied from the excess-oxygen region of the insulator 280 to the oxide where the channel is formed in the transistor 200, so that oxygen vacancies can be reduced. Moreover, oxygen vacancies can be prevented from being formed by impurities in the oxide where the channel is formed in the transistor 200. Thus, the oxide where the channel is formed in the transistor 200 can be an oxide semiconductor with a low density of defect states and stable characteristics. That is, a change in electrical characteristics of the transistor 200 can be prevented and the reliability can be improved.

At least part of this embodiment can be implemented in combination with any of the other embodiments described in this specification as appropriate.

(Embodiment 5)

In this embodiment, an example of a circuit of a semiconductor device including the transistor of one embodiment of the present invention or the like will be described.

<Circuit>

Examples of a circuit of a semiconductor device including the transistor or the like of one embodiment of the present invention will be described with reference to FIGS. 34 and 35.

<Memory Device 1>

Figure 34:
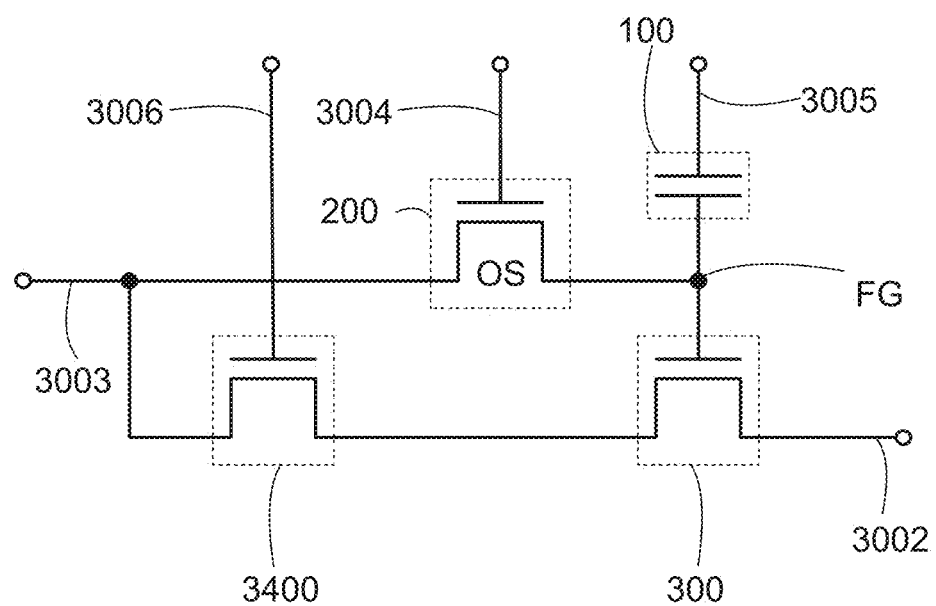
FIG. 34 is a circuit diagram illustrating a memory device of one embodiment of the present invention.

The semiconductor device in FIG. 34 is different from the semiconductor device described in the above embodiment in that a transistor 3400 and a wiring 3006 are included.

Also in this case, data can be written and retained in a manner similar to that of the semiconductor device described in the above embodiment. A transistor similar to the transistor 300 described above can be used as the transistor 3400.

The wiring 3006 is electrically connected to a gate of the transistor 3400, one of a source and a drain of the transistor 3400 is electrically connected to a drain of the transistor 300, and the other of the source and the drain of the transistor 3400 is electrically connected to the wiring 3003.

<Memory Device 2>

A modification example of the semiconductor device (memory device) is described with reference to a circuit diagram in FIG. 35.

Figure 35:
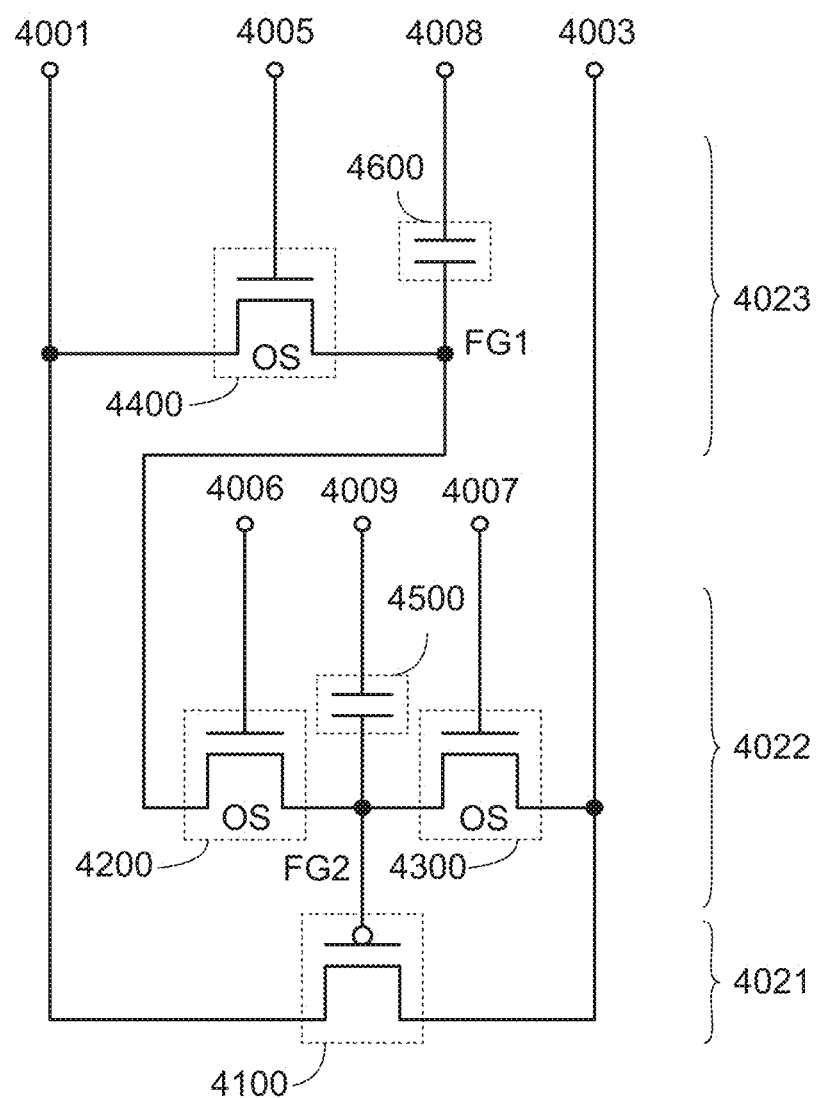
FIG. 35 is a circuit diagram illustrating a memory device of one embodiment of the present invention.

The semiconductor device illustrated in FIG. 35 includes transistors 4100, 4200, 4300, and 4400 and capacitors 4500 and 4600. Here, a transistor similar to the above-described transistor 300 can be used as the transistor 4100, and transistors similar to the above-described transistor 200 can be used as the transistors 4200 to 4400. Capacitors similar to the above-described capacitor 100 can be used as the capacitors 4500 and 4600. Although not illustrated in FIG. 35, a plurality of the semiconductor devices in FIG. 35 are provided in a matrix. The semiconductor device in FIG. 35 can control writing and reading of a data voltage in accordance with a signal or a potential supplied to a wiring 4001, a wiring 4003, and wirings 4005 to 4009.

One of a source and a drain of the transistor 4100 is connected to the wiring 4003. The other of the source and the drain of the transistor 4100 is connected to the wiring 4001. Although the transistor 4100 is a p-channel transistor in FIG. 35, the transistor 4100 may be an n-channel transistor.

The semiconductor device in FIG. 35 includes two data retention portions. For example, a first data retention portion retains a charge between one of a source and a drain of the transistor 4400, one electrode of the capacitor 4600, and one of a source and a drain of the transistor 4200 which are connected to a node FG1. A second data retention portion retains a charge between a gate of the transistor 4100, the other of the source and the drain of the transistor 4200, one of a source and a drain of the transistor 4300, and one electrode of the capacitor 4500 which are connected to a node FG2.

The other of the source and the drain of the transistor 4300 is connected to the wiring 4003. The other of the source and the drain of the transistor 4400 is connected to the wiring 4001. A gate of the transistor 4400 is connected to the wiring 4005. A gate of the transistor 4200 is connected to the wiring 4006. A gate of the transistor 4300 is connected to the wiring 4007. The other electrode of the capacitor 4600 is connected to the wiring 4008. The other electrode of the capacitor 4500 is connected to the wiring 4009.

The transistors 4200, 4300, and 4400 each function as a switch for control of writing of a data voltage and retaining a charge. Note that, as each of the transistors 4200, 4300, and 4400, it is preferable to use a transistor having a low current that flows between a source and a drain in an off state (low off-state current). As an example of the transistor with a low off-state current, a transistor including an oxide semiconductor in its channel formation region (an OS transistor) is preferably used. Some advantages of an OS transistor are that it has a low off-state current and can be manufactured to overlap with a transistor including silicon, for example. Although the transistors 4200, 4300, and 4400 are n-channel transistors in FIG. 35, the transistors 4200, 4300, and 4400 may be p-channel transistors.

The transistor 4200 and the transistor 4300 are preferably provided in a layer different from the layer where the transistor 4400 is provided even when the transistor 4200, the transistor 4300, and the transistor 4400 are transistors including oxide semiconductors. In other words, in the semiconductor device in FIG. 35, the transistor 4100, the transistor 4200 and the transistor 4300, and the transistor 4400 are preferably stacked. That is, by integrating the transistors, the circuit area can be reduced, so that the size of the semiconductor device can be reduced.

Next, operation of writing data to the semiconductor device illustrated in FIG. 35 is described.

First, operation of writing a data voltage to the data retention portion connected to the node FG1 (hereinafter referred to as writing operation 1) is described. In the following description, the data voltage written to the data retention portion connected to the node FG1 is referred to as $V_{D1}$, and the threshold voltage of the transistor 4100 is referred to as $V_{th}$.

In the writing operation 1, the wiring 4003 is set at $V_{D1}$, and after the wiring 4001 is set at a ground potential, the wiring 4001 is brought into an electrically floating state. The wirings 4005 and 4006 are set at a high level. The wirings 4007 to 4009 are set at a low level. Then, the potential of the node FG2 in the electrically floating state is increased, so that a current flows through the transistor 4100. By the current flow, the potential of the wiring 4001 is increased. The transistors 4400 and 4200 are turned on. Thus, as the potential of the wiring 4001 is increased, the potentials of the nodes FG1 and FG2 are increased. When the potential of the node FG2 is increased and a voltage ($V_{gs}$) between the gate and the source of the transistor 4100 reaches the threshold voltage $V_{th}$ of the transistor 4100, the current flowing through the transistor 4100 is decreased. Accordingly, the increase in the potentials of the wiring 4001 and the nodes FG1 and FG2 is stopped, so that the potentials of the nodes FG1 and FG2 are fixed at "$V_{D1}-V_{th}$," which is lower than $V_{D1}$ by $V_{th}$.

In other words, when a current flows through the transistor 4100, Vm supplied to the wiring 4003 is supplied to the wiring 4001, so that the potentials of the nodes FG1 and FG2 are increased. When the potential of the node FG2 becomes "$V_{D1}-V_{th}$" with the increase in the potentials, $V_{gs}$ of the transistor 4100 becomes $V_{th}$, so that the current flow is stopped.

Next, operation of writing a data voltage to the data retention portion connected to the node FG2 (hereinafter referred to as writing operation 2) is described. In the following description, the data voltage written to the data retention portion connected to the node FG2 is referred to as $V_{D2}$.

In the writing operation 2, the wiring 4001 is set at $V_{D2}$, and after the wiring 4003 is set at a ground potential, the wiring 4003 is brought into an electrically floating state. The wiring 4007 is set at the high level. The wirings 4005, 4006, 4008, and 4009 are set at the low level. The transistor 4300 is turned on, so that the wiring 4003 is set at the low level. Thus, the potential of the node FG2 is also decreased to the low level, so that the current flows through the transistor 4100. By the current flow, the potential of the wiring 4003 is increased. The transistor 4300 is turned on. Thus, as the potential of the wiring 4003 is increased, the potential of the node FG2 is increased. When the potential of the node FG2 is increased and $V_{gs}$ of the transistor 4100 becomes $V_{th}$ of the transistor 4100, the current flowing through the transistor 4100 is decreased. Accordingly, the increase in the potentials of the wiring 4003 and the node FG2 is stopped, so that the potential of the node FG2 is fixed at "$V_{D2}-V_{th}$," which is lower than $V_{D2}$ by $V_{th}$.

In other words, when a current flows through the transistor 4100, $V_{D2}$ supplied to the wiring 4001 is supplied to the wiring 4003, so that the potential of the node FG2 is increased. When the potential of the node FG2 becomes "$V_{D2}-V_{th}$" with the increase in the potential, $V_{gs}$ of the transistor 4100 becomes $V_{th}$, so that the current flow is stopped. At this time, the transistors 4200 and 4400 are off and the potential of the node FG1 remains at "$V_{D1}-V_{th}$" written in the writing operation 1.

In the semiconductor device in FIG. 35, after data voltages are written to the plurality of data retention portions, the wiring 4009 is set at the high level, so that the potentials of the nodes FG1 and FG2 are increased. Then, the transistors are turned off to stop the movement of charge; thus, the written data voltages are retained.

By the above-described writing operations of the data voltages to the nodes FG1 and FG2, the data voltages can be retained in the plurality of data retention portions. Although examples where "$V_{D1}-V_{th}$" and "$V_{D2}-V_{th}$" are used as the written potentials are described, they are data voltages corresponding to multi-level data. Therefore, in the case where the data retention portions each retain 4-bit data, 16-level "$V_{D1}-V_{th}$" and 16-level "$V_{D2}-V_{th}$" can be obtained.

Next, operation of reading data from the semiconductor device illustrated in FIG. 35 is described.

First, operation of reading a data voltage from the data retention portion connected to the node FG2 (hereinafter referred to as reading operation 1) is described.

In the reading operation 1, the wiring 4003 which is brought into an electrically floating state after precharge is discharged. The wirings 4005 to 4008 are set at the low level. When the wiring 4009 is set at the low level, the potential of the node FG2 which is electrically floating is set at "$V_{D2}-V_{th}$". The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D2}$," which is higher than the potential "$V_{D2}-V_{th}$" of the node FG2 by Vth. The potential of the wiring 4003 corresponds to the data voltage of the data retention portion connected to the node FG2. The read analog data voltage is subjected to A/D conversion, so that data of the data retention portion connected to the node FG2 is obtained.

In other words, the wiring 4003 after precharge is brought into a floating state and the potential of the wiring 4009 is changed from the high level to the low level, whereby a current flows through the transistor 4100. When the current flows, the potential of the wiring 4003 which is in a floating state is decreased to be "$V_{D2}$." In the transistor 4100, $V_{gs}$ between "$V_{D2}-V_{th}$" of the node FG2 and "$V_{D2}$" of the wiring 4003 becomes $V_{th}$, so that the current stops. Then, "$V_{D2}$" written in the writing operation 2 is read to the wiring 4003.

After data in the data retention portion connected to the node FG2 is obtained, the transistor 4300 is turned on to discharge "$V_{D2}-V_{th}$" of the node FG2.

Then, the charges retained in the node FG1 are distributed between the node FG1 and the node FG2, so that data voltage in the data retention portion connected to the node FG1 is transferred to the data retention portion connected to the node FG2. The wirings 4001 and 4003 are set at the low level. The wiring 4006 is set the high level. The wiring 4005 and the wirings 4007 to 4009 are set at the low level. When the transistor 4200 is turned on, the charges in the node FG1 are distributed between the node FG1 and the node FG2.

Here, the potential after the charge distribution is decreased from the written potential "$V_{D1}-V_{th}$." Thus, the capacitance of the capacitor 4600 is preferably larger than the capacitance of the capacitor 4500. Alternatively, the potential "$V_{D1}-V_{th}$" written to the node FG1 is preferably higher than the potential "$V_{D2}-V_{th}$" corresponding to the same data. By changing the ratio of the capacitances and setting the written potential higher in advance as described above, a decrease in potential after the charge distribution can be suppressed. The change in potential due to the charge distribution is described later.

Next, operation of reading data voltage from the data retention portion connected to the node FG1 (hereinafter referred to as reading operation 2) is described.

In the reading operation 2, the wiring 4003 which is brought into an electrically floating state after precharge is discharged. The wirings 4005 to 4008 are set at the low level. The wiring 4009 is set at the high level at the time of precharge and then set at the low level. When the wiring 4009 is set at the low level, the node FG2 which is electrically floating is set at "$V_{D1}-V_{th}$." The potential of the node FG2 is decreased, so that a current flows through the transistor 4100. By the current flow, the potential of the wiring 4003 which is electrically floating is decreased. As the potential of the wiring 4003 is decreased, $V_{gs}$ of the transistor 4100 is decreased. When $V_{gs}$ of the transistor 4100 becomes $V_{th}$ of the transistor 4100, the current flowing through the transistor 4100 is decreased. In other words, the potential of the wiring 4003 becomes "$V_{D1}$," which is higher than the potential "$V_{D1}-V_{th}$" of the node FG2 by $V_{th}$. The potential of the wiring 4003 corresponds to the data voltage of the data retention portion connected to the node FG1. The read analog data voltage is subjected to A/D conversion, so that data of the data retention portion connected to the node FG1 is obtained. The above is the operation of reading the data voltage from the data retention portion connected to the node FG1.

In other words, the wiring 4003 after precharge is brought into a floating state and the potential of the wiring 4009 is changed from the high level to the low level, whereby a current flows through the transistor 4100. When the current flows, the potential of the wiring 4003 which is in a floating state is decreased to be "$V_{D1}$." In the transistor 4100, $V_{gs}$ between "$V_{D1}-V_{th}$" of the node FG2 and "$V_{D1}$" of the wiring 4003 becomes $V_{th}$, so that the current stops. Then, "$V_{D1}$" written in the writing operation 1 is read to the wiring 4003.

In the above-described reading operations of the data voltages from the nodes FG1 and FG2, the data voltages can be read from the plurality of data retention portions. For example, 4-bit (16-level) data is retained in each of the node FG1 and the node FG2, whereby 8-bit (256-level) data can be retained in total. Although first to third layers 4021 to 4023 are provided in the structure illustrated in FIG. 35, the storage capacity can be increased by adding layers without increasing the area of the semiconductor device.

Note that the read potential can be read as a voltage higher than the written data voltage by $V_{th}$. Therefore, $V_{th}$ of "$V_{D1}-V_{th}$" or $V_{th}$ of "$V_{D2}-V_{th}$" written in the writing operation can be canceled out in reading. As a result, the storage capacity per memory cell can be improved and read data can be close to accurate data; thus, the data reliability becomes excellent.

The structures described in this embodiment can be combined with any of the structures described in the other embodiments as appropriate.

(Embodiment 6)

In this embodiment, circuit configuration examples to which the OS transistors described in the above embodiment can be used are described with reference to FIGS. 36A to 36C, FIGS. 37A to 37C, FIGS. 38A and 38B, and FIGS. 39A and 39B.

Figure 36A:
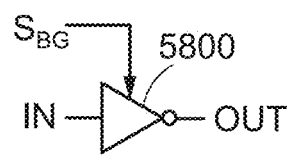
FIGS. 36A to 36C are circuit diagrams and a timing chart illustrating one embodiment of the present invention.

FIG. 36A is a circuit diagram of an inverter. An inverter 5800 outputs a signal whose logic is inverted from the logic of a signal supplied to an input terminal IN to an output terminal OUT. The inverter 5800 includes a plurality of OS transistors. A signal $S_{BG}$ can switch electrical characteristics of the OS transistors.

Figure 36B:
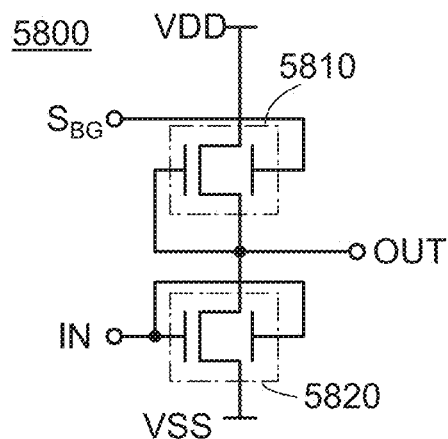

FIG. 36B illustrates an example of the inverter 5800. The inverter 5800 includes an OS transistor 5810 and an OS transistor 5820. The inverter 5800 can be formed using only n-channel transistors; thus, the inverter 5800 can be formed at lower cost than an inverter formed using a complementary metal oxide semiconductor (i.e., a CMOS inverter).

Note that the inverter 5800 including the OS transistors can be provided over a CMOS circuit including Si transistors. Since the inverter 5800 can be provided so as to overlap with the CMOS circuit, no additional area is required for the inverter 5800, and thus, an increase in the circuit area can be suppressed.

Each of the OS transistors 5810 and 5820 includes a first gate functioning as a front gate, a second gate functioning as a back gate, a first terminal functioning as one of a source and a drain, and a second terminal functioning as the other of the source and the drain.

The first gate of the OS transistor 5810 is connected to its second terminal. The second gate of the OS transistor 5810 is connected to a wiring that supplies the signal $S_{BG}$. The first terminal of the OS transistor 5810 is connected to a wiring that supplies a voltage VDD. The second terminal of the OS transistor 5810 is connected to the output terminal OUT.

The first gate of the OS transistor 5820 is connected to the input terminal IN. The second gate of the OS transistor 5820 is connected to the input terminal IN. The first terminal of the OS transistor 5820 is connected to the output terminal OUT. The second terminal of the OS transistor 5820 is connected to a wiring that supplies a voltage VSS.

Figure 36C:
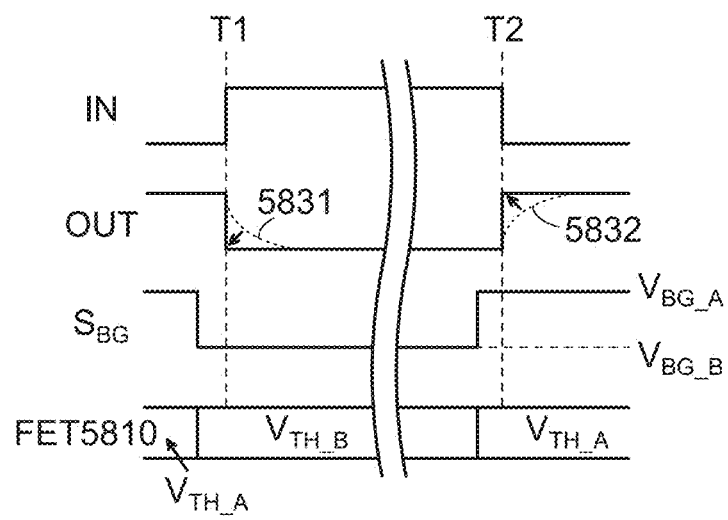

FIG. 36C is a timing chart illustrating the operation of the inverter 5800. The timing chart in FIG. 36C illustrates changes of a signal waveform of the input terminal IN, a signal waveform of the output terminal OUT, a signal waveform of the signal $S_{BG}$, and the threshold voltage of the OS transistor 5810 (FET 5810).

The signal $S_{BG}$ can be supplied to the second gate of the OS transistor 5810 to control the threshold voltage of the OS transistor 5810.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 5810 can be shifted in the negative direction to be a threshold voltage $V_{TH\_A}$ when the voltage $V_{BG\_A}$ is applied to the second gate. The threshold voltage of the OS transistor 5810 can be shifted in the positive direction to be a threshold voltage $V_{TH\_B}$ when the voltage $V_{BG\_B}$ is applied to the second gate.

Figure 37A:
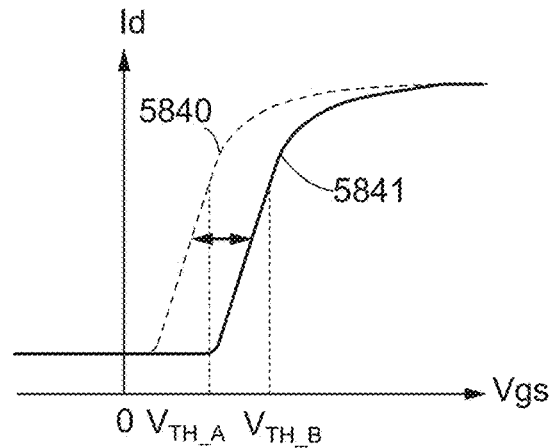
FIGS. 37A to 37C are a graph and circuit diagrams illustrating one embodiment of the present invention.

To visualize the above description, FIG. 37A shows a $V_g$-$I_d$ curve, which is one of indicators of the transistor's electrical characteristics.

When a high voltage such as the voltage $V_{BG\_A}$ is applied to the second gate, the electrical characteristics of the OS transistor 5810 can be shifted to match a curve shown by a dashed line 5840 in FIG. 37A. When a low voltage such as the voltage $V_{BG\_B}$ is applied to the second gate, the electrical characteristics of the OS transistor 5810 can be shifted to match a curve shown by a solid line 5841 in FIG. 37A. As shown in FIG. 37A, switching the signal $S_{BG}$ between the voltage $V_{BG\_A}$ and the voltage $V_{BG\_B}$ enables the threshold voltage of the OS transistor 5810 to be shifted in the negative direction or the positive direction.

Figure 37B:
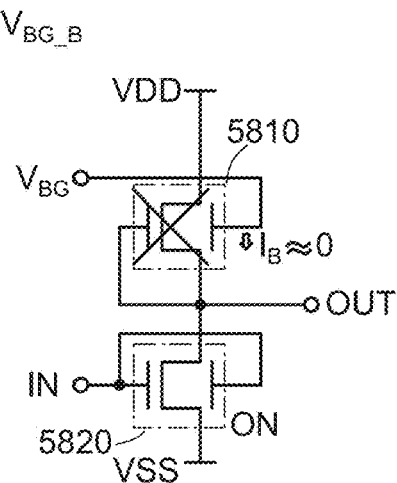

The shift of the threshold voltage in the positive direction to the threshold voltage $V_{TH\_B}$ can make a current less likely to flow in the OS transistor 5810. FIG. 37B visualizes the state. As illustrated in FIG. 37B, a current h that flows in the OS transistor 5810 can be extremely low. Thus, when a signal supplied to the input terminal IN is at a high level and the OS transistor 5820 is on (ON), the voltage of the output terminal OUT can be sharply decreased.

Since a state in which a current is less likely to flow in the OS transistor 5810 as illustrated in FIG. 37B can be obtained, a signal waveform 5831 of the output terminal in the timing chart in FIG. 36C can be made steep. Shoot-through current between the wiring that supplies the voltage VDD and the wiring that supplies the voltage VSS can be low, leading to low-power operation.

Figure 37C:
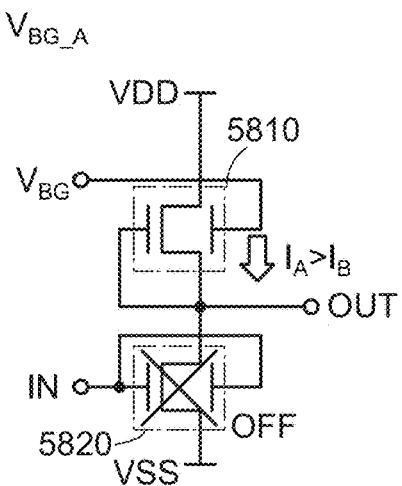

The shift of the threshold voltage in the negative direction to the threshold voltage $V_{TH\_A}$ can make a current flow easily in the OS transistor 5810. FIG. 37C visualizes the state. As illustrated in FIG. 37C, a current $I_A$ flowing at this time can be higher than at least the current $I_B$. Thus, when a signal supplied to the input terminal IN is at a low level and the OS transistor 5820 is off (OFF), the voltage of the output terminal OUT can be increased sharply.

Since a state in which a current is likely to flow in the OS transistor 5810 as illustrated in FIG. 37C can be obtained, a signal waveform 5832 of the output terminal in the timing chart in FIG. 36C can be made steep.

Note that the threshold voltage of the OS transistor 5810 is preferably controlled by the signal $S_{BG}$ before the state of the OS transistor 5820 is switched, i.e., before time T1 or time T2. For example, as in FIG. 36C, it is preferable that the threshold voltage of the OS transistor 5810 be switched from the threshold voltage $V_{TH\_A}$ to the threshold voltage $V_{TH\_B}$ before time T1 at which the level of the signal supplied to the input terminal IN is switched to the high level. Moreover, as in FIG. 36C, it is preferable that the threshold voltage of the OS transistor 5810 be switched from the threshold voltage $V_{TH\_B}$ to the threshold voltage $V_{TH\_A}$ before time T2 at which the level of the signal supplied to the input terminal IN is switched to the low level.

Figure 38A:
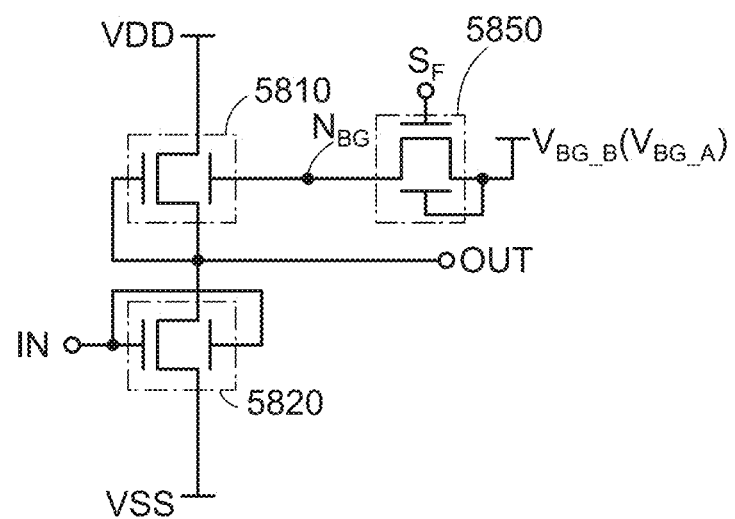
FIGS. 38A and 38B are a circuit diagram and a timing chart illustrating one embodiment of the present invention.

Although the timing chart in FIG. 36C illustrates the configuration in which the level of the signal $S_{BG}$ is switched in accordance with the signal supplied to the input terminal IN, a different configuration may be employed in which voltage for controlling the threshold voltage is held by the second gate of the OS transistor 5810 in a floating state, for example. FIG. 38A illustrates an example of such a circuit configuration.

The circuit configuration in FIG. 38A is the same as that in FIG. 36B, except that an OS transistor 5850 is added. A first terminal of the OS transistor 5850 is connected to the second gate of the OS transistor 5810. A second terminal of the OS transistor 5850 is connected to a wiring that supplies the voltage $V_{BG\_B}$ (or the voltage $V_{BG\_A}$). A first gate of the OS transistor 5850 is connected to a wiring that supplies a signal $S_F$. A second gate of the OS transistor 5850 is connected to the wiring that supplies the voltage $V_{BG\_B}$ (or the voltage $V_{BG\_A}$).

Figure 38B:
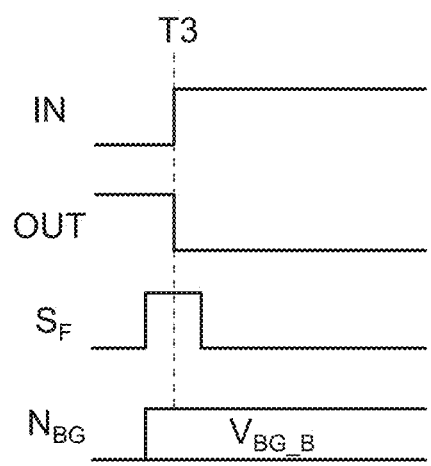

The operation with the circuit configuration in FIG. 38A is described with reference to a timing chart in FIG. 38B.

The voltage for controlling the threshold voltage of the OS transistor 5810 is supplied to the second gate of the OS transistor 5810 before time T3 at which the level of the signal supplied to the input terminal IN is switched to a high level. The signal $S_F$ is set to a high level and the OS transistor 5850 is turned on, so that the voltage $V_{BG\_B}$ for controlling the threshold voltage is supplied to a node $N_{BG}$.

The OS transistor 5850 is turned off after the voltage of the node $N_{BG}$ becomes $V_{BG\_B}$. Since the off-state current of the OS transistor 5850 is extremely low, the voltage $V_{BG\_B}$ held by the node $N_{BG}$ can be retained while the OS transistor 5850 remains off and the node $N_{BG}$ is in a state that is very close to a floating state. Therefore, the number of times the voltage $V_{BG\_B}$ is supplied to the second gate of the OS transistor 5850 can be reduced and accordingly, the power consumption for rewriting the voltage $V_{BG\_B}$ can be reduced.

Figure 39A:
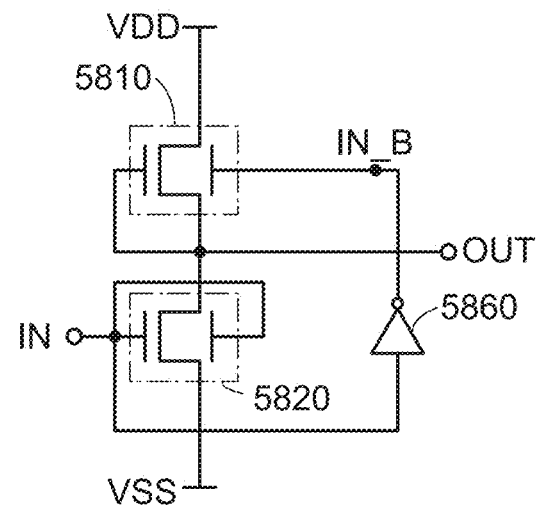
FIGS. 39A and 39B are a circuit diagram and a timing chart illustrating one embodiment of the present invention.

Although FIG. 36B and FIG. 38A each illustrate the configuration where the voltage is supplied to the second gate of the OS transistor 5810 by control from the outside, a different configuration may be employed in which voltage for controlling the threshold voltage is generated on the basis of the signal supplied to the input terminal IN and supplied to the second gate of the OS transistor 5810, for example. FIG. 39A illustrates an example of such a circuit configuration.

The circuit configuration in FIG. 39A is the same as that in FIG. 36B, except that a CMOS inverter 5860 is provided between the input terminal IN and the second gate of the OS transistor 5810. An input terminal of the CMOS inverter 5860 is connected to the input terminal IN. An output terminal of the CMOS inverter 5860 is connected to the second gate of the OS transistor 5810.

The operation with the circuit configuration in FIG. 39A is described with reference to a timing chart in FIG. 39B. The timing chart in FIG. 39B illustrates changes of a signal waveform of the input terminal IN, a signal waveform of the output terminal OUT, an output waveform IN_B of the CMOS inverter 5860, and the threshold voltage of the OS transistor 5810 (FET 5810).

The output waveform IN_B which corresponds to a signal whose logic is inverted from the logic of the signal supplied to the input terminal IN can be used as a signal that controls the threshold voltage of the OS transistor 5810. Thus, the threshold voltage of the OS transistor 5810 can be controlled as described with reference to FIGS. 36A to 36C. For example, the signal supplied to the input terminal IN is at a high level and the OS transistor 5820 is turned on at time T4 in FIG. 39B. At this time, the output waveform IN_B is at a low level. Accordingly, a current can be made less likely to flow in the OS transistor 5810; thus, the voltage of the output terminal OUT can be sharply decreased.

Figure 39B:
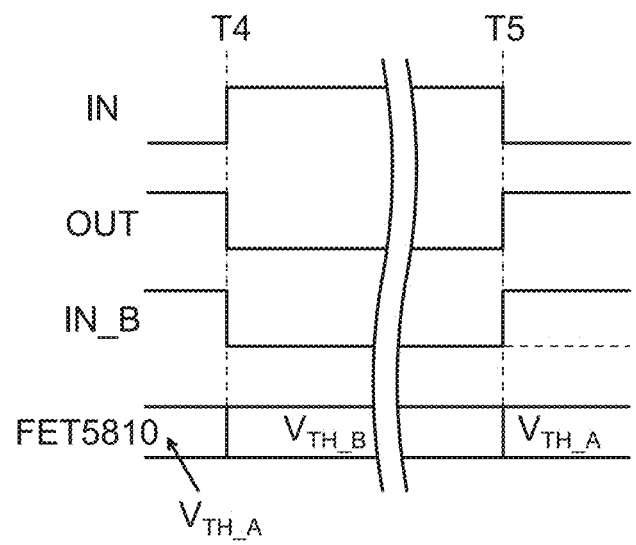

Moreover, the signal supplied to the input terminal IN is at a low level and the OS transistor 5820 is turned off at time T5 in FIG. 39B. At this time, the output waveform IN_B is at a high level. Accordingly, a current can easily flow in the OS transistor 5810; thus, the voltage of the output terminal OUT can be sharply increased.

As described above, in the configuration of the inverter including the OS transistor in this embodiment, the voltage of the back gate is switched in accordance with the logic of the signal supplied to the input terminal IN. In such a configuration, the threshold voltage of the OS transistor can be controlled. The control of the threshold voltage of the OS transistor by the signal supplied to the input terminal IN can cause a steep change in the voltage of the output terminal OUT. Moreover, shoot-through current between the wirings that supply power supply voltages can be reduced. Thus, power consumption can be reduced.

The structures described in this embodiment can be combined with any of the structures described in the other embodiments as appropriate.

(Embodiment 7)

In this embodiment, examples of a semiconductor device which includes a plurality of circuits including OS transistors described in the above embodiment are described with reference to FIGS. 40A to 40E, FIGS. 41A and 41B, FIGS. 42A and 42B, FIGS. 43A to 43C, FIGS. 44A and 44B, FIGS. 45A to 45C, and FIGS. 46A and 46B.

Figure 40A:
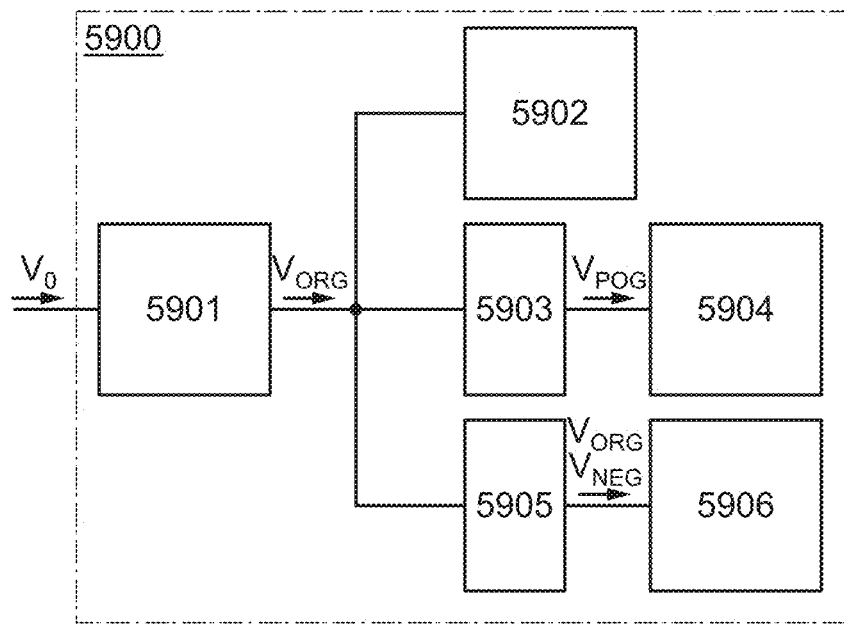
FIGS. 40A to 40E are a block diagram, circuit diagrams, and waveform charts illustrating one embodiment of the present invention.

FIG. 40A is a block diagram of a semiconductor device 5900. The semiconductor device 5900 includes a power supply circuit 5901, a circuit 5902, a voltage generation circuit 5903, a circuit 5904, a voltage generation circuit 5905, and a circuit 5906.

The power supply circuit 5901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage Vo supplied from the outside of the semiconductor device 5900. The semiconductor device 5900 can generate the voltage $V_{ORG}$ on the basis of one power supply voltage supplied from the outside. Thus, the semiconductor device 5900 can operate without the supply of a plurality of power supply voltages from the outside.

The circuits 5902, 5904, and 5906 operate with different power supply voltages. For example, the power supply voltage of the circuit 5902 is a voltage applied on the basis of the voltage $V_{ORG}$ and the voltage $V_{SS}$ ($V_{ORG}$>$V_{SS}$). For example, the power supply voltage of the circuit 5904 is a voltage applied on the basis of a voltage $V_{POG}$ and the voltage $V_{SS}$ ($V_{POG}$>$V_{ORG}$). For example, the power supply voltages of the circuit 5906 are voltages applied on the basis of the voltage $V_{ORG}$, the voltage $V_{SS}$, and a voltage $V_{NEG}$ ($V_{ORG}$>$V_{SS}$>$V_{NEG}$). When the voltage $V_{SS}$ is equal to a ground potential (GND), the kinds of voltages generated in the power supply circuit 5901 can be reduced.

The voltage generation circuit 5903 is a circuit that generates the voltage $V_{POG}$. The voltage generation circuit 5903 can generate the voltage $V_{POG}$ on the basis of the voltage $V_{ORG}$ supplied from the power supply circuit 5901. Thus, the semiconductor device 5900 including the circuit 5904 can operate on the basis of one power supply voltage supplied from the outside.

The voltage generation circuit 5905 is a circuit that generates the voltage $V_{NEG}$. The voltage generation circuit 5905 can generate the voltage $V_{NEG}$ on the basis of the voltage $V_{ORG}$ supplied from the power supply circuit 5901.

Thus, the semiconductor device 5900 including the circuit 5906 can operate on the basis of one power supply voltage supplied from the outside.

Figure 40B:
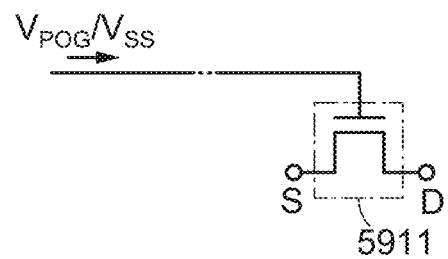
Figure 40C:
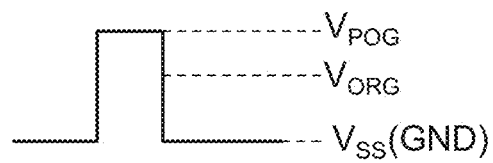

FIG. 40B illustrates an example of the circuit 5904 that operates with the voltage $V_{POG}$ and FIG. 40C illustrates an example of a waveform of a signal for operating the circuit 5904.

FIG. 40B illustrates a transistor 5911. A signal supplied to a gate of the transistor 5911 is generated on the basis of, for example, the voltage $V_{POG}$ and the voltage $V_{SS}$. The signal is generated on the basis of the voltage $V_{POG}$ at the time when the transistor 5911 is turned on and on the basis of the voltage $V_{SS}$ at the time when the transistor 5911 is turned off. As shown in FIG. 40C, the voltage $V_{POG}$ is higher than the voltage $V_{ORG}$. Therefore, a conducting state between a source (S) and a drain (D) of the transistor 5911 can be obtained more surely. As a result, the frequency of malfunction of the circuit 5904 can be reduced.

Figure 40D:
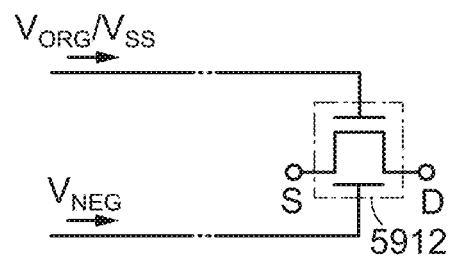
Figure 40E:
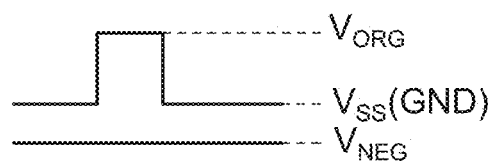

FIG. 40D illustrates an example of the circuit 5906 that operates with the voltage $V_{NEG}$ and FIG. 40E illustrates an example of a waveform of a signal for operating the circuit 5906.

FIG. 40D illustrates a transistor 5912 having a back gate. A signal supplied to a gate of the transistor 5912 is generated on the basis of, for example, the voltage $V_{ORG}$ and the voltage $V_{SS}$. The signal is generated on the basis of the voltage $V_{ORG}$ at the time when the transistor 5911 is turned on and on the basis of the voltage $V_{SS}$ at the time when the transistor 5911 is turned off. A signal supplied to the back gate of the transistor 5912 is generated on the basis of the voltage $V_{NEG}$. As shown in FIG. 40E, the voltage $V_{NEG}$ is lower than the voltage $V_{SS}$ (GND). Therefore, the threshold voltage of the transistor 5912 can be controlled so as to be shifted in the positive direction. Thus, the transistor 5912 can be surely turned off and a current flowing between a source (S) and a drain (D) can be reduced. As a result, the frequency of malfunction of the circuit 5906 can be reduced and power consumption thereof can be reduced.

The voltage $V_{NEG}$ may be directly supplied to the back gate of the transistor 5912. Alternatively, a signal supplied to the gate of the transistor 5912 may be generated on the basis of the voltage $V_{ORG}$ and the voltage $V_{NEG}$ and the generated signal may be supplied to the back gate of the transistor 5912.

Figure 41A:
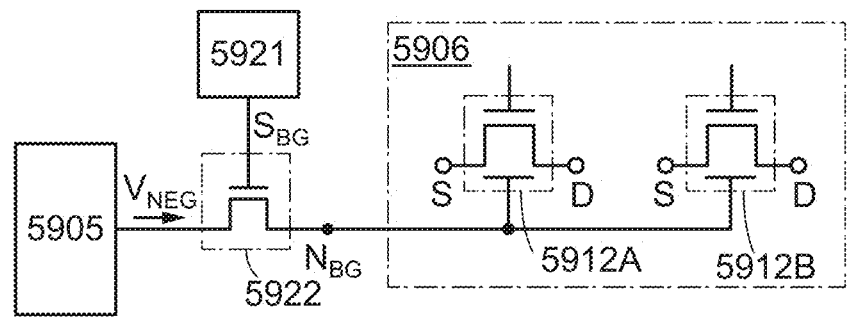
FIGS. 41A and 41B are a circuit diagram and a timing chart illustrating one embodiment of the present invention.
Figure 41B:
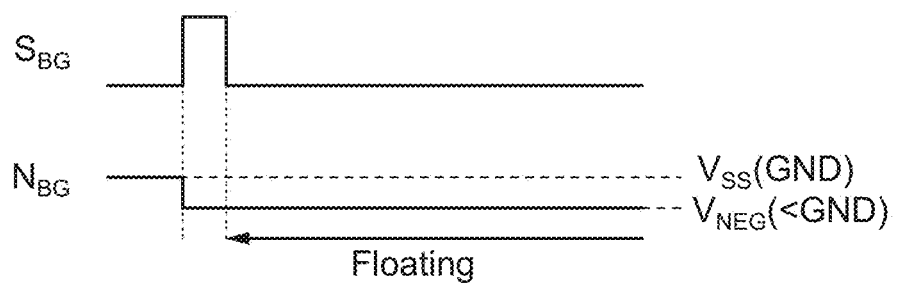

FIGS. 41A and 41B illustrate a modification example of FIGS. 40D and 40E.

In a circuit diagram illustrated in FIG. 41A, a transistor 5922 whose conduction state can be controlled by a control circuit 5921 is provided between the voltage generation circuit 5905 and the circuit 5906. The transistor 5922 is an n-channel OS transistor. The control signal $S_{BG}$ output from the control circuit 5921 is a signal for controlling the conduction state of the transistor 5922. Transistors 5912A and 5912B included in the circuit 5906 are the same OS transistors as the transistor 5922.

A timing chart in FIG. 41B shows changes in a potential of the control signal $S_{BG}$ and a potential of the node $N_{BG}$. The potential of the node $N_{BG}$ indicates the states of potentials of back gates of the transistors 5912A and 5912B. When the control signal $S_{BG}$ is at a high level, the transistor 5922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 5922 is an OS transistor, its off-state current is low. Accordingly, even when the node $N_{BG}$ is in an electrically floating state, the voltage $V_{NEG}$ which has been supplied can be held.

Figure 42A:
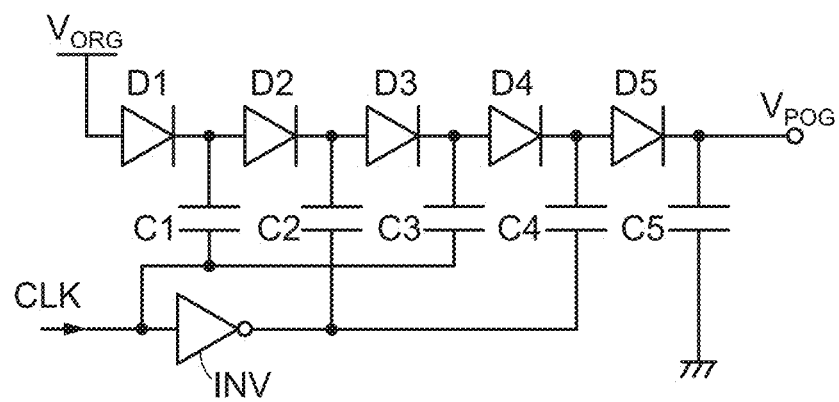
FIGS. 42A and 42B are circuit diagrams each illustrating one embodiment of the present invention.

FIG. 42A illustrates an example of a circuit configuration applicable to the above-described voltage generation circuit 5903. The voltage generation circuit 5903 illustrated in FIG. 42A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$, which has been increased to a positive voltage having a positively quintupled value of the voltage $V_{ORG}$ by application of the clock signal CLK, can be obtained. Note that a forward voltage of the diodes D1 to D5 is 0 V. A desired voltage $V_{POG}$ can be obtained when the number of stages of the charge pump is changed.

Figure 42B:
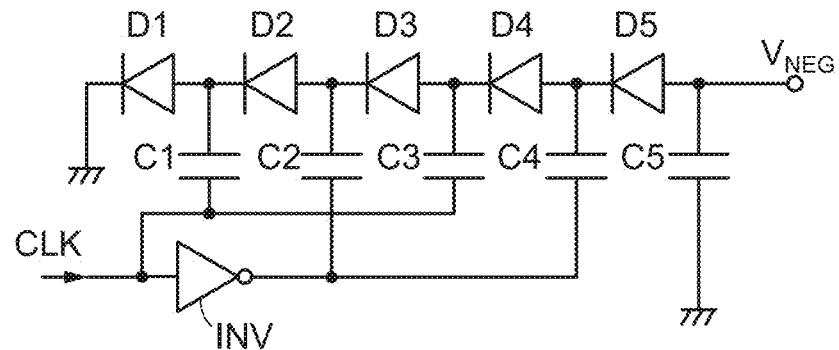

FIG. 42B illustrates an example of a circuit configuration applicable to the above-described voltage generation circuit 5905. The voltage generation circuit 5905 illustrated in FIG. 42B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$, which has been reduced from GND (i.e., the voltage $V_{SS}$) to a negative voltage having a negatively quadrupled value of the voltage $V_{ORG}$ by application of the clock signal CLK, can be obtained. Note that a forward voltage of the diodes D1 to D5 is 0V. A desired voltage $V_{NEG}$ can be obtained when the number of stages of the charge pump is changed.

The circuit configuration of the voltage generation circuit 5903 is not limited to the configuration of the circuit diagram illustrated in FIG. 42A. Modification examples of the voltage generation circuit 5903 are shown in FIGS. 43A to 43C and FIGS. 44A and 44B.

Figure 43A:
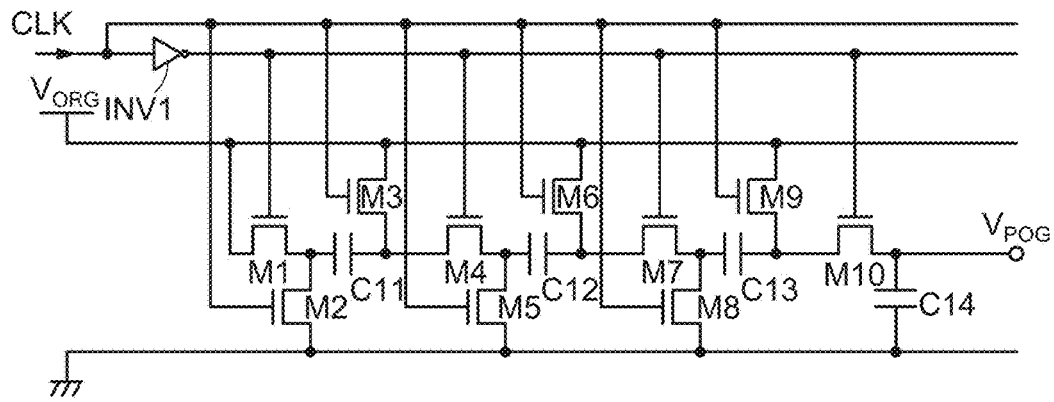
FIGS. 43A to 43C are circuit diagrams each illustrating one embodiment of the present invention.

A voltage generation circuit 5903A illustrated in FIG. 43A includes transistors M1 to M10, capacitors C11 to C14, and an inverter INV1. The clock signal CLK is supplied to gates of the transistors M1 to M10 directly or through the inverter INV1. By application of the clock signal CLK, the voltage $V_{POG}$, which has been increased to a positive voltage having a positively quadrupled value of the voltage $V_{ORG}$, can be obtained. A desired voltage $V_{POG}$ can be obtained when the number of stages is changed. In the voltage generation circuit 5903A in FIG. 43A, the off-state current of each of the transistors M1 to M10 can be low when the transistors M1 to M10 are OS transistors, and leakage of charge held in the capacitors C11 to C14 can be inhibited. Accordingly, efficient voltage increase from the voltage $V_{ORG}$ to the voltage $V_{POG}$ is possible.

Figure 43B:
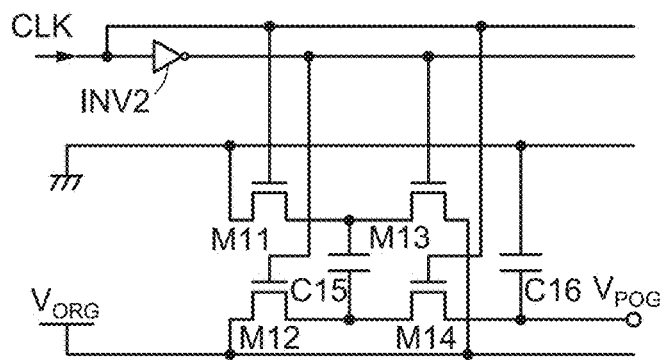

A voltage generation circuit 5903B illustrated in FIG. 43B includes transistors M11 to M14, capacitors C15 and C16, and an inverter INV2. The clock signal CLK is supplied to gates of the transistors M11 to M14 directly or through the inverter INV2. By application of the clock signal CLK, the voltage $V_{POG}$, which has been increased to a positive voltage having a positively doubled value of the voltage $V_{ORG}$, can be obtained. In the voltage generation circuit 5903B in FIG. 43B, the off-state current of each of the transistors M11 to M14 can be low when the transistors M11 to M14 are OS transistors, and leakage of charge held in the capacitors C15 and C16 can be inhibited. Accordingly, efficient voltage increase from the voltage $V_{ORG}$ to the voltage $V_{POG}$ is possible.

Figure 43C:
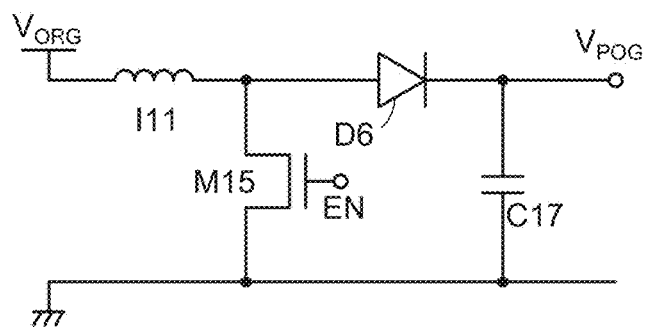

A voltage generation circuit 5903C in FIG. 43C includes an inductor Il1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 5903C in FIG. 43C increases the voltage using the inductor I11, the voltage can be increased efficiently.

Figure 44A:
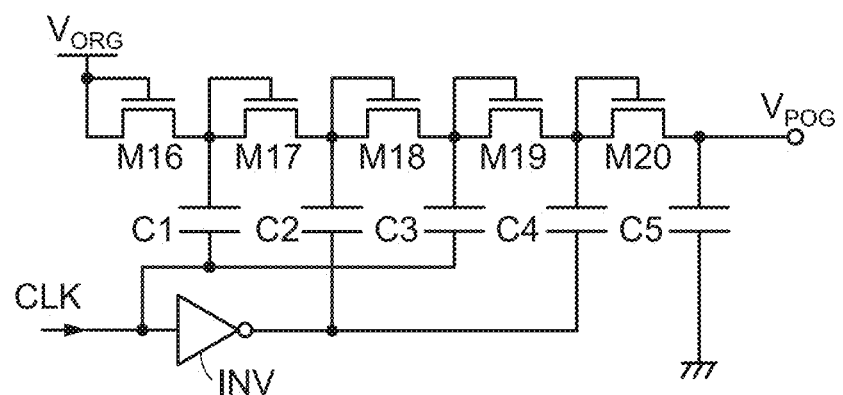
FIGS. 44A and 44B are circuit diagrams each illustrating one embodiment of the present invention.

A voltage generation circuit 5903D in FIG. 44A has a configuration in which the diodes D1 to D5 of the voltage generation circuit 5903 in FIG. 42A are replaced with diode-connected transistors M16 to M20. In the voltage generation circuit 5903D in FIG. 44A, the off-state current of each of the transistors M16 to M20 can be low when the transistors M16 to M20 are OS transistors, and leakage of charge held in the capacitors C1 to C5 can be inhibited. Thus, efficient voltage increase from the voltage $V_{ORG}$ to the voltage $V_{POG}$ is possible.

Figure 44B:
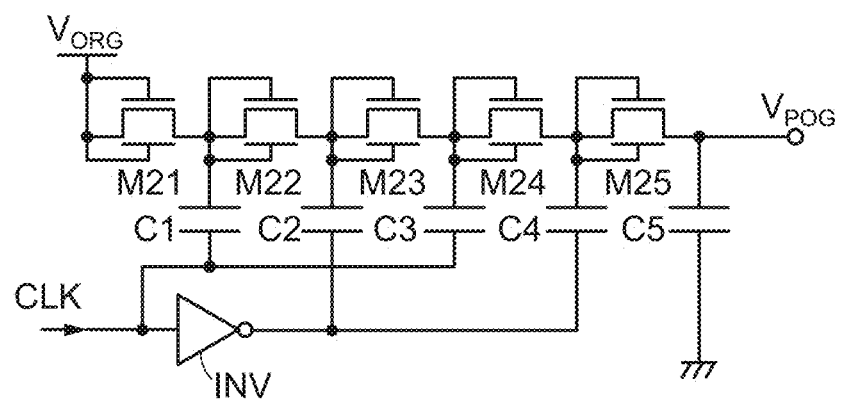
Figure 45A:
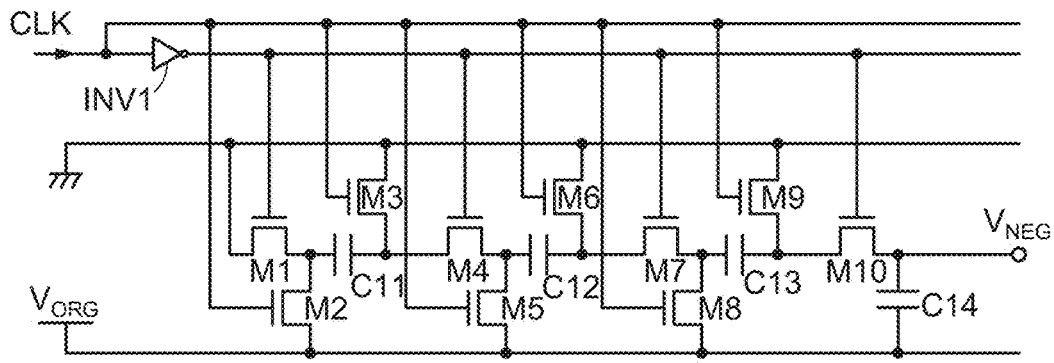
FIGS. 45A to 45C are circuit diagrams each illustrating one embodiment of the present invention.
Figure 45B:
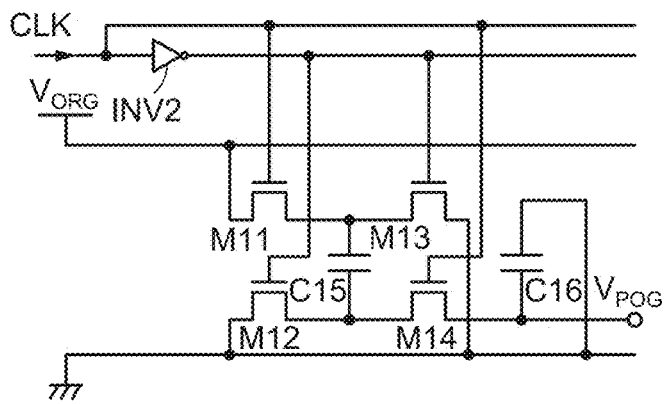
Figure 45C:
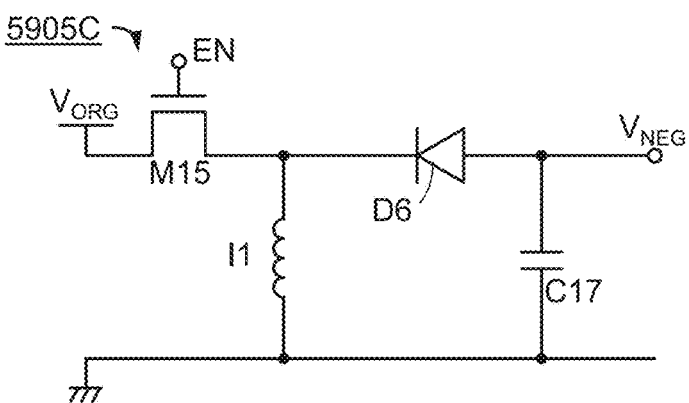
Figure 46A:
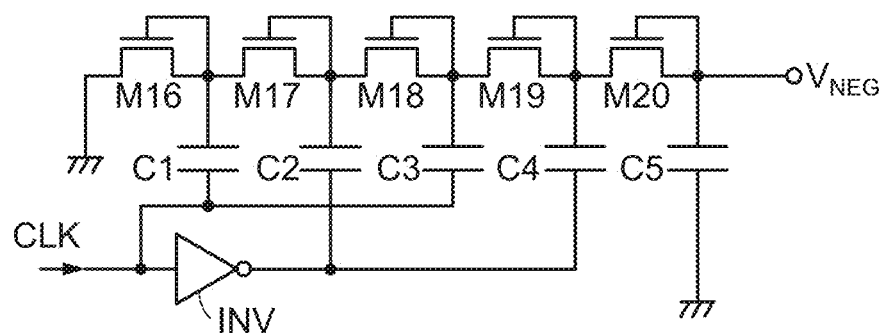
FIGS. 46A and 46B are circuit diagrams each illustrating one embodiment of the present invention.
Figure 46B:
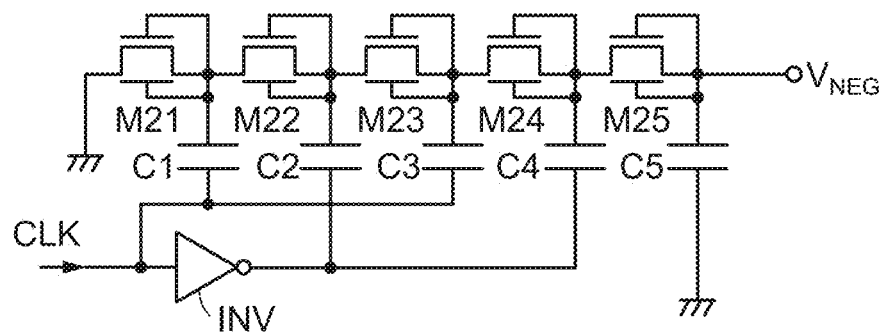

A voltage generation circuit 5903E in FIG. 44B has a configuration in which the transistors M16 to M20 of the voltage generation circuit 5903D in FIG. 44A are replaced with transistor M21 to M25 having back gates. In the voltage generation circuit 5903E in FIG. 44B, the back gates can be supplied with voltages that are the same as those of the gates, so that the current flowing through the transistors can be increased. Thus, efficient voltage increase from the voltage $V_{ORG}$ to the voltage $V_{POG}$ is possible.

Note that the modification examples of the voltage generation circuit 5903 can also be applied to the voltage generation circuit 5905 in FIG. 42B. The configurations of a circuit diagram in this case are illustrated in FIGS. 45A to 45C and FIGS. 46A and 46B. In a voltage generation circuit 5905A illustrated in FIG. 45A, the voltage $V_{NEG}$ which has been reduced from the voltage $V_{SS}$ to a negative voltage having a negatively tripled value of the voltage $V_{ORG}$ by application of the clock signal CLK can be obtained. In a voltage generation circuit 5905B illustrated in FIG. 45B, the voltage $V_{NEG}$ which has been reduced from the voltage $V_{SS}$ to a negative voltage having a negatively doubled value of the voltage $V_{ORG}$ by application of the clock signal CLK can be obtained.

The voltage generation circuits 5905A and 5905B and voltage generation circuits 5905C to 5905E illustrated in FIGS. 45A to 45C and FIGS. 46A and 46B have configurations formed by changing the voltages applied to the wirings or the arrangement of the elements of the voltage generation circuits 5903A to 5903E illustrated in FIGS. 43A to 43C and FIGS. 44A and 44B. In the voltage generation circuits 5905A to 5905E illustrated in FIGS. 45A to 45C and FIGS. 46A and 46B, as in the voltage generation circuits 5903A to 5903E, efficient voltage decrease from the voltage $V_{SS}$ to the voltage $V_{NEG}$ is possible.

As described above, in any of the structures of this embodiment, a voltage required for circuits included in a semiconductor device can be internally generated. Thus, in the semiconductor device, the kinds of power supply voltages supplied from the outside can be reduced.

The structures described in this embodiment can be combined with any of the structures described in the other embodiments as appropriate.

(Embodiment 8)

In this embodiment, examples of CPUs including semiconductor devices such as the transistor of one embodiment of the present invention and the above-described memory device will be described.

<Configuration of CPU>

Figure 47:
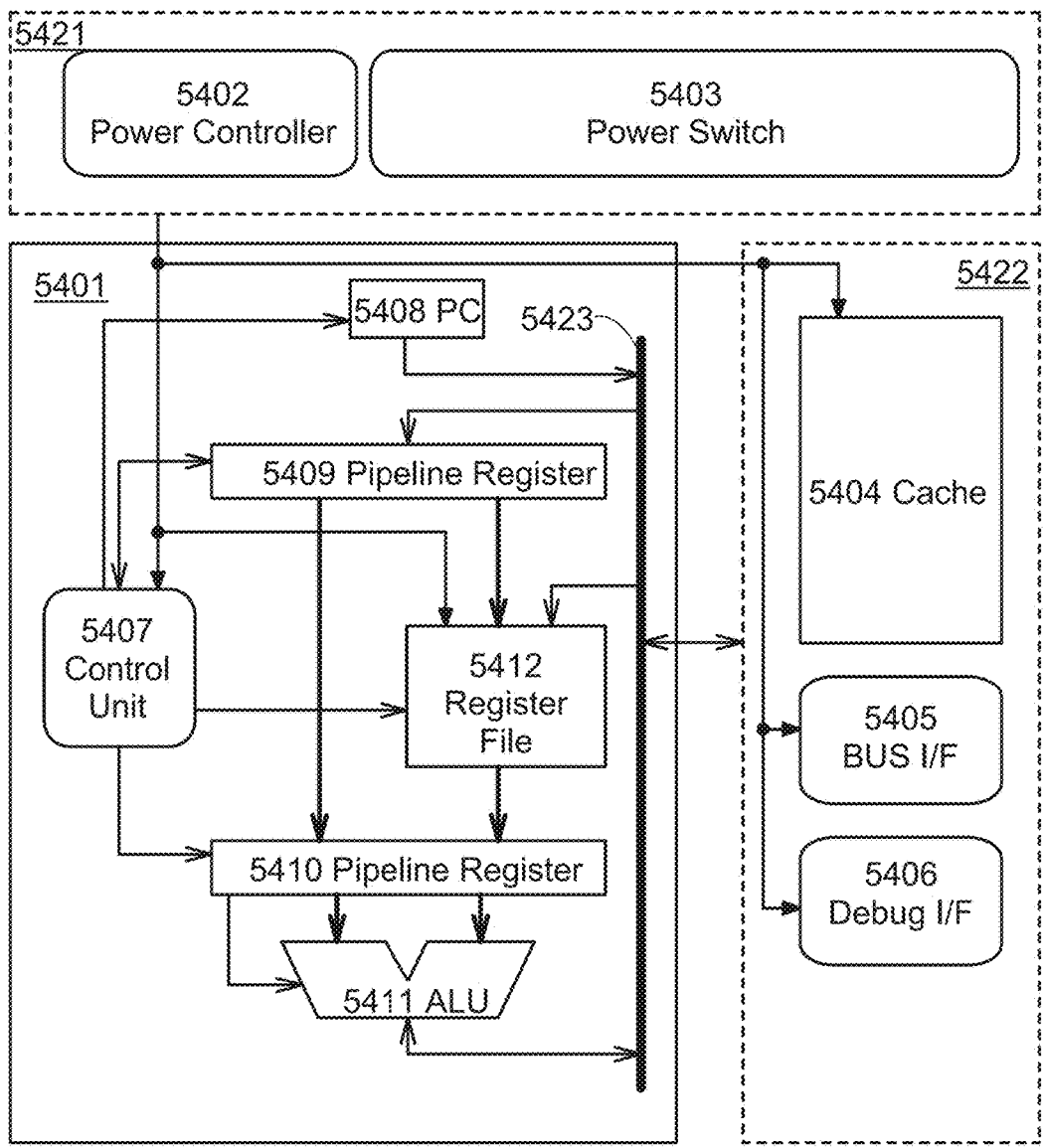
FIG. 47 is a block diagram illustrating a semiconductor device of one embodiment of the present invention.

A semiconductor device 5400 shown in FIG. 47 includes a CPU core 5401, a power management unit 5421, and a peripheral circuit 5422. The power management unit 5421 includes a power controller 5402 and a power switch 5403.

The peripheral circuit 5422 includes a cache 5404 including cache memory, a bus interface (BUS I/F) 5405, and a debug interface (Debug I/F) 5406. The CPU core 5401 includes a data bus 5423, a control unit 5407, a PC (program counter) 5408, a pipeline register 5409, a pipeline register 5410, an ALU (arithmetic logic unit) 5411, and a register file 5412. Data is transmitted between the CPU core 5401 and the peripheral circuit 5422 such as the cache 5404 via the data bus 5423.

The semiconductor device (cell) can be used for many logic circuits typified by the power controller 5402 and the control unit 5407, particularly for all logic circuits that can be constituted using standard cells. Accordingly, the semiconductor device 5400 can be small. The semiconductor device 5400 can have reduced power consumption. The semiconductor device 5400 can have a higher operating speed. The semiconductor device 5400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is used in the semiconductor device 5400, the semiconductor device 5400 can be small. The semiconductor device 5400 can have reduced power consumption. The semiconductor device 5400 can have a higher operating speed. Particularly when the Si transistors are only p-channel ones, the manufacturing cost can be reduced.

The control unit 5407 has functions of decoding and executing instructions contained in a program such as inputted applications by controlling the overall operations of the PC 5408, the pipeline registers 5409 and 5410, the ALU 5411, the register file 5412, the cache 5404, the bus interface 5405, the debug interface 5406, and the power controller 5402.

The ALU 5411 has a function of performing a variety of arithmetic operations such as four arithmetic operations and logic operations.

The cache 5404 has a function of temporarily storing frequently used data. The PC 5408 is a register having a function of storing an address of an instruction to be executed next. Note that although not shown in FIG. 47, the cache 5404 is provided with a cache controller for controlling the operation of the cache memory.

The pipeline register 5409 has a function of temporarily storing instruction data.

The register file 5412 includes a plurality of registers including a general purpose register and can store data that is read from the main memory, data obtained as a result of arithmetic operations in the ALU 5411, or the like.

The pipeline register 5410 has a function of temporarily storing data used for arithmetic operations of the ALU 5411, data obtained as a result of arithmetic operations of the ALU 5411, or the like.

The bus interface 5405 has a function of a path for data between the semiconductor device 5400 and various devices outside the semiconductor device 5400. The debug interface 5406 has a function of a path of a signal for inputting an instruction to control debugging to the semiconductor device 5400.

The power switch 5403 has a function of controlling supply of a power supply voltage to various circuits included in the semiconductor device 5400 other than the power controller 5402. The above various circuits belong to several different power domains. The power switch 5403 controls whether the power supply voltage is supplied to the various circuits in the same power domain. In addition, the power controller 5402 has a function of controlling the operation of the power switch 5403.

The semiconductor device 5400 having the above structure is capable of performing power gating. A description will be given of an example of the power gating operation sequence.

First, by the CPU core 5401, timing for stopping the supply of the power supply voltage is set in a register of the power controller 5402. Then, an instruction of starting power gating is sent from the CPU core 5401 to the power controller 5402. Then, various registers and the cache 5404 included in the semiconductor device 5400 start data saving. Then, the power switch 5403 stops the supply of a power supply voltage to the various circuits other than the power controller 5402 included in the semiconductor device 5400. Then, an interrupt signal is input to the power controller 5402, whereby the supply of the power supply voltage to the various circuits included in the semiconductor device 5400 is started. Note that a counter may be provided in the power controller 5402 to be used to determine the timing of starting the supply of the power supply voltage regardless of input of an interrupt signal. Next, the various registers and the cache 5404 start data restoration. Then, execution of an instruction is resumed in the control unit 5407.

Such power gating can be performed in the whole processor or one or a plurality of logic circuits included in the processor. Furthermore, power supply can be stopped even for a short time. Consequently, power consumption can be reduced at a fine spatial or temporal granularity.

In performing power gating, data held by the CPU core 5401 or the peripheral circuit 5422 is preferably saved in a short time. In that case, the power can be turned on or off in a short time, and an effect of saving power becomes significant.

In order that the data held by the CPU core 5401 or the peripheral circuit 5422 be saved in a short time, the data is preferably saved in a flip-flop circuit itself (referred to as a flip-flop circuit capable of backup operation). Furthermore, the data is preferably saved in an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can save and restore data in a short time in some cases.

An example of the flip-flop circuit capable of backup operation is described with reference to FIG. 48.

Figure 48:
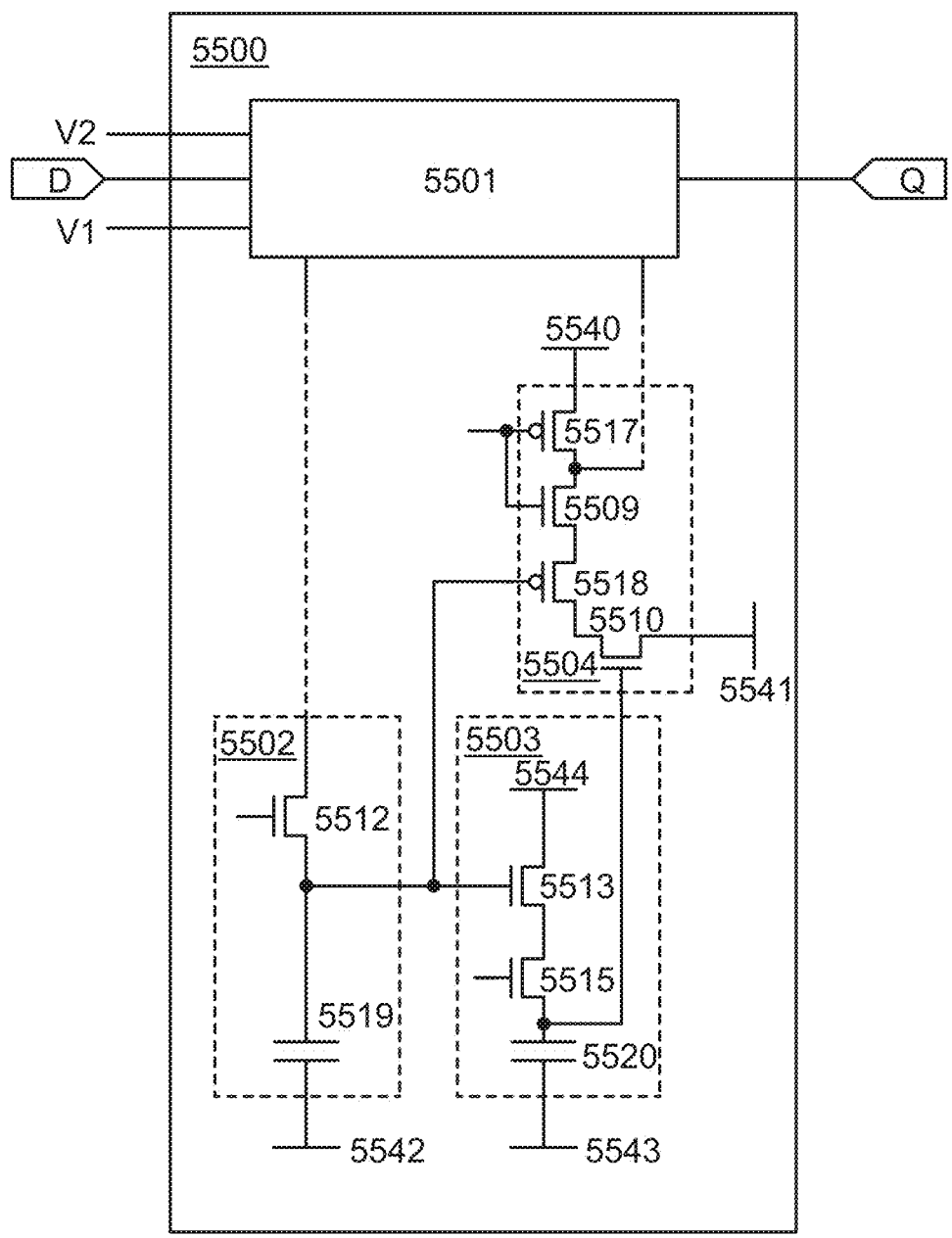
FIG. 48 is a circuit diagram illustrating a semiconductor device of one embodiment of the present invention.

A semiconductor device 5500 shown in FIG. 48 is an example of the flip-flop circuit capable of backup operation. The semiconductor device 5500 includes a first memory circuit 5501, a second memory circuit 5502, a third memory circuit 5503, and a read circuit 5504. As a power supply voltage, a potential difference between a potential V1 and a potential V2 is supplied to the semiconductor device 5500. One of the potential V1 and the potential V2 is at a high level, and the other is at a low level. An example of the structure of the semiconductor device 5500 when the potential V1 is at a low level and the potential V2 is at a high level will be described below.

The first memory circuit 5501 has a function of retaining data when a signal D including the data is input in a period during which the power supply voltage is supplied to the semiconductor device 5500. Furthermore, the first memory circuit 5501 outputs a signal Q including the retained data in the period during which the power supply voltage is supplied to the semiconductor device 5500. On the other hand, the first memory circuit 5501 cannot retain data in a period during which the power supply voltage is not supplied to the semiconductor device 5500. That is, the first memory circuit 5501 can be referred to as a volatile memory circuit.

The second memory circuit 5502 has a function of reading the data held in the first memory circuit 5501 to store (or save) it. The third memory circuit 5503 has a function of reading the data held in the second memory circuit 5502 to store (or save) it. The read circuit 5504 has a function of reading the data held in the second memory circuit 5502 or the third memory circuit 5503 to store (or restore) it in the first memory circuit 5501.

In particular, the third memory circuit 5503 has a function of reading the data held in the second memory circuit 5502 to store (or save) it even in the period during which the power supply voltage is not supplied to the semiconductor device 5500.

As shown in FIG. 48, the second memory circuit 5502 includes a transistor 5512 and a capacitor 5519. The third memory circuit 5503 includes a transistor 5513, a transistor 5515, and a capacitor 5520. The read circuit 5504 includes a transistor 5510, a transistor 5518, a transistor 5509, and a transistor 5517.

The transistor 5512 has a function of charging and discharging the capacitor 5519 in accordance with data held in the first memory circuit 5501. The transistor 5512 is desirably capable of charging and discharging the capacitor 5519 at a high speed in accordance with data held in the first memory circuit 5501. Specifically, the transistor 5512 desirably contains crystalline silicon (preferably polycrystalline silicon, more preferably single crystal silicon) in a channel formation region.

The conduction state or the non-conduction state of the transistor 5513 is determined in accordance with the charge held in the capacitor 5519. The transistor 5515 has a function of charging and discharging the capacitor 5520 in accordance with the potential of a wiring 5544 when the transistor 5513 is in a conduction state. It is desirable that the off-state current of the transistor 5515 be extremely low. Specifically, the transistor 5515 desirably contains an oxide semiconductor (preferably an oxide containing In, Ga, and Zn) in a channel formation region.

Specific connection relations between the elements will be described. One of a source and a drain of the transistor 5512 is connected to the first memory circuit 5501. The other of the source and the drain of the transistor 5512 is connected to one electrode of the capacitor 5519, a gate of the transistor 5513, and a gate of the transistor 5518. The other electrode of the capacitor 5519 is connected to a wiring 5542. One of a source and a drain of the transistor 5513 is connected to the wiring 5544. The other of the source and the drain of the transistor 5513 is connected to one of a source and a drain of the transistor 5515. The other of the source and the drain of the transistor 5515 is connected to one electrode of the capacitor 5520 and a gate of the transistor 5510. The other electrode of the capacitor 5520 is connected to a wiring 5543.

One of a source and a drain of the transistor 5510 is connected to the wiring 5541. The other of the source and the drain of the transistor 5510 is connected to one of a source and a drain of the transistor 5518. The other of the source and the drain of the transistor 5518 is connected to one of a source and a drain of the transistor 5509. The other of the source and the drain of the transistor 5509 is connected to one of a source and a drain of the transistor 5517 and the first memory circuit 5501. The other of the source and the drain of the transistor 5517 is connected to a wiring 5540. Although a gate of the transistor 5509 is connected to a gate of the transistor 5517 in FIG. 48, it is not necessarily connected to the gate of the transistor 5517.

The transistor described in the above embodiment as an example can be applied to the transistor 5515. Because of the low off-state current of the transistor 5515, the semiconductor device 5500 can retain data for a long time without power supply. The favorable switching characteristics of the transistor 5515 allow the semiconductor device 5500 to perform high-speed backup and recovery.

The structures described in this embodiment can be combined with any of the structures described in the other embodiments as appropriate.

(Embodiment 9)

In this embodiment, an example of an imaging device including the transistor or the like of one embodiment of the present invention is described.

<Imaging Device>

An imaging device of one embodiment of the present invention is described below.

Figure 49A:
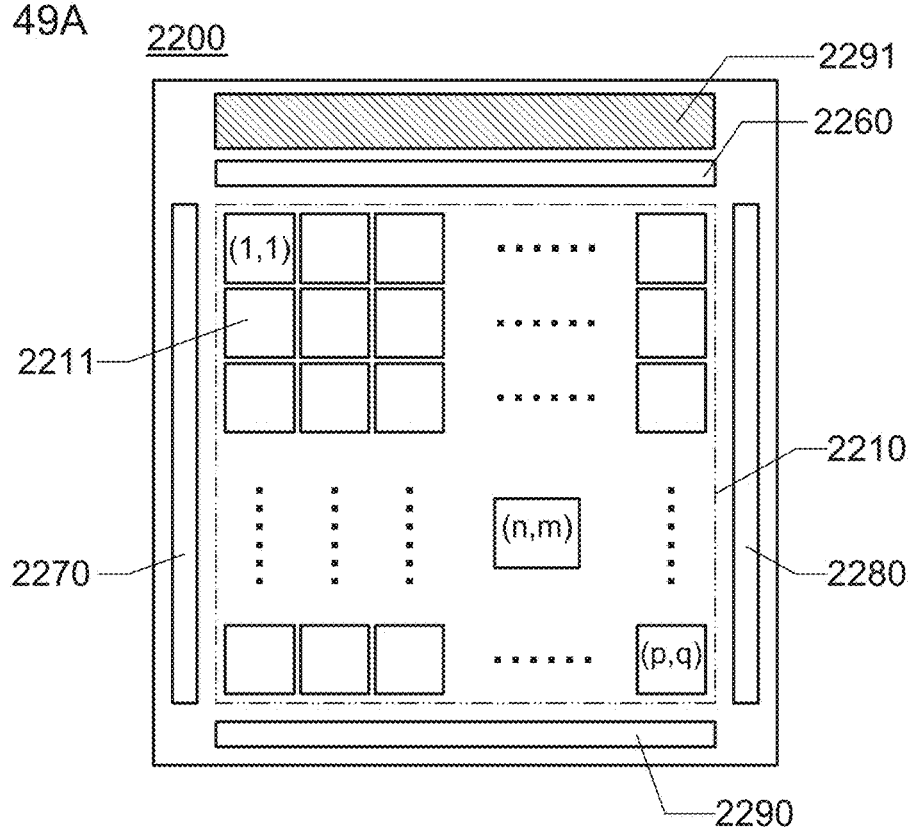
FIGS. 49A and 49B are top views each illustrating a semiconductor device of one embodiment of the present invention.

FIG. 49A is a plan view illustrating an example of an imaging device 2200 of one embodiment of the present invention. The imaging device 2200 includes a pixel portion 2210 and peripheral circuits for driving the pixel portion 2210 (a peripheral circuit 2260, a peripheral circuit 2270, a peripheral circuit 2280, and a peripheral circuit 2290). The pixel portion 2210 includes a plurality of pixels 2211 arranged in a matrix with p rows and q columns (p and q are each an integer of 2 or more). The peripheral circuit 2260, the peripheral circuit 2270, the peripheral circuit 2280, and the peripheral circuit 2290 are each connected to the plurality of pixels 2211 and have a function of supplying a signal for driving the plurality of pixels 2211. In this specification and the like, in some cases, a "peripheral circuit" or a "driver circuit" indicates all of the peripheral circuits 2260, 2270, 2280, and 2290 and the like. For example, the peripheral circuit 2260 can be regarded as part of the peripheral circuit.

The imaging device 2200 preferably includes a light source 2291. The light source 2291 can emit detection light P1.

The peripheral circuit includes at least one of a logic circuit, a switch, a buffer, an amplifier circuit, and a converter circuit. The peripheral circuit may be formed over a substrate where the pixel portion 2210 is formed. A semiconductor device such as an IC chip may be used as part or the whole of the peripheral circuit. Note that as the peripheral circuit, one or more of the peripheral circuits 2260, 2270, 2280, and 2290 may be omitted.

Figure 49B:
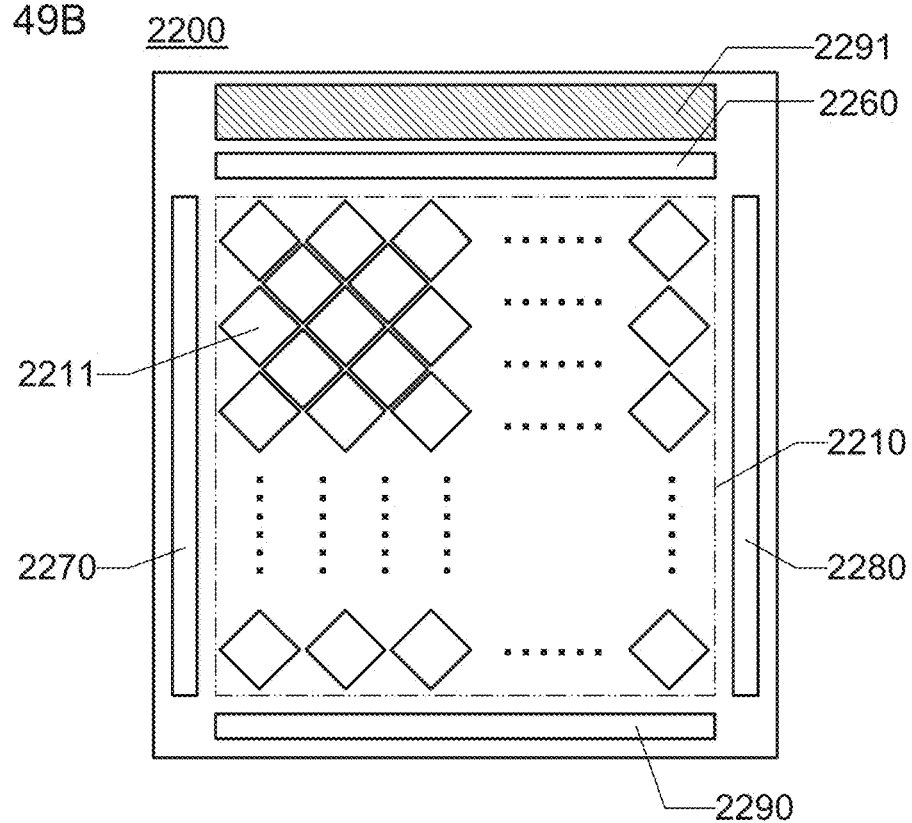

As illustrated in FIG. 49B, the pixels 2211 may be provided to be inclined in the pixel portion 2210 included in the imaging device 2200. When the pixels 2211 are obliquely arranged, the distance between pixels (pitch) can be shortened in the row direction and the column direction. Accordingly, the quality of an image taken with the imaging device 2200 can be improved.

<Configuration Example 1 of Pixel>

The pixel 2211 included in the imaging device 2200 is formed with a plurality of subpixels 2212, and each of the subpixels 2212 is combined with a filter (a color filter) which transmits light in a specific wavelength band, whereby data for achieving color image display can be obtained.

Figure 50A:
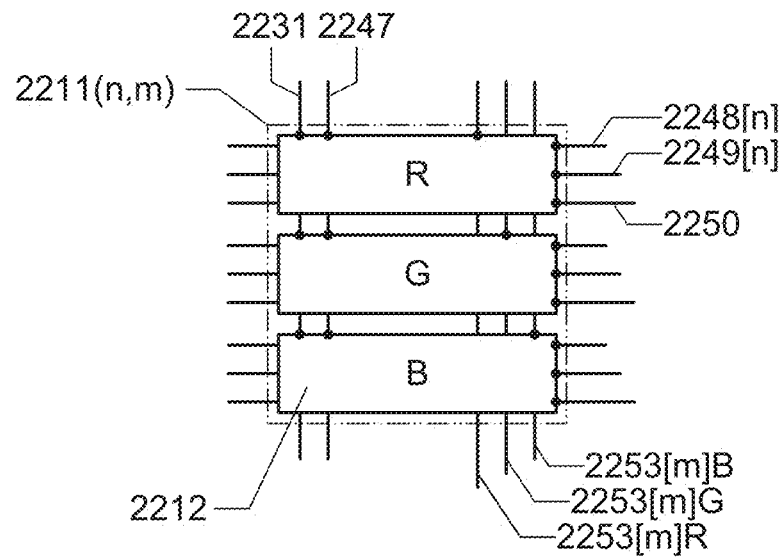
FIGS. 50A and 50B are block diagrams illustrating a semiconductor device of one embodiment of the present invention.

FIG. 50A is a top view showing an example of the pixel 2211 with which a color image is obtained. The pixel 2211 illustrated in FIG. 50A includes a subpixel 2212 provided with a color filter that transmits light in a red (R) wavelength band (also referred to as a subpixel 2212R), a subpixel 2212 provided with a color filter that transmits light in a green (G) wavelength band (also referred to as a subpixel 2212G), and a subpixel 2212 provided with a color filter that transmits light in a blue (B) wavelength band (also referred to as a subpixel 2212B). The subpixel 2212 can function as a photosensor.

The subpixels 2212 (the subpixel 2212R, the subpixel 2212G, and the subpixel 2212B) are electrically connected to a wiring 2231, a wiring 2247, a wiring 2248, a wiring 2249, and a wiring 2250. In addition, the subpixel 2212R, the subpixel 2212G, and the subpixel 2212B are connected to respective wirings 2253 which are independently provided. In this specification and the like, for example, the wiring 2248 and the wiring 2249 that are connected to the pixel 2211 in the n-th row are referred to as a wiring 2248[n] and a wiring 2249[n]. For example, the wiring 2253 connected to the pixel 2211 in the m-th column is referred to as a wiring 2253[m]. Note that in FIG. 50A, the wirings 2253 connected to the subpixel 2212R, the subpixel 2212G, and the subpixel 2212B in the pixel 2211 in the m-th column are referred to as a wiring 2253[m]R, a wiring 2253[m]G, and a wiring 2253[m]B. The subpixels 2212 are electrically connected to the peripheral circuit through the above wirings.

Figure 50B:
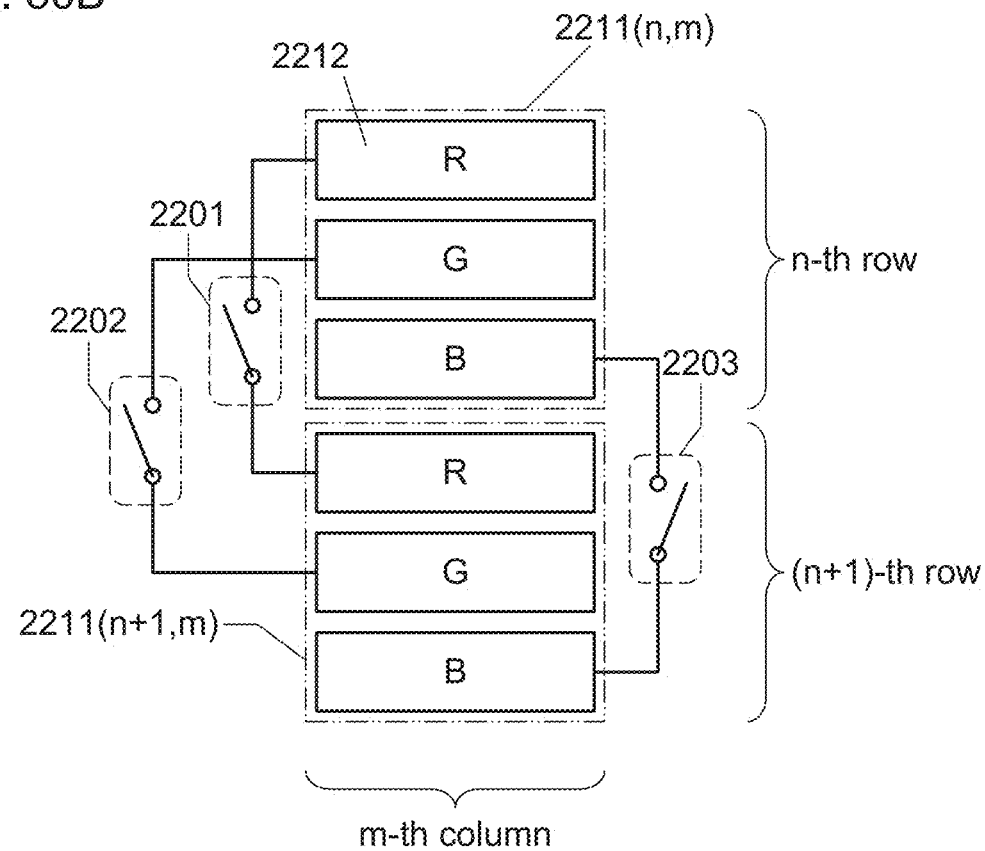

The imaging device 2200 has a structure in which the subpixel 2212 is electrically connected to the subpixel 2212 in an adjacent pixel 2211 which is provided with a color filter transmitting light in the same wavelength band as the subpixel 2212, via a switch. FIG. 50B shows a connection example of the subpixels 2212: the subpixel 2212 in the pixel 2211 provided in the n-th row (n is an integer greater than or equal to 1 and less than or equal to p) and the m-th column (m is an integer greater than or equal to 1 and less than or equal to q) and the subpixel 2212 in the adjacent pixel 2211 provided in an (n+1)-th row and the m-th column. In FIG. 50B, the subpixel 2212R provided in the n-th row and the m-th column and the subpixel 2212R provided in the (n+1)-th row and the m-th column are connected to each other via a switch 2201. The subpixel 2212G provided in the n-th row and the m-th column and the subpixel 2212G provided in the (n+1)-th row and the m-th column are connected to each other via a switch 2202. The subpixel 2212B provided in the n-th row and the m-th column and the subpixel 2212B provided in the (n+1)-th row and the m-th column are connected to each other via a switch 2203.

Note that the color filters used in the subpixel 2212 are not limited to red (R), green (G), and blue (B) color filters, and color filters that transmit light of cyan (C), yellow (Y), and magenta (M) may be used. By provision of the subpixels 2212 that sense light in three different wavelength bands in one pixel 2211, a full-color image can be obtained.

The pixel 2211 including the subpixel 2212 provided with a color filter transmitting yellow (Y) light may be provided, in addition to the subpixels 2212 provided with the color filters transmitting red (R), green (G), and blue (B) light. The pixel 2211 including the subpixel 2212 provided with a color filter transmitting blue (B) light may be provided, in addition to the subpixels 2212 provided with the color filters transmitting cyan (C), yellow (Y), and magenta (M) light. When the subpixels 2212 sensing light in four different wavelength bands are provided in one pixel 2211, the reproducibility of colors of an obtained image can be increased.

For example, in FIG. 50A, the pixel number ratio (or the light receiving area ratio) of the subpixel 2212 sensing light in a red wavelength band to the subpixel 2212 sensing light in a green wavelength band and the subpixel 2212 sensing light in a blue wavelength band is not necessarily 1:1:1. For example, the Bayer arrangement in which the pixel number ratio (the light receiving area ratio) of red to green and blue is 1:2:1 may be employed. Alternatively, the pixel number ratio (the light receiving area ratio) of red to green and blue may be 1:6:1.

Note that the number of subpixels 2212 provided in the pixel 2211 may be one, but is preferably two or more. For example, when two or more subpixels 2212 sensing light in the same wavelength band are provided, the redundancy is increased, and the reliability of the imaging device 2200 can be increased.

When an infrared (IR) filter that transmits infrared light and absorbs or reflects visible light is used as the filter, the imaging device 2200 that senses infrared light can be achieved.

Furthermore, when a neutral density (ND) filter (dark filter) is used, output saturation which occurs when a large amount of light enters a photoelectric conversion element (a light-receiving element) can be prevented. With a combination of ND filters with different dimming capabilities, the dynamic range of the imaging device can be increased.

Besides the above-described filter, the pixel 2211 may be provided with a lens. An arrangement example of the pixel 2211, a filter 2254, and a lens 2255 is described with reference to cross-sectional views in FIGS. 51A and 51B. With the lens 2255, the photoelectric conversion element can receive incident light efficiently. Specifically, as illustrated in FIG. 51A, light 2256 enters a photoelectric conversion element 2220 through the lens 2255, the filter 2254 (a filter 2254R, a filter 2254G, and a filter 2254B), a pixel circuit 2230, and the like which are provided in the pixel 2211.

As indicated by a region surrounded with dashed dotted lines, however, part of the light 2256 indicated by arrows might be blocked by some wirings 2257. Thus, a preferable structure is that the lens 2255 and the filter 2254 are provided on the photoelectric conversion element 2220 side as illustrated in FIG. 51B, whereby the photoelectric conversion element 2220 can efficiently receive the light 2256. When the light 2256 enters the photoelectric conversion element 2220 from the photoelectric conversion element 2220 side, the imaging device 2200 with high sensitivity can be provided.

Figure 51A:
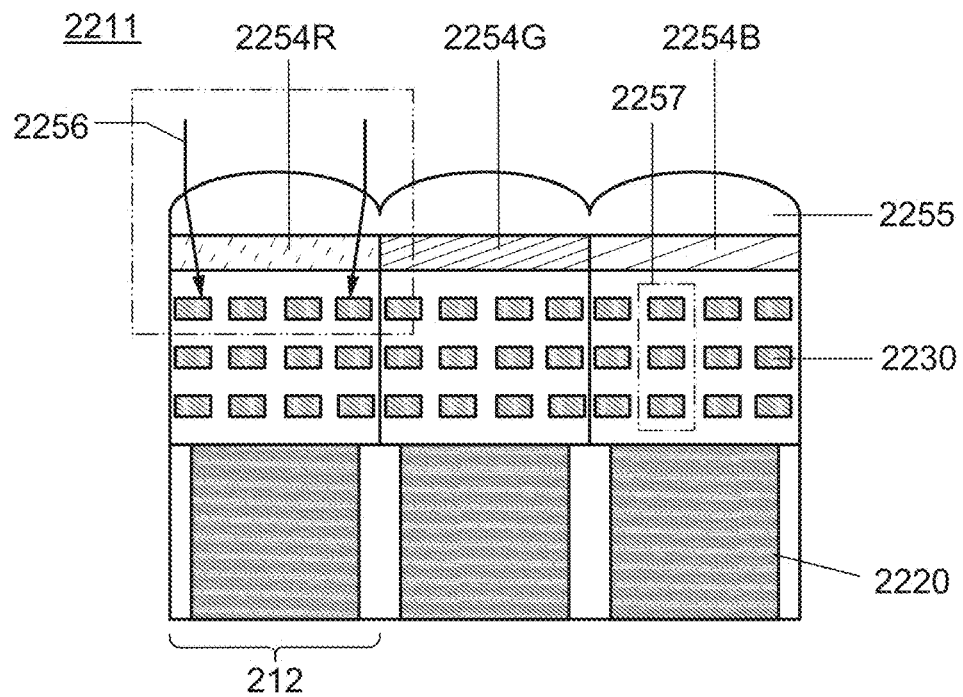
FIGS. 51A and 51B are cross-sectional views each illustrating a semiconductor device of one embodiment of the present invention.
Figure 51B:
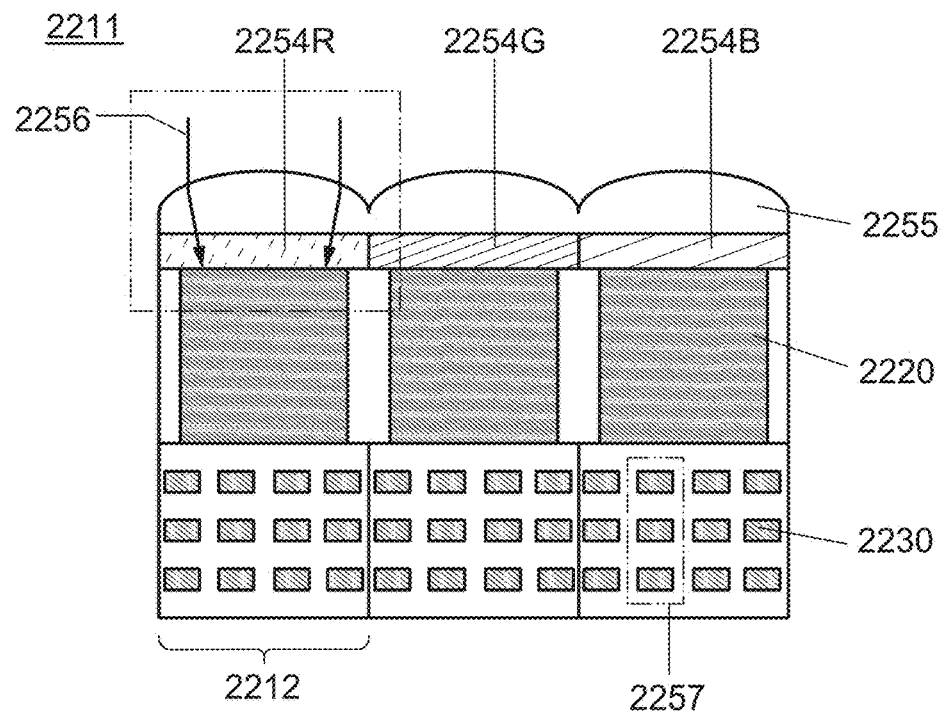

As the photoelectric conversion element 2220 illustrated in FIGS. 51A and 51B, a photoelectric conversion element in which a p-n junction or a p-i-n junction is formed may be used.

The photoelectric conversion element 2220 may be formed using a substance that has a function of absorbing radiation and generating charges. Examples of the substance that has a function of absorbing radiation and generating charges include selenium, lead iodide, mercury iodide, gallium arsenide, cadmium telluride, and a cadmium zinc alloy.

For example, when selenium is used for the photoelectric conversion element 2220, the photoelectric conversion element 2220 can have a light absorption coefficient in a wide wavelength band, such as visible light, ultraviolet light, infrared light, X-rays, and gamma rays.

One pixel 2211 included in the imaging device 2200 may include the subpixel 2212 with a first filter in addition to the subpixel 2212 illustrated in FIGS. 50A and 50B.

Configuration Example 2 of Pixel

An example of a pixel including a transistor including silicon and a transistor including an oxide semiconductor is described below. A transistor similar to any of the transistors described in the above embodiment can be used as each of the transistors.

Figure 52:
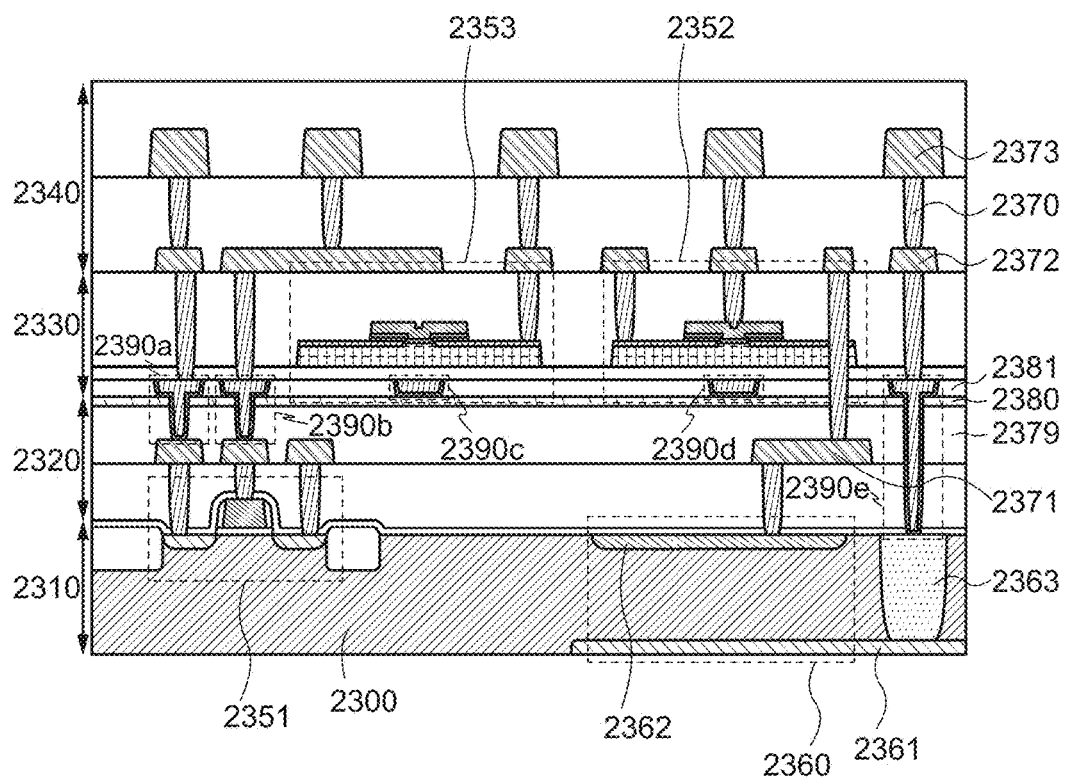
FIG. 52 is a cross-sectional view illustrating a semiconductor device of one embodiment of the present invention.

FIG. 52 is a cross-sectional view of an element included in an imaging device. The imaging device illustrated in FIG. 52 includes a transistor 2351 including silicon on a silicon substrate 2300, transistors 2352 and 2353 which include an oxide semiconductor and are stacked over the transistor 2351, and a photodiode 2360 provided in the silicon substrate 2300. The transistors and a cathode 2362 of the photodiode 2360 are electrically connected to various plugs 2370 and wirings 2371. In addition, an anode 2361 of the photodiode 2360 is electrically connected to the plug 2370 through a low-resistance region 2363.

The imaging device includes a layer 2310 including the transistor 2351 provided on the silicon substrate 2300 and the photodiode 2360 provided in the silicon substrate 2300, a layer 2320 which is in contact with the layer 2310 and includes the wirings 2371, a layer 2330 which is in contact with the layer 2320 and includes the transistors 2352 and 2353, and a layer 2340 which is in contact with the layer 2330 and includes wirings 2372 and wirings 2373.

In the example of the cross-sectional view in FIG. 52, a light-receiving surface of the photodiode 2360 is provided on the side opposite to a surface of the silicon substrate 2300 where the transistor 2351 is formed. With this structure, a light path can be secured without an influence of the transistors and the wirings. Thus, a pixel with a high aperture ratio can be formed. Note that the light-receiving surface of the photodiode 2360 can be the same as the surface where the transistor 2351 is formed.

In the case where a pixel is formed with use of only transistors including an oxide semiconductor, the layer 2310 may include the transistor including an oxide semiconductor. Alternatively, the layer 2310 may be omitted, and the pixel may include only transistors including an oxide semiconductor.

Note that the silicon substrate 2300 may be an SOI substrate. Furthermore, the silicon substrate 2300 can be replaced with a substrate including germanium, silicon germanium, silicon carbide, gallium arsenide, aluminum gallium arsenide, indium phosphide, gallium nitride, or an organic semiconductor.

Here, an insulator 2380 is provided between the layer 2310 including the transistor 2351 and the photodiode 2360 and the layer 2330 including the transistors 2352 and 2353. However, there is no limitation on the position of the insulator 2380. An insulator 2379 is provided under the insulator 2380, and an insulator 2381 is provided over the insulator 2380.

Conductors 2390*a* to 2390*e* are provided in openings formed in the insulators 2379 and 2381. The conductors 2390*a*, 2390*b*, and 2390*e* function as plugs and wirings. The conductor 2390*c* functions as a back gate of the transistor 2353. The conductor 2390*d* functions as a back gate of the transistor 2352.

Hydrogen in an insulator provided in the vicinity of a channel formation region of the transistor 2351 terminates dangling bonds of silicon; accordingly, the reliability of the transistor 2351 can be improved. In contrast, hydrogen in the insulator provided in the vicinity of the transistor 2352, the transistor 2353, and the like becomes one of factors generating a carrier in the oxide semiconductor. Thus, the hydrogen may cause a reduction of the reliability of the transistor 2352, the transistor 2353, and the like. For this reason, in the case where the transistor including an oxide semiconductor is provided over the transistor including a silicon-based semiconductor, it is preferable that the insulator 2380 having a function of blocking hydrogen be provided between the transistors. When hydrogen is confined in layers below the insulator 2380, the reliability of the transistor 2351 can be improved. In addition, hydrogen can be prevented from diffusing from the layers below the insulator 2380 into layers above the insulator 2380; thus, the reliability of the transistor 2352, the transistor 2353, and the like can be increased. The conductors 2390*a*, 2390*b*, and 2390*e* can prevent hydrogen from diffusing into the layers provided thereover through the via holes formed in the insulator 2380, resulting in improvement in the reliability of the transistors 2352 and 2353 and the like.

In the cross-sectional view in FIG. 52, the photodiode 2360 in the layer 2310 and the transistor in the layer 2330 can be formed so as to overlap with each other. Thus, the degree of integration of pixels can be increased. In other words, the resolution of the imaging device can be increased.

Part or the whole of the imaging device may be bent. The bent imaging device enables the curvature of field and astigmatism to be reduced. Thus, the optical design of a lens or the like, which is used in combination of the imaging device, can be facilitated. For example, the number of lenses used for aberration correction can be reduced; accordingly, a reduction in size or weight of electronic devices using the imaging device, and the like, can be achieved. In addition, the quality of a captured image can be improved.

The structures described in this embodiment can be combined with any of the structures described in the other embodiments as appropriate.

(Embodiment 10)

In this embodiment, a semiconductor wafer, a chip, and an electronic component of one embodiment of the present invention will be described.

<Semiconductor Wafer and Chip>

Figure 53A:
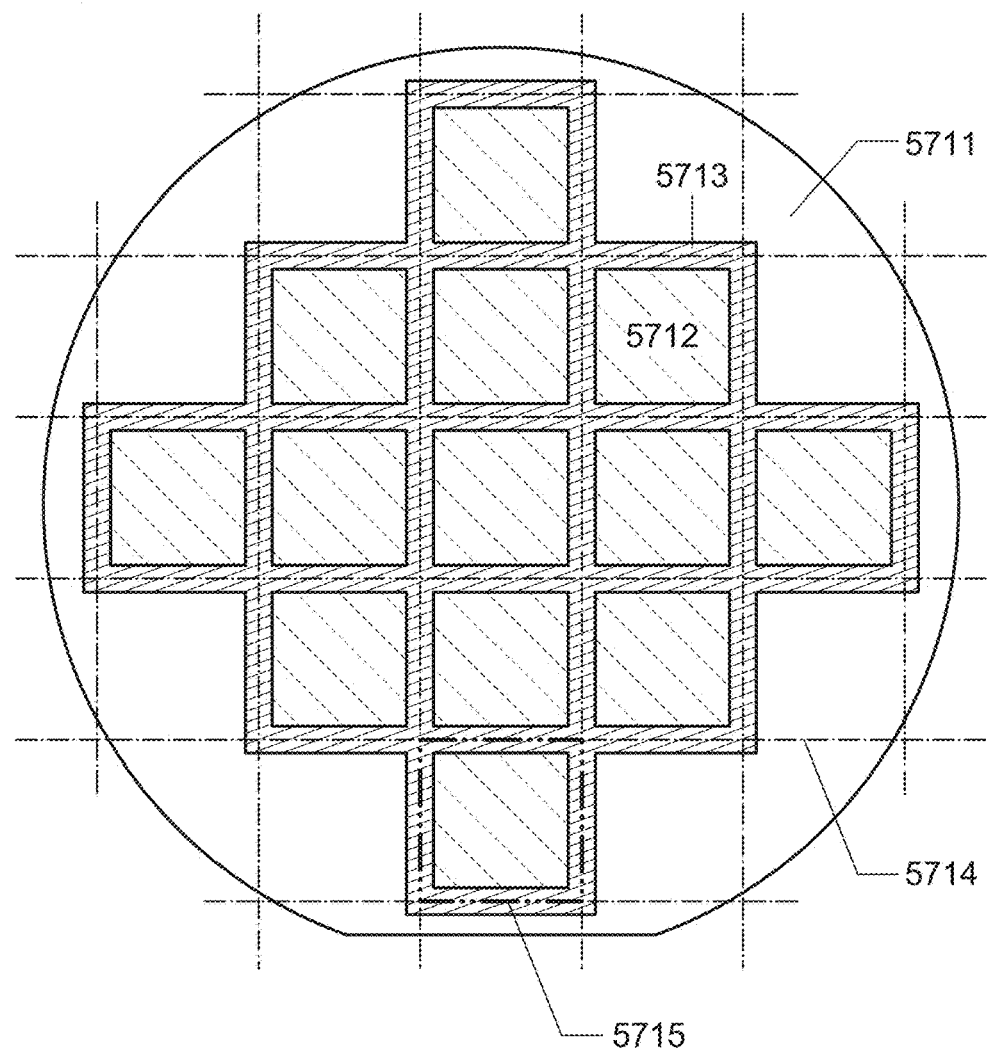
FIGS. 53A and 53B are top views illustrating a semiconductor device of one embodiment of the present invention.

FIG. 53A is a top view illustrating a substrate 5711 before dicing treatment. As the substrate 5711, a semiconductor substrate (also referred to as a "semiconductor wafer") can be used, for example. A plurality of circuit regions 5712 are provided over the substrate 5711. A semiconductor device, a CPU, an RF tag, an image sensor, or the like of one embodiment of the present invention can be provided in the circuit region 5712.

Figure 53B:
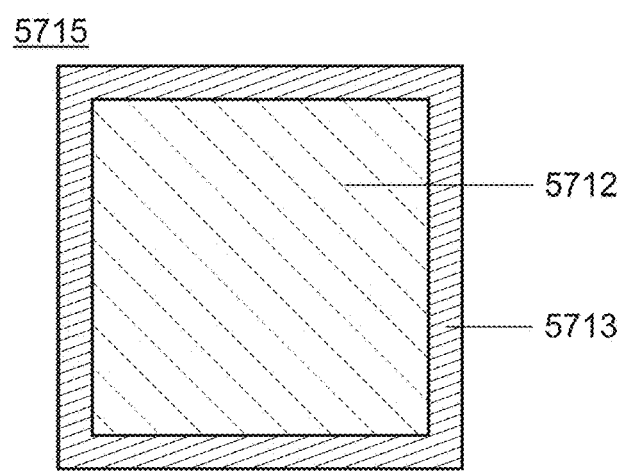

The plurality of circuit regions 5712 are each surrounded by a separation region 5713. Separation lines (also referred to as "dicing lines") 5714 are set at a position overlapping with the separation region 5713. The substrate 5711 can be cut along the separation lines 5714 into chips 5715 including the circuit regions 5712. FIG. 53B is an enlarged view of the chip 5715.

A conductive layer or a semiconductor layer may be provided in the separation region 5713. Providing a conductive layer or a semiconductor layer in the separation region 5713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductive layer or a semiconductor layer in the separation region 5713 allows a reduction in the usage of the pure water. Therefore, the cost of manufacturing semiconductor devices can be reduced. Thus, semiconductor devices can be manufactured with improved productivity.

For a semiconductor layer provided in the separation region 5713, a material having a band gap greater than or equal to 2.5 eV and less than or equal to 4.2 eV, preferably greater than or equal to 2.7 eV and less than or equal to 3.5 eV is preferably used. The use of such a material allows accumulated charges to be released slowly; thus, the rapid move of charges due to ESD can be suppressed and electrostatic breakdown is less likely to occur.

<Electronic Component>

Figure 54A:
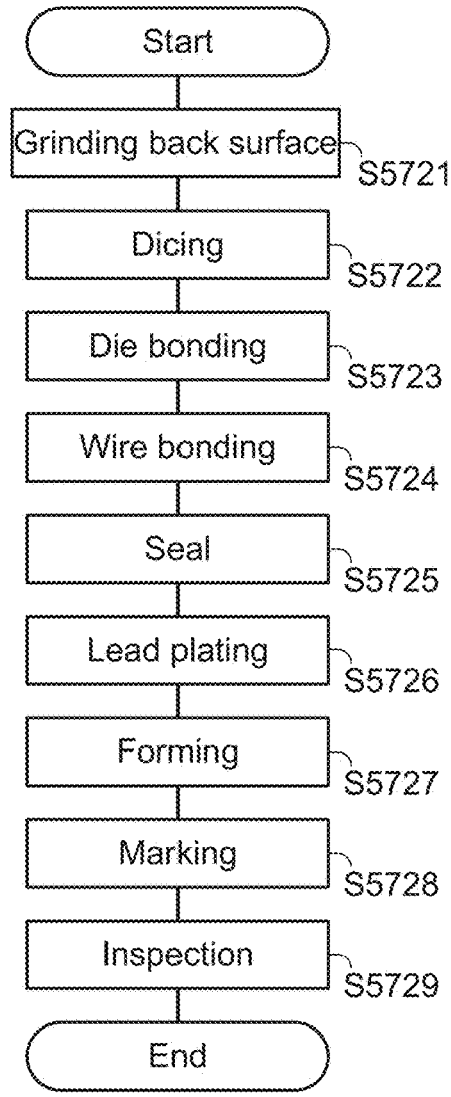
FIGS. 54A and 54B are a flow chart illustrating one embodiment of the present invention and a perspective view illustrating a semiconductor device.
Figure 54B:
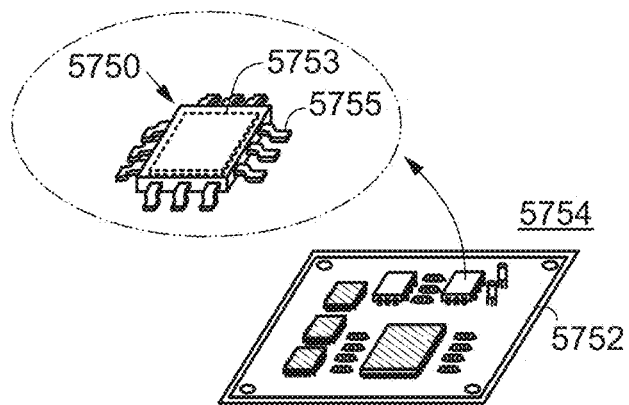

FIGS. 54A and 54B show an example where the chip 5715 is used to make an electronic component. Note that the electronic component is also referred to as a semiconductor package or an IC package. This electronic component has a plurality of standards and names depending on a terminal extraction direction and a terminal shape.

The electronic component is completed when the semiconductor device described in the above embodiment is combined with components other than the semiconductor device in an assembly process (post-process).

The post-process will be described with reference to a flow chart in FIG. 54A. After an element substrate including the semiconductor device described in the above embodiment is completed in a pre-process, a back surface grinding step in which a back surface (a surface where the semiconductor device and the like are not formed) of the element substrate is ground is performed (Step S5721). When the element substrate is thinned by grinding, warpage or the like of the element substrate is reduced, so that the size of the electronic component can be reduced.

Next, the element substrate is divided into a plurality of chips (chips 5715) in a dicing step (Step S5722). Then, the separated chips are individually picked up to be bonded to a lead frame in a die bonding step (Step S5723). To bond a chip and a lead frame in the die bonding step, a method such as bonding with a resin or a tape is selected as appropriate depending on products. Note that the chip may be bonded to an interposer substrate instead of the lead frame.

Next, a wire bonding step for electrically connecting a lead of the lead frame and an electrode on the chip through a metal wire is performed (Step S5724). A silver line or a gold line can be used as the metal fine line. Ball bonding or wedge bonding can be used as the wire bonding.

The wire-bonded chip is subjected to a sealing step (a molding step) of sealing the chip with an epoxy resin or the like (Step S5725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, the lead of the lead frame is plated in a lead plating step (Step S5726). This plating process prevents rust of the lead and facilitates soldering at the time of mounting the chip on a printed circuit board in a later step. Then, the lead is cut and processed in a shaping step (Step S5727).

Next, a printing (marking) step is performed on a surface of the package (Step S5728). After a testing step (Step S5729) for checking whether an external shape is good and whether there is a malfunction, for example, the electronic component is completed.

FIG. 54B is a schematic perspective diagram of a completed electronic component. FIG. 54B is a schematic perspective diagram illustrating a quad flat package (QFP) as an example of the electronic component. An electronic component 5750 in FIG. 54B includes a lead 5755 and a semiconductor device 5753. As the semiconductor device 5753, the semiconductor device described in the above embodiment or the like can be used.

The electronic component 5750 in FIG. 54B is mounted on a printed circuit board 5752, for example. A plurality of electronic components 5750 that are combined and electrically connected to each other over the printed circuit board 5752; thus, a substrate on which the electronic components are mounted (a circuit board 5754) is completed. The completed circuit board 5754 is provided in an electronic device or the like.

The structures described in this embodiment can be combined with any of the structures described in the other embodiments as appropriate.

(Embodiment 11)

In this embodiment, electronic devices including the transistor or the like of one embodiment of the present invention are described.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game machines, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 55A to 55F illustrate specific examples of these electronic devices.

Figure 55A:
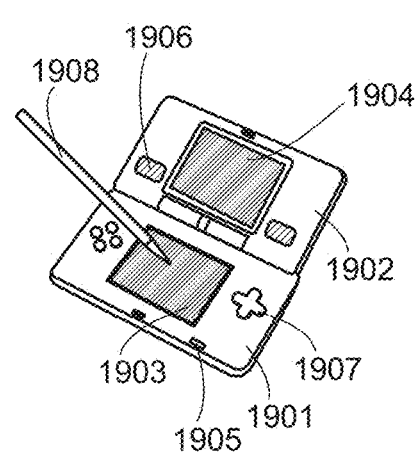
FIGS. 55A to 55F are perspective views each illustrating an electronic device of one embodiment of the present invention.

FIG. 55A illustrates a portable game machine, which includes a housing 1901, a housing 1902, a display portion 1903, a display portion 1904, a microphone 1905, a speaker 1906, an operation key 1907, a stylus 1908, and the like. Although the portable game machine in FIG. 55A has the two display portions 1903 and 1904, the number of display portions included in a portable game machine is not limited to this.

Figure 55B:
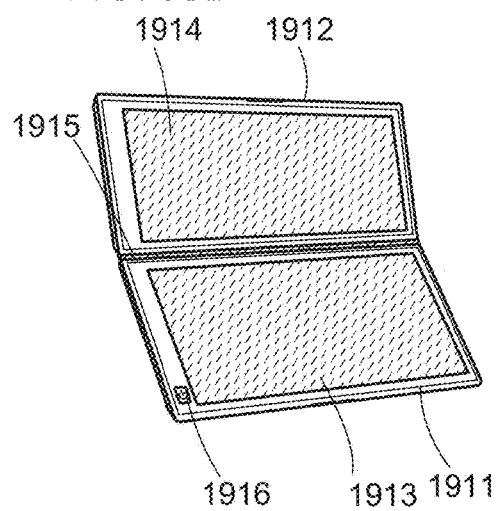

FIG. 55B illustrates a portable data terminal, which includes a first housing 1911, a second housing 1912, a first display portion 1913, a second display portion 1914, a joint 1915, an operation key 1916, and the like. The first display portion 1913 is provided in the first housing 1911, and the second display portion 1914 is provided in the second housing 1912. The first housing 1911 and the second housing 1912 are connected to each other with the joint 1915, and the angle between the first housing 1911 and the second housing 1912 can be changed with the joint 1915. Images displayed on the first display portion 1913 may be switched in accordance with the angle at the joint 1915 between the first housing 1911 and the second housing 1912. A display device with a position input function may be used as at least one of the first display portion 1913 and the second display portion 1914. Note that the position input function can be added by providing a touch panel in a display device. Alternatively, the position input function can be added by providing a photoelectric conversion element also called a photosensor in a pixel portion of a display device.

Figure 55C:
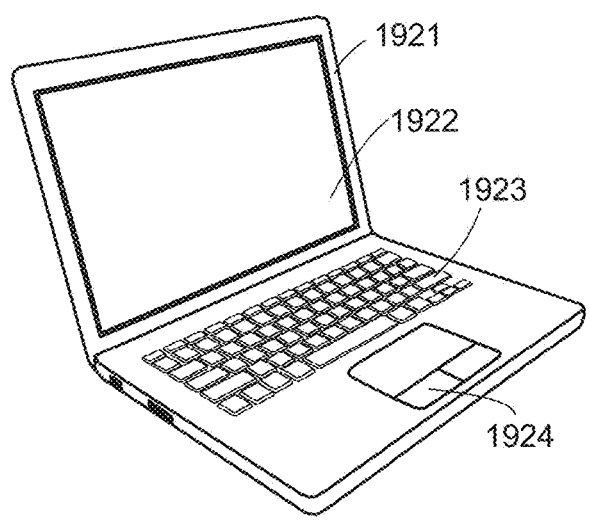

FIG. 55C illustrates a notebook personal computer, which includes a housing 1921, a display portion 1922, a keyboard 1923, a pointing device 1924, and the like.

Figure 55D:
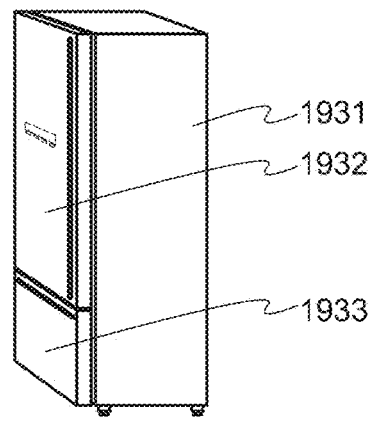

FIG. 55D illustrates an electric refrigerator-freezer, which includes a housing 1931, a door for a refrigerator 1932, a door for a freezer 1933, and the like.

Figure 55E:
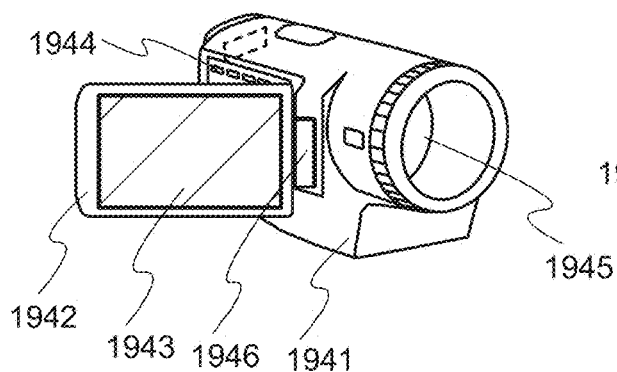

FIG. 55E illustrates a video camera, which includes a first housing 1941, a second housing 1942, a display portion 1943, operation keys 1944, a lens 1945, a joint 1946, and the like. The operation keys 1944 and the lens 1945 are provided for the first housing 1941, and the display portion 1943 is provided for the second housing 1942. The first housing 1941 and the second housing 1942 are connected to each other with the joint 1946, and the angle between the first housing 1941 and the second housing 1942 can be changed with the joint 1946. Images displayed on the display portion 1943 may be switched in accordance with the angle at the joint 1946 between the first housing 1941 and the second housing 1942.

Figure 55F:
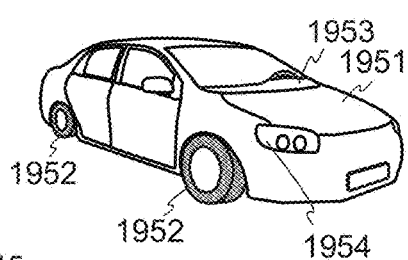

FIG. 55F illustrates a passenger car, which includes a car body 1951, wheels 1952, a dashboard 1953, lights 1954, and the like.

In this embodiment, one embodiment of the present invention has been described. Note that one embodiment of the present invention is not limited thereto. In other words, since various embodiments of the invention are described in this embodiment and the like, one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, source and drain regions of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, source and drain regions of a transistor, or the like of one embodiment of the present invention. Alternatively, depending on circumstances or conditions, an oxide semiconductor is not necessarily included in various transistors, a channel formation region of a transistor, source and drain regions of a transistor, or the like of one embodiment of the present invention, for example.

The structures described in this embodiment can be combined with any of the structures described in the other embodiments as appropriate.

EXAMPLE 1

In this example, results of elemental analysis and crystallinity evaluation of In—Ga—Zn oxide films (hereinafter referred to as IGZO films) formed by any of the methods described in the above embodiments will be described.

An IGZO film of a sample 1A of this example was formed over a glass substrate with the intended thickness set to 100 nm by a sputtering method using an In—Ga—Zn oxide target (with an atomic ratio of In:Ga:Zn=4:2:4.1). The IGZO film was formed in an atmosphere including an argon gas at 180 sccm and an oxygen gas at 20 sccm, where the pressure was controlled to 0.6 Pa, the substrate temperature was room temperature, and an alternating-current power of 2.5 kW was applied.

A cross section of the IGZO film of the sample 1A was subjected to measurement using energy dispersive X-ray spectroscopy (EDX). The EDX measurement was performed using an atomic resolution analytical electron microscope JEM-ARM200F manufactured by JEOL Ltd. under conditions where the acceleration voltage was 200 kV, and irradiation with an electron beam with a diameter of approximately 0.1 nmϕ was performed. An energy dispersive X-ray spectrometer JED-2300T was used as an elemental analysis apparatus. A Si drift detector was used to detect X-rays emitted from the sample 1A.

In the EDX measurement, an EDX spectrum of a point is obtained in such a manner that electron beam irradiation is performed on the point in an analysis target region of a sample, and the energy of characteristic X-rays of the sample generated by the irradiation and its frequency are measured. In this example, peaks of an EDX spectrum of the point were attributed to electron transitions in an In atom, a Ga atom, a Zn atom, and an O atom, and the proportions of the atoms in the point were calculated. An EDX mapping image indicating distributions of proportions of the atoms can be obtained through this process in an analysis target region of the sample 1A.

Figure 56:
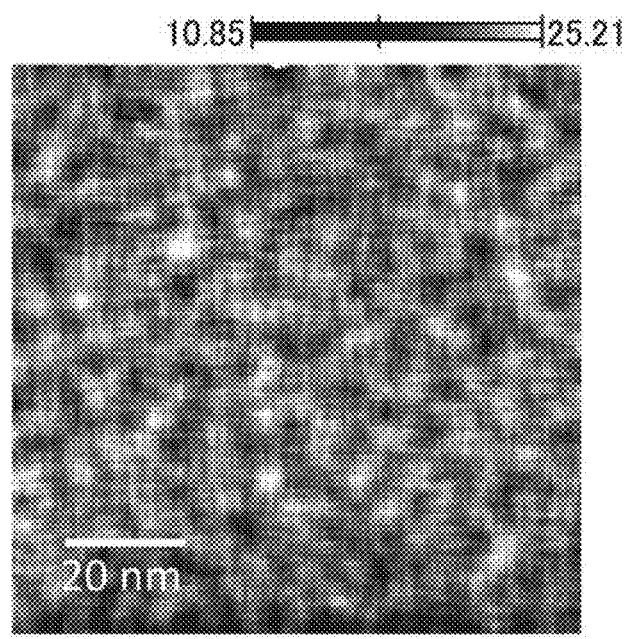
FIG. 56 is an EDX mapping image of a cross section of a sample of one example.

FIG. 56 shows an EDX mapping image of In atoms in the cross section of the IGZO film of the sample 1A. The EDX mapping image in FIG. 56 shows the proportions [atomic %] of In atoms in some points of the IGZO film. The proportions of In atoms in relatively dark regions in FIG. 56 are low, and the lowest proportion is 10.85 atomic %. The proportions of In atoms in relatively light regions in FIG. 56 are high, and the highest proportion is 25.21 atomic %.

The EDX mapping image in FIG. 56 shows the distribution of light and dark, indicating segregation of In atoms in the cross section of the IGZO film. Here, many of the relatively light regions in the EDX mapping image have a substantially circular or elliptical shape. In addition, regions formed by connection of a plurality of regions having a substantially circular or elliptical shape are observed. In other words, regions having a substantially circular or elliptical shape are formed in a net-like manner. As described above, the relatively light regions are regions where In exists at a high concentration, and correspond to the regions A described in the above embodiment. Note that each of the regions A is not so large as to cross the analysis target region longitudinally or transversely, and is formed in an island-like manner and surrounded by a relatively dark region (corresponding to the region B described in the above embodiment). Regions with an intermediate shade are also formed between the regions A and the region B, and in some portions, the boundary between the regions A and B is not clear. Many of the regions A having a substantially circular or elliptical shape have a size in the range from approximately 0.1 nm to 5 nm.

As described above, the IGZO film of the sample 1A is a composite oxide semiconductor where the In-rich regions A and the In-poor region B are formed. The regions A contribute to the on-state current and field-effect mobility of a transistor, and the region B contributes to the switching characteristics of a transistor. Therefore, with the use of the composite oxide semiconductor, a transistor with favorable electrical characteristics can be manufactured.

Furthermore, since the regions A are formed in an island-like manner and surrounded by the region B, it is possible to suppress an increase in off-state current due to connection of a source and a drain of a transistor to each other through the regions A.

Unlike the IGZO film of the sample 1A, an IGZO film of a sample 1B was formed in an atmosphere including an argon gas at 140 sccm and an oxygen gas at 60 sccm, where the substrate temperature was 170° C. Note that the other conditions for forming the IGZO film of the sample 1B are similar to those for the IGZO film of the sample 1A.

Figure 57A:
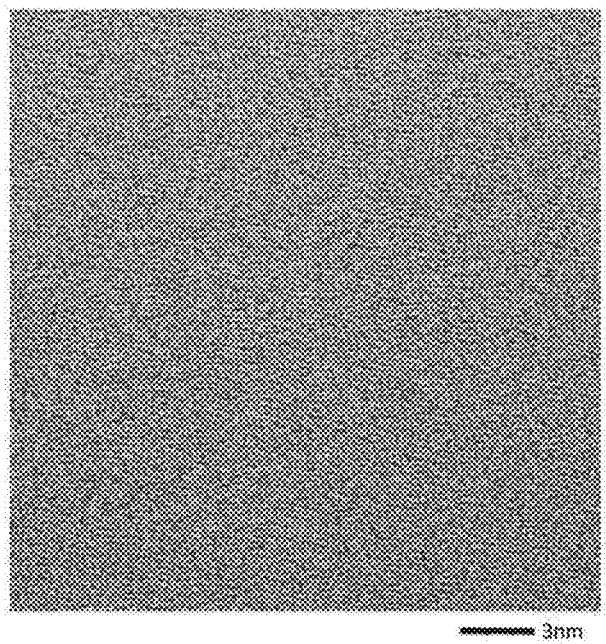
FIGS. 57A and 57B are BF-STEM images of cross sections of samples of one example.
Figure 57B:
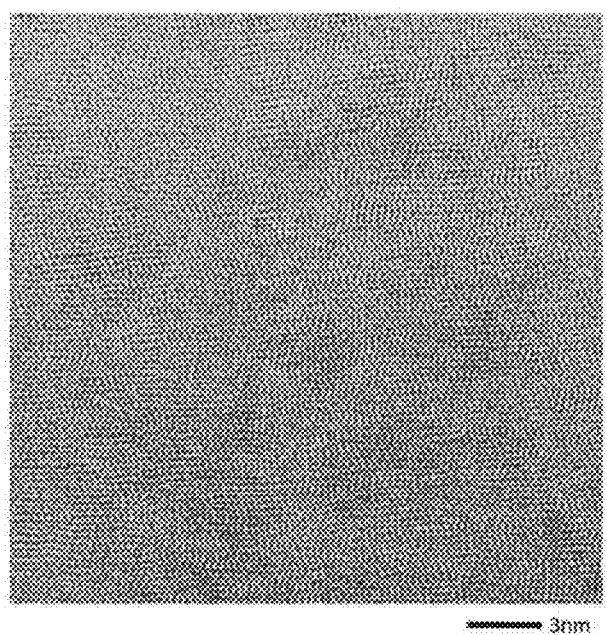

Bright-field scanning transmission electron microscopy (BF-STEM) images of cross sections of the samples 1A and 1B were taken at a magnification of 2000000 times. FIG. 57A shows the BF-STEM image of the sample 1A, and FIG. 57B shows the BF-STEM image of the sample 1B.

As shown in FIG. 57A, although the area is small, a layered crystal portion is formed and a crystal portion with c-axis alignment is also observed in the IGZO film of the sample 1A. In contrast, in the IGZO film of the sample 1B shown in FIG. 57B, a layered crystal portion is formed in a larger area than in the IGZO film of the sample 1A. Thus, such a layered crystal portion is also observed in the IGZO film of the sample 1A, which shows segregation of In atoms. It is also suggested that the crystallinity of an IGZO film can possibly be improved by increasing the flow rate ratio of oxygen and increasing the substrate temperature during formation of the IGZO film.

More samples were fabricated by forming IGZO films at different oxygen flow rates and different substrate temperatures, and were subjected to crystallinity evaluation. The IGZO films of these samples were each formed at an oxygen flow rate ratio of 10% (an oxygen gas at 20 sccm and an argon gas at 180 sccm), 30% (an oxygen gas at 60 sccm and an argon gas at 140 sccm), 50% (an oxygen gas at 100 sccm and an argon gas at 100 sccm), 70% (an oxygen gas at 140 sccm and an argon gas at 60 sccm), or 100% (an oxygen gas at 200 sccm) and a substrate temperature of room temperature, 130° C., or 170° C. Note that the other conditions for forming the IGZO film of each sample are similar to those for the IGZO film of the sample 1A.

The crystallinity of the IGZO film of each sample was evaluated by XRD measurement. The XRD measurement was performed using a powder method (also referred to as a θ-2θ method), which is a kind of out-of-plane method. In a θ-2θ method, X-ray diffraction intensity is measured while an incident angle of an X-ray is changed and the angle of a detector facing an X-ray source is equal to the incident angle.

FIG. 58A shows XRD measurement results of the samples. As shown in FIG. 58B, the measurement was performed at three points within the glass substrate of each sample.

In FIG. 58A, the vertical axis represents diffraction intensity in an arbitrary unit, and the horizontal axis represents angle 2θ. In addition, in FIG. 58A, three XRD profiles corresponding to the three points in FIG. 58B are shown together in each graph.

As shown in FIG. 58A, from the IGZO film formed under conditions similar to those for the IGZO film of the sample 1A, a diffraction intensity peak at around 2θ=31° is not clearly observed, an extremely low diffraction intensity peak at around 2θ=31° is observed, or no diffraction intensity peak at around 2θ=31° is observed. In contrast, from the IGZO film formed under conditions similar to those for the IGZO film of the sample 1B, a diffraction intensity peak at around 2θ=31° is clearly observed.

Note that the diffraction angle (at around 2θ=31°) at which the diffraction intensity peak is observed corresponds to a diffraction angle on the (009) plane of the structure model of single crystal InGaZnO$_4$. Accordingly, the above-described peak observed from the IGZO film formed under conditions similar to those for the IGZO film of the sample 1B confirms that the film includes a crystal portion with c-axis alignment.

In contrast, it is difficult to determine whether or not the IGZO film formed under conditions similar to those for the IGZO film of the sample 1A includes a crystal portion with c-axis alignment, by XRD measurement. However, a crystal portion with c-axis alignment in a microscopic region can be observed by taking a BF-STEM image or the like as shown in FIG. 57A.

As shown in FIG. 58A, the higher the oxygen flow rate ratio or the substrate temperature is during the formation of the IGZO film, the sharper the peak of its XRD profile is. This suggests that an IGZO film with higher crystallinity can be formed when the oxygen flow rate ratio or the substrate temperature is higher during formation of the IGZO film.

EXPLANATION OF REFERENCE

100: capacitor, 101: capacitor, 102: capacitor, 112: conductor, 112a: conductor, 112b: conductor, 116: conductor, 124: conductor, 130: insulator, 132: insulator, 134: insulator, 150: insulator, 200: transistor, 201: transistor, 202: transistor, 205: conductor, 205a: conductor, 205A: conductor, 205b: conductor, 205B: conductor, 205c: conductor, 210: insulator, 212: insulator, 213: insulator, 214: insulator, 216: insulator, 218: conductor, 219: conductor, 220: insulator, 222: insulator, 224: insulator, 230: oxide, 230a: oxide, 230A: oxide, 230b: oxide, 230B: oxide, 230c: oxide, 230d: oxide, 240a: conductor, 240A: conductive film, 240b: conductor, 240B: conductive layer, 241a: conductor, 241b: conductor, 243a: insulator, 243b: insulator, 244: conductor, 246: conductor, 250: insulator, 260: conductor, 260a: conductor, 260A: conductive film, 260b: conductor, 260c: conductor, 270: insulator, 271: barrier layer, 279: insulator, 280: insulator, 281: barrier layer, 282: insulator, 284: insulator, 286: insulator, 290: resist mask, 292: resist mask, 294: resist mask, 296: resist mask, 300: transistor, 301: transistor, 302: transistor, 311: substrate, 312: semiconductor region, 314: insulator, 316: conductor, 318a: low-resistance region, 318b: low-resistance region, 320: insulator, 322: insulator, 324: insulator, 326: insulator, 328: conductor, 330: conductor, 350: insulator, 352: insulator, 354: insulator, 356: conductor, 358: insulator, 600: target, 600a: target, 600b: target, 601: deposition chamber, 610: backing plate, 610a: backing plate, 610b: backing plate, 620: target holder, 620a: target holder, 620b: target holder, 622: target holder, 623: target shield, 630: magnet unit, 630a: magnet unit, 630b: magnet unit, 630N: magnet, 630N1: magnet, 630N2: magnet, 630S: magnet, 632: magnet holder, 640: plasma, 642: member, 660: substrate, 670: substrate holder, 680a: magnet line of force, 680b: magnet line of force, 690: power source, 691: power source, 1901: housing, 1902: housing, 1903: display portion, 1904: display portion, 1905: microphone, 1906: speaker, 1907: operation key, 1908: stylus, 1911: housing, 1912: housing, 1913: display portion, 1914: display portion, 1915: joint, 1916: operation key, 1921: housing, 1922: display portion, 1923: keyboard, 1924: pointing device, 1931: housing, 1932: door for refrigerator, 1933: door for freezer, 1941: housing, 1942: housing, 1943: display portion, 1944: operation key, 1945: lens, 1946: joint, 1951: car body, 1952: wheel, 1953: dashboard, 1954: light, 2200: imaging device, 2201: switch, 2202: switch, 2203: switch, 2210: pixel portion, 2211: pixel, 2212: subpixel, 2212B: subpixel, 2212G: subpixel, 2212R: subpixel, 2220: photoelectric conversion element, 2230: pixel circuit, 2231: wiring, 2247: wiring, 2248: wiring, 2249: wiring, 2250: wiring, 2253: wiring, 2254: filter, 2254B: filter, 2254G: filter, 2254R: filter, 2255: lens, 2256: light, 2257: wiring, 2260: peripheral circuit, 2270: peripheral circuit, 2280: peripheral circuit, 2290: peripheral circuit, 2291: light source, 2300: silicon substrate, 2310: layer, 2320: layer, 2330: layer, 2340: layer, 2351: transistor, 2352: transistor, 2353: transistor, 2360: photodiode, 2361: anode, 2363: low-resistance region, 2370: plug, 2371: wiring, 2372: wiring, 2373: wiring, 2379: insulator, 2380: insulator, 2381: insulator, 2390a: conductor, 2390b: conductor, 2390c: conductor, 2390d: conductor, 2390e: conductor, 2700: deposition apparatus, 2701: atmosphere-side substrate supply chamber, 2702: atmosphere-side substrate transfer chamber, 2703a: load lock chamber, 2703b: unload lock chamber, 2704: transfer chamber, 2705: substrate heating chamber, 2706a: deposition chamber, 2706b: deposition chamber, 2706c: deposition chamber, 2751: cryotrap, 2752: stage, 2761: cassette port, 2762: alignment port, 2763: transfer robot, 2764: gate valve, 2765: heating stage, 2766: target, 2766a: target, 2766b: target, 2767: target shield, 2767a: target shield, 2767b: target shield, 2768: substrate holder, 2769: substrate, 2770: vacuum pump, 2771: cryopump, 2772: turbo molecular pump, 2780: mass flow controller, 2781: refiner, 2782: gas heating mechanism, 2784: adjustment member, 2790a: magnet unit, 2790b: magnet unit, 2791: power source, 3001: wiring, 3002: wiring, 3003: wiring, 3004: wiring, 3005: wiring, 3006: wiring, 3400: transistor, 4001: wiring, 4003: wiring, 4005: wiring, 4006: wiring, 4007: wiring, 4008: wiring, 4009: wiring, 4021: layer, 4023: layer, 4100: transistor, 4200: transistor, 4300: transistor, 4400: transistor, 4500: capacitor, 4600: capacitor, 5400: semiconductor device, 5401: CPU core, 5402: power control, 5403: power switch, 5404: cache, 5405: bus interface, 5406: debug interface, 5407: control unit, 5409: pipeline register, 5410: pipeline register, 5411: ALU, 5412: register file, 5421: power management unit, 5422: peripheral circuit, 5423: data bus, 5500: semiconductor device, 5501: memory circuit, 5502: memory circuit, 5503: memory circuit, 5504: circuit, 5509: transistor, 5510: transistor, 5512: transistor, 5513: transistor, 5515: transistor, 5517: transistor, 5518: transistor, 5519: capacitor, 5520: capacitor, 5540: wiring, 5541: wiring, 5542: wiring, 5543: wiring, 5544: wiring, 5711: substrate, 5712: circuit region, 5713: separation region, 5714: separation line, 5715: chip, 5750: electronic component, 5752: printed circuit board, 5753: semiconductor device, 5754: circuit board, 5755: lead, 5800: inverter, 5810: OS transistor, 5820: OS transistor, 5831: signal waveform, 5832: signal waveform, 5840: dashed line, 5841: solid line, 5850: OS transistor, 5860: CMOS inverter, 5900: semiconductor device, 5901: power supply circuit, 5902: circuit, 5903: voltage generation circuit, 5903A: voltage generation circuit, 5903B: voltage generation circuit, 5903C: voltage generation circuit, 5903D: voltage generation circuit, 5903E: voltage generation circuit, 5904: circuit, 5905: voltage generation circuit, 5905A: voltage generation circuit, 5906: circuit, 5911: transistor, 5912: transistor, 5912A: transistor, 5921: control circuit, and 5922: transistor.

This application is based on Japanese Patent Application serial No. 2016-048802 filed with Japan Patent Office on Mar. 11, 2016, the entire contents of which are hereby incorporated by reference.

The invention claimed is:

1. A composite oxide semiconductor comprising a first region and a plurality of second regions, wherein the first region comprises indium (In), an element M, and zinc (Zn), wherein the element M is one or more of aluminum, gallium, yttrium, and tin, wherein the plurality of second regions comprise indium and zinc, wherein the plurality of second regions have a higher concentration of indium than the first region, wherein an end portion of one of the plurality of second regions overlaps with an end portion of another one of the plurality of second regions, and wherein the plurality of second regions are surrounded with the first region.

2. The composite oxide semiconductor according to claim 1, wherein an atomic ratio of indium to the element M and zinc (In:M:Zn) is 5:1:6 or a neighborhood thereof.

3. The composite oxide semiconductor according to claim 1, wherein an atomic ratio of indium to the element M and zinc (In:M:Zn) in the first region is 4:2:3 or a neighborhood thereof.

4. The composite oxide semiconductor according to claim 1, wherein an atomic ratio of indium to the element M and zinc (In:M:Zn) in the plurality of second regions is 2:0:3 or a neighborhood thereof.

5. The composite oxide semiconductor according to claim 1, wherein an atomic ratio of indium to the element M and zinc (In:M:Zn) is 4:2:3 or a neighborhood thereof.

6. The composite oxide semiconductor according to claim 1, wherein an atomic ratio of indium to the element M and zinc (In:M:Zn) in the first region is 1:1:1 or a neighborhood thereof.

7. The composite oxide semiconductor according to claim 1, wherein an atomic ratio of indium to the element M and zinc (In:M:Zn) in the plurality of second regions is 2:0:1 or a neighborhood thereof.

8. The composite oxide semiconductor according to claim 1, wherein a thickness of each of the plurality of second regions in a c-axis direction is more than or equal to 0.1 nm and less than 1 nm.

9. The composite oxide semiconductor according to claim 1, wherein the first region is non-single-crystal.

10. The composite oxide semiconductor according to claim 1, wherein the first region comprises a crystal portion and comprises a portion where a c-axis of the crystal portion is parallel to a normal vector to a surface on which a film of the composite oxide semiconductor is formed.

11. The composite oxide semiconductor according to claim 1, wherein the plurality of second regions are non-single-crystal.

12. A transistor comprising the composite oxide semiconductor according to claim 1.

13. The composite oxide semiconductor according to claim 1, wherein the first region and the plurality of second regions are mixed.

14. The composite oxide semiconductor according to claim 1, wherein the plurality of second regions have a higher conductivity than the first region.

15. A composite oxide semiconductor comprising a first region and a plurality of second regions, wherein the first region comprises indium (In), an element M, and zinc (Zn), wherein the element M is one or more of aluminum, gallium, yttrium, and tin, wherein the plurality of second regions comprise indium and zinc, wherein the plurality of second regions have a higher concentration of indium than the first region, wherein an end portion of one of the plurality of second regions overlaps with an end portion of another one of the plurality of second regions, wherein the plurality of second regions are surrounded with the first region, wherein the plurality of second regions have a higher conductivity than the first region, and wherein the plurality of second regions are non-single-crystal.

16. The composite oxide semiconductor according to claim 15, wherein an atomic ratio of indium to the element M and zinc (In:M:Zn) is 5:1:6 or a neighborhood thereof.

17. The composite oxide semiconductor according to claim 15, wherein an atomic ratio of indium to the element M and zinc (In:M:Zn) in the first region is 4:2:3 or a neighborhood thereof.

18. A semiconductor device comprising:

a first oxide; and a second oxide over the first oxide, wherein the first oxide comprises indium, gallium, and zinc, and wherein the second oxide comprises the composite oxide semiconductor according to claim 15.

* * * * *